United States Patent
Tokunaga et al.

(10) Patent No.: US 12,360,452 B2
(45) Date of Patent: Jul. 15, 2025

(54) RESIST UNDERLAYER FILM-FORMING COMPOSITION

(71) Applicant: NISSAN CHEMICAL CORPORATION, Tokyo (JP)

(72) Inventors: Hikaru Tokunaga, Toyama (JP); Hayato Hattori, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 693 days.

(21) Appl. No.: 17/641,235

(22) PCT Filed: Oct. 1, 2020

(86) PCT No.: PCT/JP2020/037387
§ 371 (c)(1),
(2) Date: Mar. 8, 2022

(87) PCT Pub. No.: WO2021/070727
PCT Pub. Date: Apr. 15, 2021

(65) Prior Publication Data
US 2022/0342306 A1 Oct. 27, 2022

(30) Foreign Application Priority Data
Oct. 9, 2019 (JP) ................... 2019-185974

(51) Int. Cl.
| G03F 7/039 | (2006.01) |
| G03F 7/004 | (2006.01) |
| G03F 7/09 | (2006.01) |
| G03F 7/11 | (2006.01) |
| G03F 7/32 | (2006.01) |
| G03F 7/40 | (2006.01) |
| H01L 21/027 | (2006.01) |
| H01L 21/308 | (2006.01) |

(52) U.S. Cl.
CPC .......... *G03F 7/0392* (2013.01); *G03F 7/0045* (2013.01); *G03F 7/094* (2013.01); *G03F 7/11* (2013.01); *G03F 7/322* (2013.01); *G03F 7/40* (2013.01); *H01L 21/0275* (2013.01); *H01L 21/0276* (2013.01); *H01L 21/3081* (2013.01); *H01L 21/3086* (2013.01)

(58) Field of Classification Search
None
See application file for complete search history.

(56) References Cited

U.S. PATENT DOCUMENTS

| 6,020,508 A | 2/2000 | Nikolic et al. |
| 2007/0275325 A1 | 11/2007 | Hatakeyama et al. |
| 2008/0292995 A1 | 11/2008 | Houlihan et al. |
| 2012/0104529 A1 | 5/2012 | Tanaka |
| 2015/0212418 A1 | 7/2015 | Nishimaki et al. |
| 2018/0164681 A1 | 6/2018 | Kamimura et al. |
| 2019/0079397 A1* | 3/2019 | Endo ................. G03F 7/094 |

FOREIGN PATENT DOCUMENTS

| CN | 108089405 A | * | 5/2018 | ........... C07C 47/546 |
| JP | H11-35566 A | | 2/1999 | |
| JP | 2006-259249 A | | 9/2006 | |
| JP | 2007-316282 A | | 12/2007 | |
| JP | 2009-221286 A | | 10/2009 | |
| JP | 2010-528334 A | | 8/2010 | |
| JP | 2011-057964 A | | 3/2011 | |
| JP | 2016-060886 A | | 4/2016 | |
| WO | 2014/024836 A1 | | 2/2014 | |
| WO | 2017/038708 A1 | | 3/2017 | |

OTHER PUBLICATIONS

CN108089405 English Translation (Year: 2024).*
Dec. 22, 2020, International Search Report issued in International Application No. PCT/JP2020/037387.
Apr. 12, 2022, International Preliminary Report on Patentability issued in International Application No. PCT/JP2020/037387.

* cited by examiner

*Primary Examiner* — Mark F. Huff
*Assistant Examiner* — Kevin J Drummey
(74) *Attorney, Agent, or Firm* — Oliff PLC

(57) ABSTRACT

A composition for forming a resist underlayer film includes: (A) a crosslinkable compound represented by formula (I) and (D) a solvent. [In the formula, n is an integer of 2-6, the n-number of Z each independently are monovalent organic groups including a mono-, di-, tri-, tetra-, penta-, or hexaformylaryl group, the n-number of A each independently represent —$OCH_2CH(OH)CH_2O$— or (BB), and T is an n-valent hydrocarbon group and/or repeating unit of a polymer optionally having at least one group selected from the group made of a hydroxy group, an epoxy group, an acyl group, an acetyl group, a benzoyl group, a carboxy group, a carbonyl group, an amino group, an imino group, a cyano group, an azo group, an azide group, a thiol group, a sulfo group, and an allyl group and optionally interrupted by a carbonyl group and/or an oxygen atom.]

13 Claims, No Drawings

RESIST UNDERLAYER FILM-FORMING COMPOSITION

TECHNICAL FIELD

The present invention relates to a resist underlayer film-forming composition suited for lithographic processing of semiconductor substrates, to a resist underlayer film obtained from the resist underlayer film-forming composition, and to a method for producing a patterned substrate and a method for manufacturing a semiconductor device using the resist underlayer film-forming composition.

BACKGROUND ART

Conventionally, lithographic microfabrication using a photoresist composition has been performed in the manufacturing of semiconductor devices. In the microfabrication, a thin film of a photoresist composition is formed on a workpiece substrate such as a silicon wafer, and is irradiated with an active ray such as ultraviolet light through a mask pattern disposed thereon that corresponds to a pattern to be formed in the semiconductor device. The latent image is then developed, and the workpiece substrate such as a silicon wafer is etched while using the photoresist pattern as a protective film. Due to the recent increase in the density of semiconductor devices, the type of active ray that is used has shifted to a shorter wavelength, specifically, from KrF excimer laser beam (248 nm) to ArF excimer laser beam (193 nm). Finer microfabrication has been sought for through the development of lithographic techniques using extreme ultraviolet light (EUV, 13.5 nm) or electron beam (EB) as the active ray.

As known in the art, the lithographic process encounters such a problem that when a resist layer on a substrate is exposed to an ultraviolet laser beam such as KrF excimer laser beam or ArF excimer laser beam, the resist is not patterned with the desired shape due to the influence of a standing wave generated by the reflection of the ultraviolet laser beam on the substrate surface. To solve this problem, a resist underlayer film (an antireflection film) is provided between the substrate and the resist layer.

When such a resist underlayer film is formed between a photoresist and a workpiece substrate, the resist may become mixed (intermingled) with the photoresist that is formed thereon. To prevent this mixing, the underlayer film material after being applied onto the workpiece substrate is generally calcined into a thermoset crosslinked film that is immiscible with the photoresist.

As known in the art, various resins are used as compositions for forming resist underlayer films. For example, Patent Literature 1 and Patent Literature 2 disclose photoresist underlayer film-forming materials that contain a resin having a novolak repeating unit derived from a compound having a bisphenol group. Further, Patent Literature 3 discloses a spin-coatable antireflective coating composition that includes a polymer having three or more fused aromatic rings in the backbone of the polymer.

When a workpiece substrate as a base has steps or when a wafer has a densely patterned region and a pattern-free region, such irregularities need to be covered with a flat surface of an underlayer film. Resins suited for this purpose have been proposed (Patent Literature 4).

To form thermally curable films, resist underlayer film-forming compositions contain a polymer resin as a main component and also contain a crosslinking compound (a crosslinking agent) and a catalyst (a crosslinking catalyst) for promoting the crosslinking reaction. These crosslinking components are not fully studied from the point of view of flattening of the surface of underlayer films.

CITATION LIST

Patent Literature

Patent Literature 1: JP 2006-259249 A
Patent Literature 2: JP 2007-316282 A
Patent Literature 3: JP 2010-528334 A
Patent Literature 4: WO 2014/024836 A1

SUMMARY OF INVENTION

Technical Problem

An object of the present invention is to provide a composition that is capable of forming a resist underlayer film which is insoluble in a resist solvent, has a good optical constant and allows for appropriate control of etching rate, and that can excellently fill gaps on a stepped substrate with high flatness.

Solution to Problem

Aspects of the present invention include the following.

[1] A resist underlayer film-forming composition comprising:
(A) a crosslinking compound represented by formula (I) below; and
(D) a solvent,

[Chem. 1]

$$T \!-\!\!\left(\!A \!-\! Z\right)_n \quad \text{Formula (I)}$$

wherein n is an integer of 2 to 6,
n quantity of Z are each independently a monovalent organic group comprising a mono-, di-, tri-, tetra-, penta- or hexaformylaryl group,
n quantity of A each independently denote —OCH$_2$CH(OH)CH$_2$O— or

[Chem. 2]

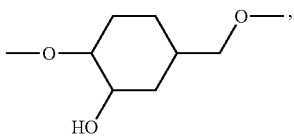

and
T is an n valent hydrocarbon group and/or repeating unit of a polymer, which optionally contains at least one group selected from the group consisting of a hydroxy group, an epoxy group, an acyl group, an acetyl group, a benzoyl group, a carboxy group, a carbonyl group, an amino group, an imino group, a cyano group, an azo group, an azide group, a thiol group, a sulfo group and an allyl group, and which is optionally interrupted by a carbonyl group and/or an oxygen atom.

[2] The resist underlayer film-forming composition according to [1], wherein the crosslinking compound (A) further contains a self-crosslinking group.

[3] The resist underlayer film-forming composition according to [1], further comprising. a crosslinkable film material (B) capable of causing a crosslinking reaction with the crosslinking compound (A)

[4] The resist underlayer film-forming composition according to [3], wherein the crosslinkable film material (B) comprises at least one member selected from the group consisting of aliphatic ring-containing resins, novolak resins, polyether resins, polyester resins, acrylic resins, methacrylic resins and compounds differing from the crosslinking compounds (A).

[5] The resist underlayer film-forming composition according to [4], wherein the novolak resins are represented by one, or two or more repeating structural units represented by the following formulas (1a), (1b) and (1c):

[Chem. 3]

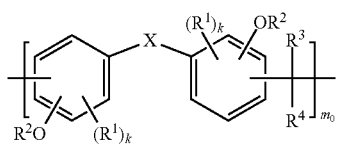
(1a)

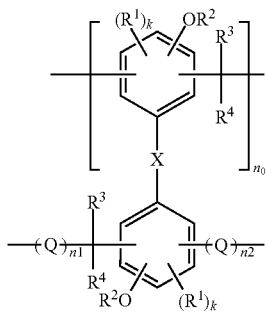
(1b)

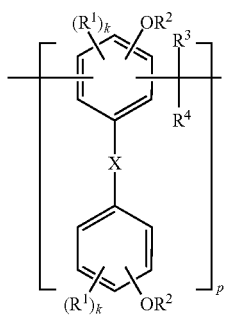
(1c)

wherein $R^1$ at two occurrences each independently denotes a $C_1$-$C_{10}$ alkyl group, a $C_2$-$C_6$ alkenyl group, an aromatic hydrocarbon group, a halogen atom, a nitro group or an amino group; $R^2$ at two occurrences each independently denotes a hydrogen atom, a $C_1$-$C_{10}$ alkyl group, a $C_2$-$C_6$ alkenyl group, an acetal group, an acyl group or a glycidyl group; $R^3$ denotes an optionally substituted aromatic hydrocarbon group; $R^4$ denotes a hydrogen atom, a phenyl group or a naphthyl group; when $R^3$ and $R^4$ bonded to the same single carbon atom each denote a phenyl group, the phenyl groups are optionally bonded to each other to form a fluorene ring; in formula (1b), the two groups indicated by $R^3$ are optionally different from one another, and the two atoms or groups indicated by $R^4$ are optionally different from one another; k at two occurrences each independently indicates 0 or 1; $m_0$ indicates an integer of 3 to 500; $n_0$, $n_1$ and $n_2$ each indicate an integer of 2 to 500; p indicates an integer of 3 to 500; X denotes a single bond or a heteroatom; and Q at two occurrences each independently denotes a structural unit represented by the following formula (2):

[Chem. 4]

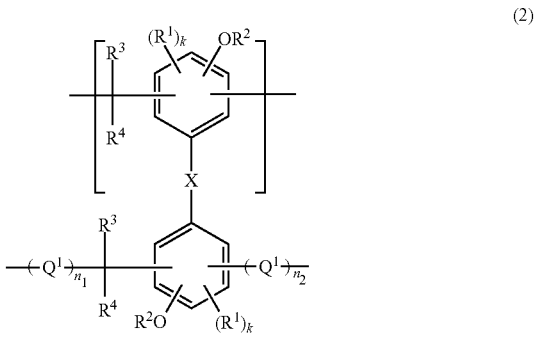
(2)

wherein $R^1$ at two occurrences, $R^2$ at two occurrences, $R^3$ at two occurrences, $R^4$ at two occurrences, k at two occurrences, $n_1$, $n_2$ and X are the same as defined in formula (1b); and $Q^1$ at two occurrences each independently denotes a structural unit represented by formula (2).

[6] The resist underlayer film-forming composition according to [4], wherein the compounds differing from the crosslinking compounds (A) are represented by:

[Chem. 5]

Ar-Q-Ar (2)

wherein Ar at two occurrences each denotes an aryl group, the aryl group having at least one hydroxy group as a substituent; and Q denotes a divalent linking group having at least one benzene ring or naphthalene ring, a methylene group or a single bond.

[7] The resist underlayer film-forming composition according to any one of [1] to [6], further comprising an acid catalyst (C).

[8] A resist underlayer film comprising a cured product of a coating film comprising the resist underlayer film-forming composition according to any one of [1] to [7].

[9] A method for producing a patterned substrate, comprising the steps of:
applying the resist underlayer film-forming composition according to any one of claims 1 to 8 onto a semiconductor substrate and curing the resist underlayer film-forming composition to form a resist underlayer film,
applying a resist onto the resist underlayer film and baking the resist to form a resist film,
exposing the semiconductor substrate coated with the resist underlayer film and the resist, and
developing the exposed resist film to perform patterning.

[10] The method for producing a patterned substrate according to [9], wherein the resist underlayer film-forming composition is cured by baking.

[11] The method for producing a patterned substrate according to [9], wherein the resist underlayer film-forming composition is cured by baking followed by UV irradiation.

[12] A method for manufacturing a semiconductor device, comprising the steps of:
forming, on a semiconductor substrate, a resist underlayer film using the resist underlayer film-forming composition according to any one of claims 1 to 8,
forming a resist film on the resist underlayer film,
forming a resist pattern by applying light or electron beam followed by development,
etching the underlayer film through the resist pattern, and processing the semiconductor substrate through the patterned underlayer film.

Advantageous Effects of Invention

The resist underlayer film-forming composition according to the present invention has a higher curing finish temperature than the conventional products, and the resin can remain fluid for a longer time. Thus, when applied onto a finely patterned substrate, the resist underlayer film-forming composition according to the present invention remains fluid for a certain amount of time until the composition is crosslinked into a three-dimensional network. As a result, the resist underlayer film-forming composition according to the present invention can fill gaps in the fine pattern on the stepped substrate without clearance. After applied onto the stepped substrate, the resist underlayer film-forming composition according to the present invention may be calcined to form a resist underlayer film that allows a coating to be formed thereon with a small variation in film thickness (iso-dense bias) between on the patterned region (the dense area (the patterned area)) and on the pattern-free region (the open area (the pattern-free area)).

DESCRIPTION OF EMBODIMENTS

[Resist Underlayer Film-Forming Compositions]

A resist underlayer film-forming composition according to the present invention includes:
(A) a crosslinking compound represented by formula (I) below, and
(D) a solvent.

The resist underlayer film-forming composition according to the present invention may optionally further include:
(B) a crosslinkable film material capable of causing a croslinking reaction with the crosslinking compound (A), and/or
(C) an acid catalyst.

Where necessary, the resist underlayer film-forming composition according to the present invention may further include additives such as an acid generator and a surfactant.

[(A) Crosslinking Compound]

The crosslinking compound (A) used in the present invention is represented by the following formula (I):

[Chem. 6]

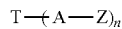

Formula (I)

In the formula, n is an integer of 2 to 6,
n quantity of Z are each independently a monovalent organic group comprising a mono-, di-, tri-, tetra-, penta- or hexaformylaryl group,
n quantity of A each independently denote —OCH$_2$CH(OH)CH$_2$O— or

[Chem. 7]

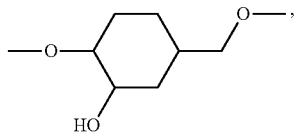

and

T is an n valent hydrocarbon group and/or repeating unit of a polymer, which optionally contains at least one group selected from the group consisting of a hydroxy group, an epoxy group, an acyl group, an acetyl group, a benzoyl group, a carboxy group, a carbonyl group, an amino group, an imino group, a cyano group, an azo group, an azide group, a thiol group, a sulfo group and an allyl group, and which is optionally interrupted by a carbonyl group and/or an oxygen atom.

Z may have an ester bond at the end bonded to A.

The formyl group is a group represented by —CHO.

Examples of the aryl group include substituted or unsubstituted phenyl, naphthyl, anthryl and pyrenyl groups. $C_6$-$C_{18}$ aryl groups are preferable. $C_6$-$C_{14}$ aryl groups are more preferable. $C_6$-$C_{10}$ aryl groups are still more preferable. $C_6$ aryl groups are most preferable.

Examples of the substituent include halogen atom, hydroxy group, nitro group, amino group, glycidyl group, $C_1$-$C_{10}$ alkyl groups, $C_1$-$C_{10}$ alkoxy groups, $C_4$-$C_{40}$ aryl groups, $C_1$-$C_6$ acyl groups, $C_1$-$C_6$ alkoxycarbonyl groups, $C_1$-$C_6$ alkylthio groups and $C_1$-$C_6$ carboxyl groups.

The aryl group may be substituted with the formyl group and any of the above substituents at any positions without limitation.

Examples of the halogen atom include fluorine atom, chlorine atom, bromine atom and iodine atom.

Examples of the $C_1$-$C_{10}$ alkyl groups include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2, 3-trimethyl-cyclopropyl group, 1-ethyl-2-methyl-cyclopropyl group, 2-ethyl-1-methyl-cyclopropyl group, 2-ethyl-2-methyl-cyclopropyl group and 2-ethyl-3-methyl-cyclopropyl group.

Examples of the $C_1$-$C_{10}$ alkoxy groups include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group and 1-ethyl-2-methyl-n-propoxy group. $C_1$-$C_9$ alkoxy groups are preferable. $C_1$-$C_6$ alkoxy groups are more preferable. $C_1$-$C_3$ alkoxy groups are still more preferable.

Examples of the $C_4$-$C_{40}$ aryl groups include phenyl group, naphthyl group, tolyl group, benzyl group, trityl group, styryl group, furyl group, thienyl group and pyridyl group.

The $C_1$-$C_6$ acyl groups, the $C_1$-$C_6$ alkoxycarbonyl groups, the $C_1$-$C_6$ alkylthio groups and the $C_1$-$C_6$ carboxyl groups are groups represented by RCO—, ROCO—, RS— and RCOO—, respectively, in which R is the alkyl group described hereinabove.

The hydrocarbon group is a group derived from a hydrocarbon compound by the removal of n quantity of hydrogen atom.

The hydrocarbon compounds in the present invention include aromatic hydrocarbon compounds optionally interrupted with an aliphatic hydrocarbon group, and aliphatic hydrocarbon compounds optionally interrupted with an aromatic ring. These compounds may contain a heteroatom such as N, O and S.

The number of carbon atoms is preferably 12 or more, more preferably 16 or more, and is preferably 72 or less, more preferably 60 or less.

Examples of T when n is 2 include alkylene groups, arylene groups, alkylene groups interrupted with an arylene group (for example, alkylene groups interrupted with a phenylene or alkoxyphenylene group), arylene groups interrupted with an alkylene group (for example, allylphenylene groups interrupted with a propylene group), arylene groups substituted with an alkyl group (for example, biphenylene groups substituted with a methyl group), arylene groups interrupted with an oxygen atom (for example, naphthylene groups interrupted with an oxygen atom), and arylene groups interrupted with an alkylene group and substituted with an alkyl group (for example, tolylene and naphthylene groups interrupted with a methylene group). When n is 2, T may be a polymer including any of the above exemplary groups as a repeating unit.

The crosslinking compound (A) may contain a self-crosslinking group. The self-crosslinking group is such a group (self-crosslinking group) that when the crosslinking compound (A) is a polymerizable compound and is polymerized (is a polymer), the polymer molecules can be crosslinked with one another (without adding a cros slinking agent). Specific examples of the self-cros slinking groups include hydroxy group and aldehyde group.

Specific examples of the cros slinking compound of formula (I) used in the present invention include the following.

[Chem. 8]

Formula (1-1)

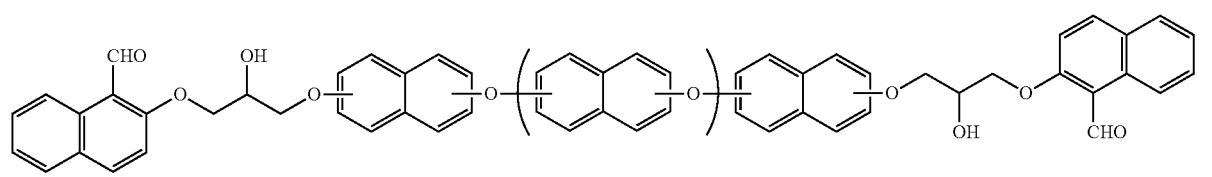

[Chem. 9]

Formula (1-2)

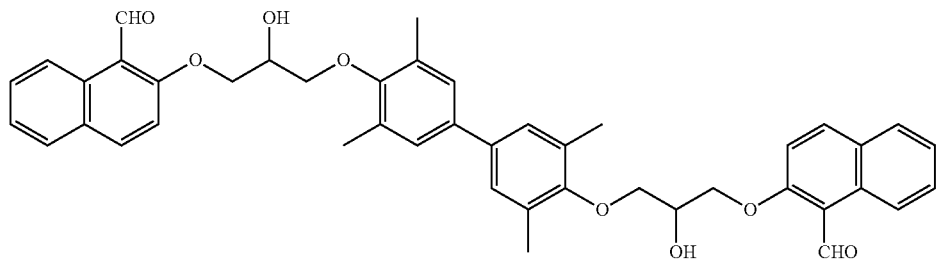

-continued
[Chem. 10]
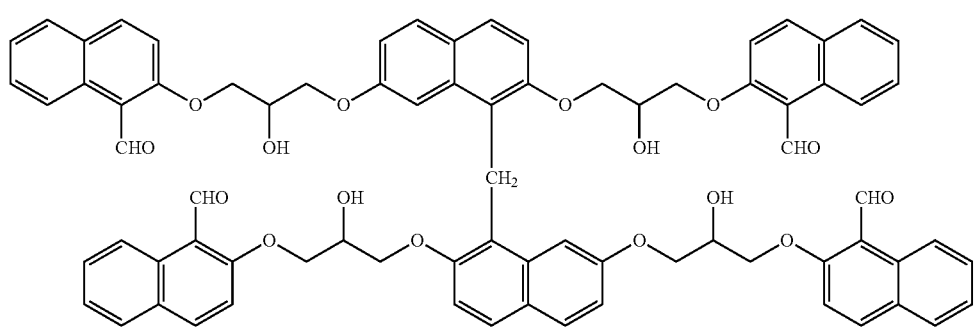
Formula (1-3)
[Chem. 11]
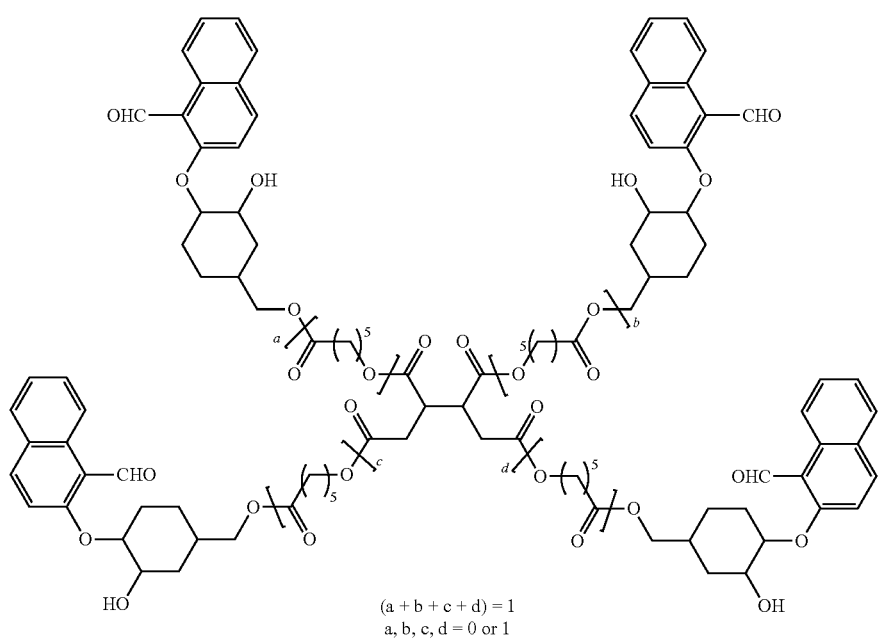
Formula (1-4)
[Chem. 12]
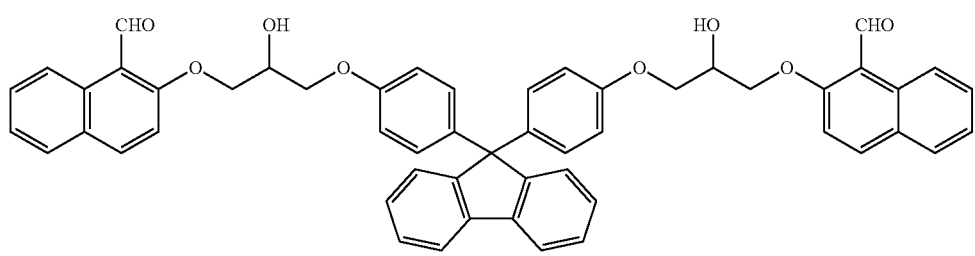
Formula (1-5)
[Chem. 13]
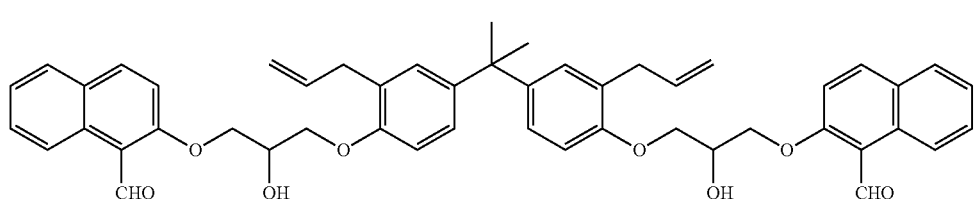
Formula (1-6)

[Chem. 14]
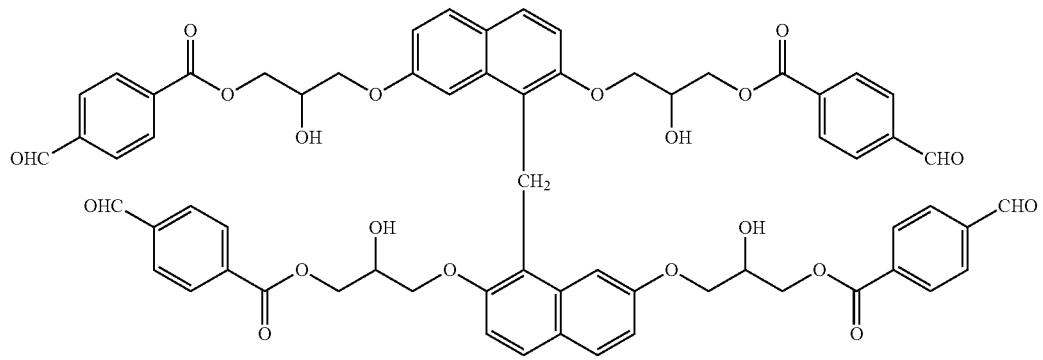
Formula (1-7)
[Chem. 15]
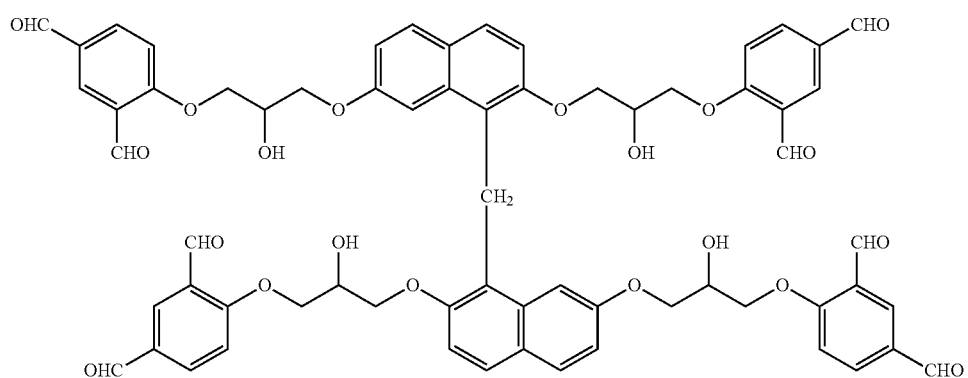
Formula (1-8)
[Chem. 16]
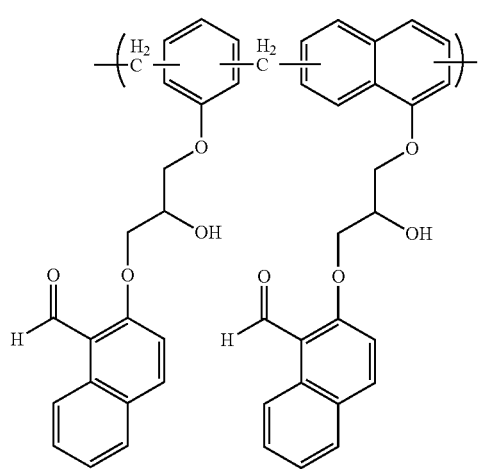
Formula (1-12)

[Chem. 17]
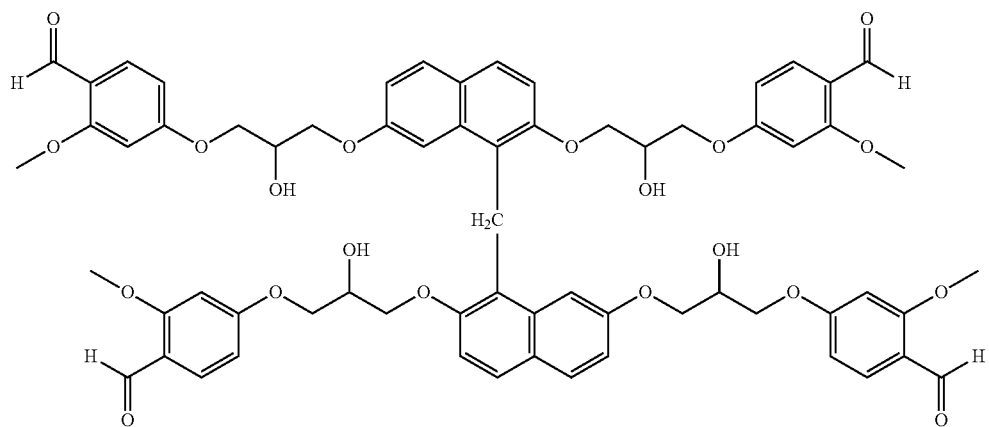
Formula (1-13)
[Chem. 18]
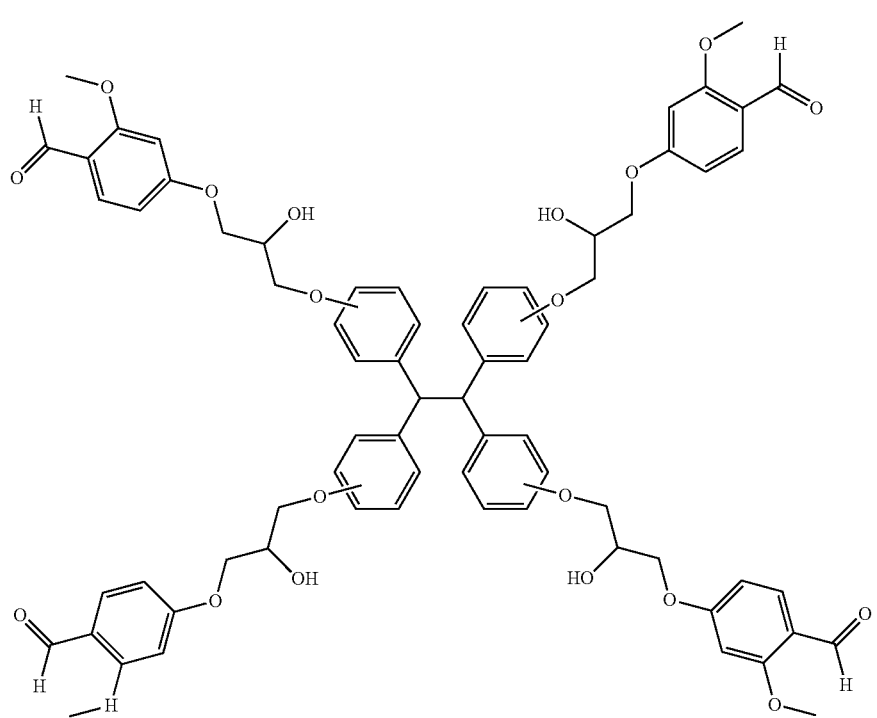
Formula (1-14)

-continued

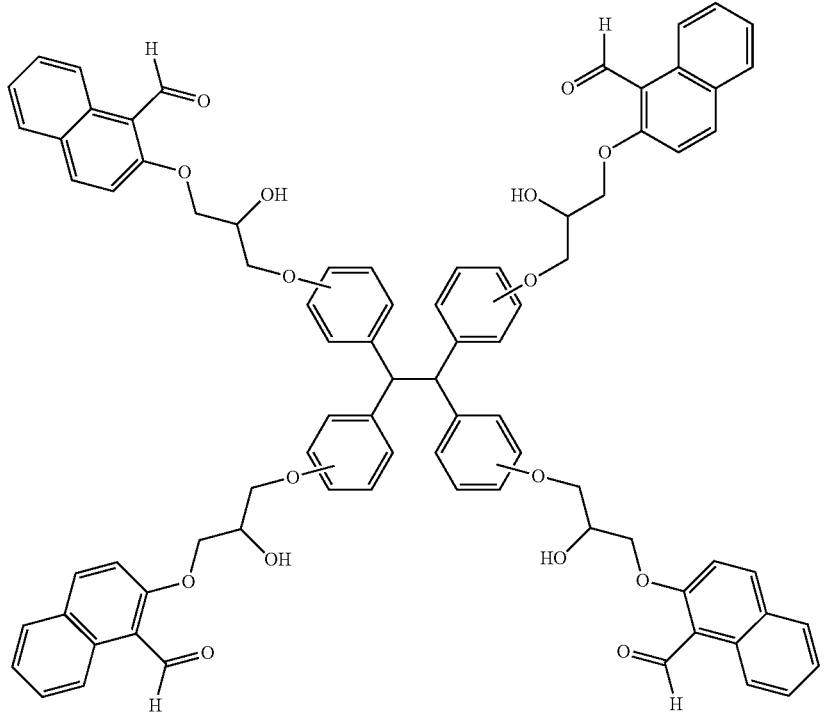

Formula (1-15)

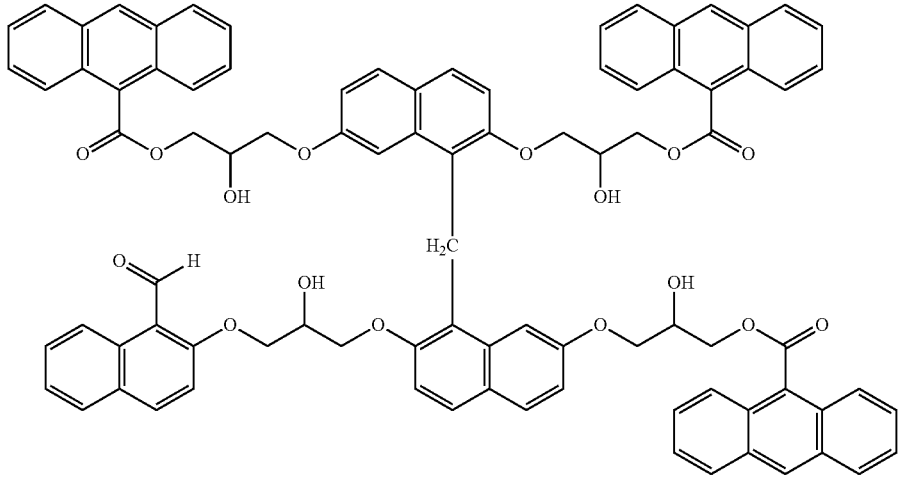

Formula (1-16)

The content of the crosslinking compound (A) in the resist underlayer film-forming composition according to the present invention is usually 0.01% by mass or more, preferably 0.1% by mass or more, and more preferably 1.0% by mass or more, and is usually 100% by mass or less, preferably 99% by mass or less, and more preferably 98% by mass or less, based on the total solid content.

The compound (A) represented by formula (I) in which n is 2 may be obtained by reacting a compound of formula (101) below having two hydroxy groups with a glycidyl ether compound represented by formula (102) below.

[Chem. 21]

T(OH)$_2$     Formula (101)

[Chem. 22]

$$2 \underset{O}{\underset{\diagdown\!\diagup}{CH_2CHCH_2O}}-Z$$     Formula (102)

In the formulas, Z and T are as defined hereinabove.

The crosslinking compound (A) represented by formula (I) may be obtained by reacting a compound of formula (103) below having two glycidyl ether groups with a hydroxy compound represented by formula (104) below.

[Chem. 23]

$$\text{CH}_2\text{CHCH}_2\text{O}\underset{\text{O}}{\diagdown\diagup}\text{—T—OCH}_2\text{CHCH}_2\underset{\text{O}}{\diagdown\diagup} \quad \text{Formula (103)}$$

[Chem. 24]

$$2 \ \text{ZOH} \quad \text{Formula (104)}$$

In the formulas, Z and T are as defined hereinabove.

The compounds represented by formulas (102) and (103) may be replaced by compounds represented by the following formulas (105) and (106), respectively.

[Chem. 25]

Formula (105)

[Chem. 26]

Formula (106)

In the formulas, Z and T are as defined hereinabove.

The reactions described above may be carried out in an appropriate solvent in the presence of an appropriate catalyst.

The solvent is not particularly limited as long as the solvent can uniformly dissolve the hydroxy compound represented by formula (101) and the glycidyl ether compound represented by formula (102); the glycidyl ether compound represented by formula (103) and the hydroxy compound represented by formula (104); the compound represented by formula (101) and the compound represented by formula (105); or the compound represented by formula (106) and the compound represented by formula (104), and as long as the solvent does not inhibit the reaction or induce side reactions.

Examples include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monoethyl ether, propylene glycol monomethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide and N,N-dimethylacetamide. The solvents may be used each alone or in combination of two or more. Of the solvents described above, propylene glycol monomethyl ether, propylene glycol monomethyl ether acetate, ethyl lactate, butyl lactate and cyclohexanone are preferable.

Examples of the catalysts include quaternary ammonium salts such as tetrabutylammonium bromide, quaternary phosphonium salts such as ethyltriphenylphosphonium bromide, and phosphine compounds such as triphenylphosphine. Ethyltriphenylphosphonium bromide is preferable.

Cation exchange resins and anion exchange resins for catalysts may be used to ensure that undesired substances such as unreacted acids and catalysts, and inactivated catalysts will not remain in the reaction system.

[(B) Crosslinkable Film Material Capable of Causing a Crosslinking Reaction with Crosslinking Compound (A)]

The film material that is optionally used in the present invention is not particularly limited as long as the material is crosslinkable with the crosslinking compound (A). The film material may be a polymer, an oligomer, or a low-molecular compound having a molecular weight of 1,000 or less. Examples of the crosslinking groups present in the film materials include, but are not limited to, hydroxy group, carboxyl group, amino group and alkoxy groups.

Exemplary crosslinkable film materials (a) are alicyclic epoxy polymers disclosed in WO 2011/021555 A1, which have a repeating structural unit represented by the following formula (1):

[Chem. 27]

$$-\!(\text{T})\!-\!\!\underset{\text{E}}{\big|} \quad \text{Formula (1)}$$

T denotes a repeating unit structure with an aliphatic ring in the main chain of the polymer, and E denotes an epoxy group or an epoxy-containing organic group.

E is substituted on the aliphatic ring in such a manner that either the epoxy group is directly bonded to the aliphatic group or the epoxy-containing organic group (for example, a glycidyl group) is bonded to the aliphatic group.

The aliphatic ring is, for example, a ring containing 4 to 10 carbon atoms linked to one another into a ring shape, in particular, a ring containing 6 carbon atoms linked to one another into a ring shape. The aliphatic ring may have an additional substituent other than the substituent E (an epoxy group or an epoxy-containing organic group). Examples of such substituents include $C_1$-$C_{10}$ alkyl groups, $C_6$-$C_{20}$ aryl groups, halogen atoms, nitro group and amino group.

The alicyclic epoxy polymer represented by formula (1) has a weight average molecular weight of 600 to 1,000,000, preferably 1,000 to 200,000. The number of the repeating units of formula (1) in the alicyclic epoxy polymer (A) is within the range of 2 to 3,000 or 3 to 600.

Examples of the polymers include the following:

[Chem. 28]

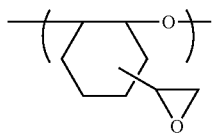

Formula (1-1)

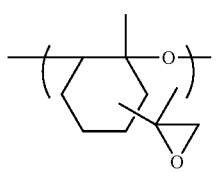

Formula (1-2)

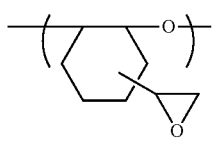 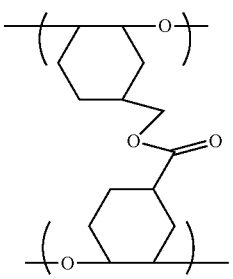

Formula (1-3)

Exemplary crosslinkable film materials (b) are polymers disclosed in WO 2014/024836 A1, which include one, or two or more repeating structural units represented by the following formulas (1a), (1b) and (1c):

[Chem. 29]

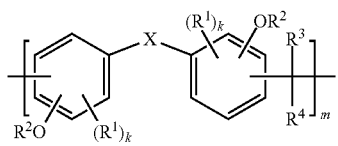

(1a)

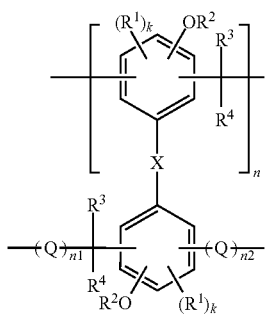

(1b)

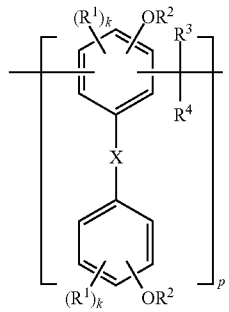

(1c)

wherein $R^1$ at two occurrences each independently denotes a $C_1$-$C_{10}$ alkyl group, a $C_2$-$C_6$ alkenyl group, an aromatic hydrocarbon group, a halogen atom, a nitro group or an amino group; $R^2$ at two occurrences each independently denotes a hydrogen atom, a $C_1$-$C_{10}$ alkyl group, a $C_2$-$C_6$ alkenyl group, an acetal group, an acyl group or a glycidyl group; $R^3$ denotes an optionally substituted aromatic hydrocarbon group; $R^4$ denotes a hydrogen atom, a phenyl group or a naphthyl group; when $R^3$ and $R^4$ bonded to the same single carbon atom each denote a phenyl group, the phenyl groups are optionally bonded to each other to form a fluorene ring; in formula (1b), the two groups indicated by $R^3$ are optionally different from one another, and the two atoms or groups indicated by $R^4$ are optionally different from one another; k at two occurrences each independently indicates 0 or 1; m indicates an integer of 3 to 500; n, $n_1$ and $n_2$ each indicate an integer of 2 to 500; p indicates an integer of 3 to 500; X denotes a single bond or a heteroatom; and Q at two occurrences each independently denotes a structural unit represented by the following formula (2):

[Chem. 30]

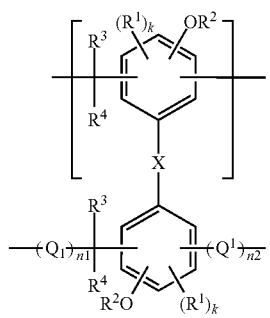

(2)

wherein $R^1$ at two occurrences, $R^2$ at two occurrences, $R^3$ at two occurrences, $R^4$ at two occurrences, k at two occurrences, $n_1$, $n_2$ and X are the same as defined in formula (1b); and $Q^1$ at two occurrences each independently denotes a structural unit represented by formula (2).

The aromatic hydrocarbon group denoted by $R^3$ is preferably a phenyl group, a naphthyl group, an anthryl group or a pyrenyl group.

Exemplary crosslinkable film materials (c) are polymers disclosed in WO 2010/147155 A1, which include a unit structure represented by the following formula (1):

[Chem. 31]

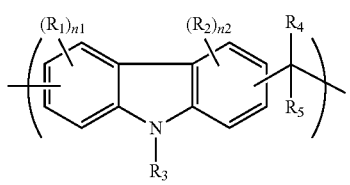

Formula (1)

wherein $R_1$ and $R_2$ are each selected from the group consisting of a hydrogen atom, a halogen group, a nitro group, an amino group, a hydroxy group, a $C_1$-$C_{10}$ alkyl group, a $C_2$-$C_{10}$ alkenyl group, a $C_6$-$C_{40}$ aryl group and a combination of any thereof, the alkyl group, the alkenyl group or the aryl group optionally containing an ether bond, a ketone bond or an ester bond, $R_3$ is selected from the group consisting of a hydrogen atom, a $C_1$-$C_{10}$ alkyl group, a $C_2$-$C_{10}$ alkenyl group, a $C_6$-$C_{40}$ aryl group, and a combination of any thereof, the alkyl group, the alkenyl group or the aryl group optionally containing an ether bond, a ketone bond or an ester bond, $R_4$ denotes a $C_6$-$C_{40}$ aryl or heterocyclic group optionally substituted with a halogen group, a nitro group, an amino group or a hydroxy group, $R_5$ denotes a hydrogen atom or a $C_1$-$C_{10}$ alkyl, $C_6$-$C_{40}$ aryl or heterocyclic group optionally substituted with a halogen group, a nitro group, an amino group or a hydroxy group, $R_4$ and $R_5$ may form a ring together with the carbon atom to which they are bonded, and n1 and n2 are each an integer of 1 to 3.

A preferred polymer is one that includes a unit structure of formula (1), in which $R_1$, $R_2$, $R_3$ and $R_5$ each denote a hydrogen atom, and $R_4$ denotes a phenyl group or a naphthyl group.

A preferred polymer is one that includes a unit structure of formula (1), in which $R_1$, $R_2$ and $R_3$ each denote a hydrogen atom, and $R_4$ and $R_5$ together with the carbon atom to which they are bonded form a fluorene ring in such a manner that the carbon atom is located at the 9-position of the fluorene ring formed.

A preferred polymer is one that includes a unit structure represented by formula (2) and/or a unit structure represented by formula (3) below:

[Chem. 32]

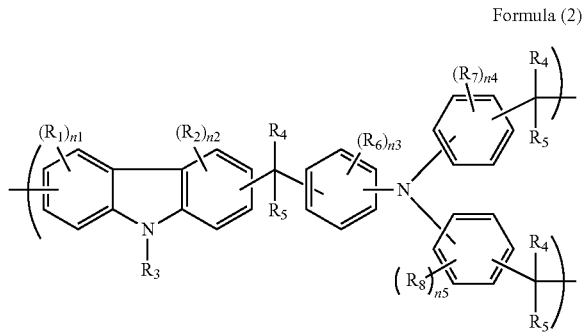

Formula (2)

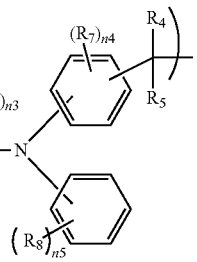

Formula (3)

wherein $R_1$, $R_2$, $R_6$, $R_7$ and $R_8$ are each selected from the group consisting of a hydrogen atom, a halogen group, a nitro group, an amino group, a hydroxy group, a $C_1$-$C_{10}$ alkyl group, a $C_2$-$C_{10}$ alkenyl group, a $C_6$-$C_{40}$ aryl group, and a combination of any thereof, the alkyl group, the alkenyl group or the aryl group optionally containing an ether bond, a ketone bond or an ester bond, $R_3$ is selected from the group consisting of a hydrogen atom, a $C_1$-$C_{10}$ alkyl group, a $C_2$-$C_{10}$ alkenyl group, a $C_6$-$C_{40}$ aryl group, and a combination of any thereof, the alkyl group, the alkenyl group or the aryl group optionally containing an ether bond, a ketone bond or an ester bond, $R_4$ denotes a $C_6$-$C_{40}$ aryl or heterocyclic group optionally substituted with a halogen group, a nitro group, an amino group or a hydroxy group, $R_5$ denotes a hydrogen atom or a $C_1$-$C_{10}$ alkyl, $C_6$-$C_{40}$ aryl or heterocyclic group optionally substituted with a halogen group, a nitro group, an amino group or a hydroxy group, $R_4$ and $R_5$ may form a ring together with the carbon atom to which they are bonded, n1 and n2 are each an integer of 1 to 3, and n3 to n5 are each an integer of 1 to 4.

A preferred polymer is one that includes a unit structure of formula (2) and/or a unit structure of formula (3), in which $R_1$, $R_2$, $R_3$, $R_5$, $R_6$, $R_7$ and $R_8$ each denote a hydrogen atom, and $R_4$ denotes a phenyl group or a naphthyl group.

Exemplary crosslinkable film materials (d) are polymers disclosed in WO 2013/005797 A1, which include a unit structure resulting from the reaction of a fused heterocyclic compound with a bicyclo cyclic compound.

Preferably, the fused heterocyclic compound is a carbazole compound or a substituted carbazole compound.

Preferably, the bicyclo cyclic compound is dicyclopentadiene, substituted dicyclopentadiene, tetracyclo[4.4.0.1$^{2.5}$.1$^{7.10}$]dodeca-3,8-diene or substituted tetracyclo[4.4.0.1$^{2.5}$.1$^{7.10}$]dodeca-3,8-diene.

A preferred polymer is one that includes a unit structure represented by formula (1) below, a unit structure represented by formula (2) below, a unit structure represented by formula (3) below, or a combination of any thereof.

[Chem. 33]

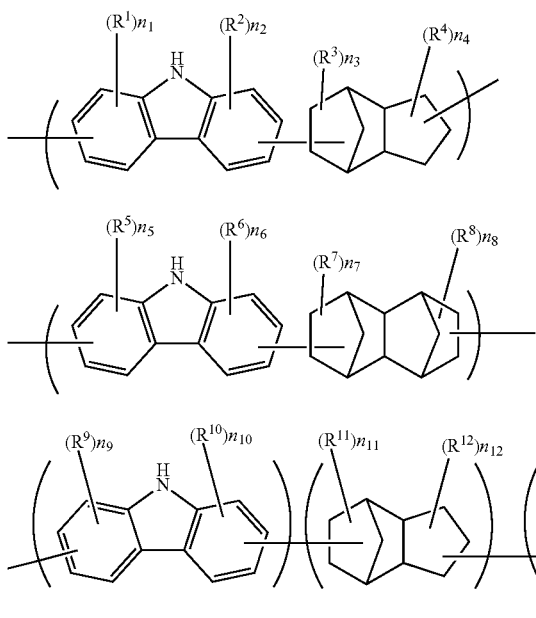

Formula (1)

Formula (2)

Formula (3)

In the formulas, $R^1$ to $R^{14}$ are substituents for hydrogen atoms and are each independently a halogen group, a nitro group, an amino group or a hydroxy group, or a $C_1$-$C_{10}$ alkyl or $C_6$-$C_{40}$ aryl group optionally substituted with any of the groups mentioned above, Ar is a $C_6$-$C_{40}$ aromatic ring, $n_1$, $n_2$, $n_5$, $n_6$, $n_9$, $n_{10}$, $n_{13}$, $n_{14}$ and $n_{15}$ are each an integer of 0 to 3, and $n_3$, $n_4$, $n_7$, $n_8$, $n_{11}$ and $n_{12}$ are each an integer of 0 to 4.

In formula (3), Ar is preferably a phenyl group or a naphthyl group.

Exemplary crosslinkable film materials (e) are polymers disclosed in WO 2012/176767 A1, which include a unit structure represented by formula (1):

[Chem. 34]

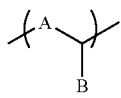

Formula (1)

wherein A is a hydroxyl-substituted phenylene group derived from polyhydroxybenzene, and B is a monovalent fused aromatic hydrocarbon ring group in which 2 to 4 benzene rings are fused.

Preferably, A is a hydroxyl-substituted phenylene group derived from benzenediol or benzenetriol.

Preferably, A is a hydroxyl-substituted phenylene group derived from catechol, resorcinol, hydroquinone, pyrogallol, hydroxyquinol or phloroglucinol.

Preferably, the fused aromatic hydrocarbon ring group denoted by B is a naphthalene ring group, an anthracene ring group or a pyrene ring group.

Preferably, the fused aromatic hydrocarbon ring group denoted by B is substituted with a halogen group, a hydroxy group, a nitro group, an amino group, a carboxyl group, a carboxylic acid ester group, a nitrile group, or a combination of any thereof.

Exemplary crosslinkable film materials (f) are polymers disclosed in WO 2013/047516 A1, which include a unit structure (A) represented by the following formula (1):

[Chem. 35]

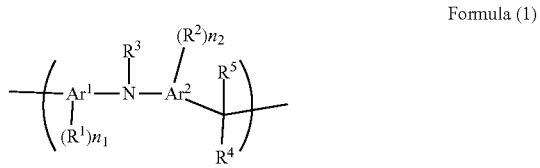

Formula (1)

wherein $Ar^1$ and $Ar^2$ each denote a benzene ring or a naphthalene ring, and $R^1$ and $R^2$ are substituents for hydrogen atoms on these rings, respectively, and are each selected from the group consisting of a halogen group, a nitro group, an amino group, a hydroxy group, a $C_1$-$C_{10}$ alkyl group, a $C_2$-$C_{10}$ alkenyl group, a $C_6$-$C_{40}$ aryl group, and a combination of any thereof, the alkyl group, the alkenyl group and the aryl group each being an organic group optionally containing an ether bond, a ketone bond or an ester bond, $R^3$ is selected from the group consisting of a hydrogen atom, a $C_1$-$C_{10}$ alkyl group, a $C_2$-$C_{10}$ alkenyl group, a $C_6$-$C_{40}$ aryl group, and a combination of any thereof, the alkyl group, the alkenyl group and the aryl group each being an organic group optionally containing an ether bond, a ketone bond or an ester bond, $R^4$ denotes an organic group selected from the group consisting of a $C_6$-$C_{40}$ aryl group and a heterocyclic group, the aryl group and the heterocyclic group being optionally substituted with a halogen group, a nitro group, an amino group, a $C_1$-$C_{10}$ alkyl group, an $C_1$-$C_{10}$ alkoxy group, a $C_6$-$C_{40}$ aryl group, a formyl group, a carboxyl group or a hydroxy group, $R^5$ denotes an organic group selected from the group consisting of a hydrogen atom, a $C_1$-$C_{10}$ alkyl group, a $C_6$-$C_{40}$ aryl group and a heterocyclic group, the alkyl group, the aryl group and the heterocyclic group being optionally substituted with a halogen group, a nitro group, an amino group or a hydroxy group, $R^4$ and $R^5$ optionally form a ring together with the carbon atom to which they are bonded, and n1 and n2 are each an integer of 0 to 3.

In formula (1), preferably, $R^5$ is a hydrogen atom and $R^4$ is an optionally substituted phenyl, naphthyl, anthryl or pyrenyl group.

In formula (1), preferably, $R^3$ is a hydrogen atom or a phenyl group.

A preferred polymer is one that includes a unit structure (A), in which one of $Ar^1$ and $Ar^2$ is a benzene ring and the other is a naphthalene ring. Such a unit structure will be written as unit structure (a1).

A preferred polymer is one that includes a unit structure (A), in which both $Ar^1$ and $Ar^2$ are benzene rings. Such a unit structure will be written as unit structure (a2).

A preferred polymer is a copolymer including a unit structure (a1) and a unit structure (a2).

A preferred polymer is a copolymer including a unit structure (A) of formula (1) and a unit structure (B) of the following formula (2):

[Chem. 36]

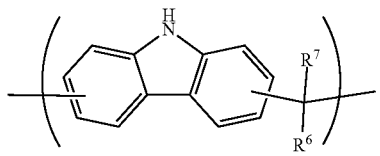

Formula (2)

wherein $R^6$ denotes an organic group selected from the group consisting of a $C_6$-$C_{40}$ aryl group and a heterocyclic group, the aryl group and the heterocyclic group being optionally substituted with a halogen group, a nitro group, an amino group, a $C_1$-$C_{10}$ alkyl group, a $C_1$-$C_{10}$ alkoxy group, a $C_6$-$C_{40}$ aryl group, a formyl group, a carboxyl group or a hydroxy group, $R^7$ is selected from the group consisting of a hydrogen atom, a $C_1$-$C_{10}$ alkyl group, a $C_6$-$C_{40}$ aryl group and a heterocyclic group, the alkyl group, the aryl group and the heterocyclic group each being an organic group optionally substituted with a halogen group, a nitro group, an amino group or a hydroxy group, and $R^6$ and $R^7$ optionally form a ring together with the carbon atom to which they are bonded.

A preferred polymer is a copolymer including a unit structure (a1) and a unit structure (B).

Exemplary crosslinkable film materials (g) are polymers disclosed in WO 2013/146670 A1, which include a unit structure represented by the following formula (1):

[Chem. 37]

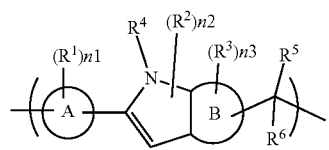

Formula (1)

wherein $R^1$, $R^2$ and $R^3$ are substituents for hydrogen atoms on the rings and are each independently a halogen group, a nitro group, an amino group, a hydroxy group, a $C_1$-$C_{10}$ alkyl group, a $C_2$-$C_{10}$ alkenyl group, a $C_6$-$C_{40}$ aryl group, or a combination of any thereof optionally containing an ether bond, a ketone bond or an ester bond; $R^4$ is a hydrogen atom, a $C_1$-$C_{10}$ alkyl group, a $C_2$-$C_{10}$ alkenyl group, a $C_6$-$C_{40}$ aryl group, or a combination of any thereof optionally containing an ether bond, a ketone bond or an ester bond; $R^5$ is a hydrogen atom or a $C_6$-$C_{40}$ aryl or heterocyclic group optionally substituted with a halogen group, a nitro group, an amino group, a formyl group, a carboxyl group, a carboxylic acid alkyl ester group, a phenyl group, a $C_1$-$C_{10}$ alkoxy group or a hydroxy group; $R^6$ is a hydrogen atom or a $C_1$-$C_{10}$ alkyl, $C_6$-$C_{40}$ aryl or heterocyclic group optionally substituted with a halogen group, a nitro group, an amino group, a formyl group, a carboxyl group, a carboxylic acid alkyl ester group or a hydroxy group; $R^5$ and $R^6$ optionally form a ring together with the carbon atom to which they are bonded; the ring A and the ring B each denote a benzene ring, a naphthalene ring or an anthracene ring; and n1, n2 and n3 are each an integer of 0 up to the maximum number of groups that can be substituted on the ring.

Preferably, both ring A and ring B are benzene rings, n1, n2 and n3 are 0, and $R^4$ is a hydrogen atom.

Preferably, $R^5$ is a hydrogen atom or a phenyl, naphthyl, anthryl or pyrenyl group optionally substituted with a halogen group, a nitro group, an amino group, a formyl group, a carboxyl group, a carboxylic acid alkyl ester group, a phenyl group, a $C_1$-$C_{10}$ alkoxy group or a hydroxy group, and $R^6$ is a hydrogen atom.

Exemplary crosslinkable film materials (h) are polymers disclosed in WO 2014/129582 A1, which include one, or two or more repeating structural units represented by the following formulas (1a), (1b) and (1c):

[Chem. 38]

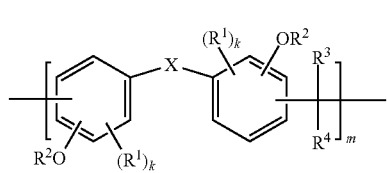

(1a)

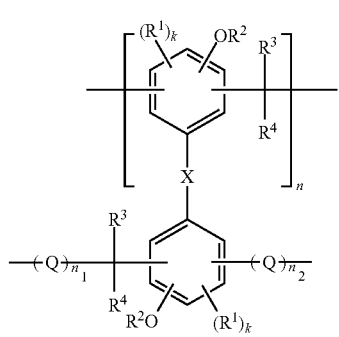

(1b)

(1c)

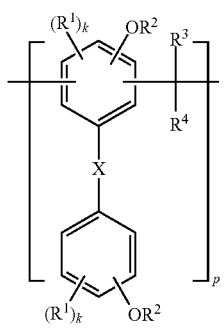

wherein $R^1$ at two occurrences each independently denotes a $C_1$-$C_{10}$ alkyl group, a $C_2$-$C_6$ alkenyl group, an aromatic hydrocarbon group, a halogen atom, a nitro group or an amino group; $R^2$ at two occurrences each independently denotes a hydrogen atom, a $C_1$-$C_{10}$ alkyl group, a $C_2$-$C_6$ alkenyl group, an acetal group, an acyl group or a glycidyl group; $R^3$ denotes an optionally substituted aromatic hydrocarbon group; $R^4$ denotes a hydrogen atom, a phenyl group or a naphthyl group; when $R^3$ and $R^4$ bonded to the same single carbon atom each denote a phenyl group, the phenyl groups are optionally bonded to each other to form a fluorene ring; in formula (1b), the two groups indicated by $R^3$ are optionally different from one another, and the two atoms or groups indicated by $R^4$ are optionally different from one another; k at two occurrences each independently indicates 0 or 1; m indicates an integer of 3 to 500; n, $n_1$ and $n_2$ each indicate an integer of 2 to 500; p indicates an integer of 3 to 500; X denotes a single bond or a heteroatom; and Q at two occurrences each independently denotes a structural unit represented by the following formula (2):

[Chem. 39]

(2)

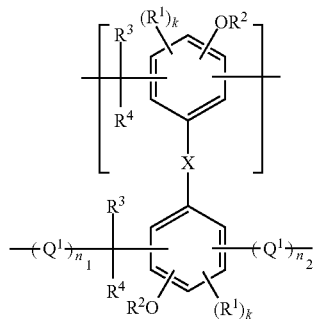

wherein $R^1$ at two occurrences, $R^2$ at two occurrences, $R^3$ at two occurrences, $R^4$ at two occurrences, k at two occurrences, $n_1$, $n_2$ and X are the same as defined in formula (1b); and $Q^1$ at two occurrences each independently denotes a structural unit represented by formula (2).

Preferably, the aromatic hydrocarbon group denoted by $R^3$ is a phenyl group, a naphthyl group, an anthryl group or a pyrenyl group.

Exemplary crosslinkable film materials (i) are polymers disclosed in WO 2016/072316 A1, which include a unit structure represented by the following formula (1):

[Chem. 40]

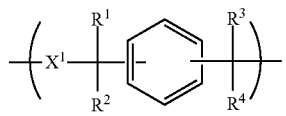

Formula (1)

wherein $R^1$ to $R^4$ each independently denote a hydrogen atom or a methyl group; and $X^1$ denotes a divalent organic group comprising at least one arylene group optionally substituted with an alkyl group, an amino group or a hydroxy group.

In formula (1), preferably, the arylene group in the definition of $X^1$ is a phenylene group, a biphenylene group, a terphenylene group, a fluorenylene group, a naphthylene group, an anthrylene group, a pyrenylene group or a carbazolylene group.

In formula (1), $X^1$ is preferably an organic group represented by formula (2):

[Chem. 41]

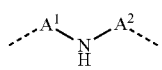

Formula (2)

wherein the dotted lines indicate bonds; $A^1$ denotes a phenylene group or a naphthylene group; and $A^2$ denotes a phenylene group, a naphthylene group or an organic group represented by formula (3):

[Chem. 42]

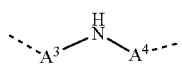

Formula (3)

wherein $A^3$ and $A^4$ each independently denote a phenylene group or a naphthylene group; and the dotted lines indicate bonds.

Exemplary crosslinkable film materials (j) are novolak resins disclosed in WO 2017/069063 A1, which are obtained by the reaction of an aromatic compound (A) and an aldehyde (B), in which the formyl group is bonded to a secondary carbon atom or a tertiary carbon atom in a $C_2$-$C_{26}$ alkyl group.

A preferred novolak resin is one that includes a unit structure represented by the following formula (1):

[Chem. 43]

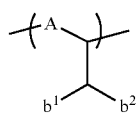

Formula (1)

wherein A denotes a divalent group derived from a $C_6$-$C_{40}$ aromatic compound, $b^1$ denotes a $C_1$-$C_{16}$ alkyl group and $b^2$ denotes a hydrogen atom or a $C_1$-$C_9$ alkyl group.

Preferably, A is a divalent group derived from an aromatic compound containing an amino group, a hydroxy group or both.

Preferably, A is a divalent group derived from an aromatic compound comprising an arylamine compound, a phenol compound or both.

Preferably, A is a divalent group derived from aniline, diphenylamine, phenylnaphthylamine, hydroxydiphenylamine, carbazole, phenol, N,N'-diphenylethylenediamine, N,N'-diphenyl-1,4-phenylenediamine or a polynuclear phenol.

Preferably, the polynuclear phenol is dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 2,2'-biphenol or 1,1,2,2-tetrakis(4-hydroxyphenyl)ethane.

A preferred novolak resin is one that includes a unit structure represented by the following formula (2):

[Chem. 44]

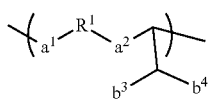

Formula (2)

wherein $a^1$ and $a^2$ each denote an optionally substituted benzene or naphthalene ring, $R^1$ denotes a secondary amino or tertiary amino group, an optionally substituted $C_1$-$C_{10}$ divalent hydrocarbon group, an arylene group or a divalent group formed by bonding of any of the groups mentioned above, $b^3$ denotes a $C_1$-$C_{16}$ alkyl group, and $b^4$ denotes a hydrogen atom or a $C_1$-$C_9$ alkyl group.

Exemplary crosslinkable film materials (k) are polymers disclosed in WO 2017/199768 A1, which include a repeating structural unit represented by formula (1a) and/or a repeating structural unit represented by formula (1b) below:

[Chem. 45]

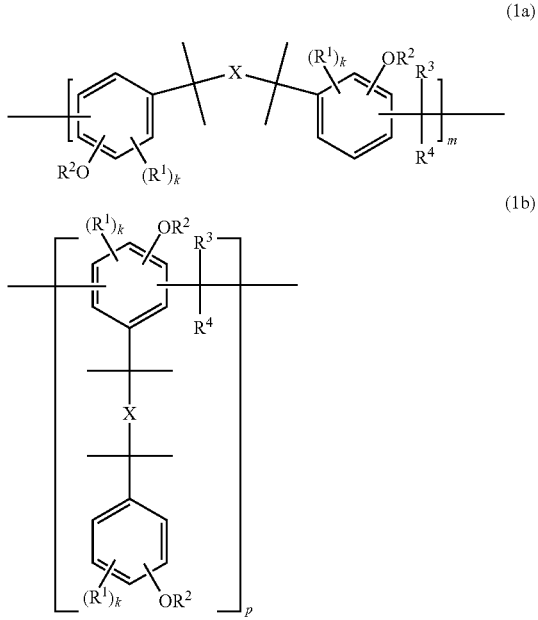

wherein $R^1$ at two occurrences each independently denotes a $C_1$-$C_{10}$ alkyl group, a $C_2$-$C_6$ alkenyl group, an aromatic hydrocarbon group, a halogen atom, a nitro group or an amino group; $R^2$ at two occurrences each independently denotes a hydrogen atom, a $C_1$-$C_{10}$ alkyl group, a $C_2$-$C_6$ alkenyl group, an acetal group, an acyl group or a glycidyl group; $R^3$ denotes an optionally substituted, aromatic hydrocarbon or heterocyclic group; $R^4$ denotes a hydrogen atom, a phenyl group or a naphthyl group; when $R^3$ and $R^4$ bonded to the same single carbon atom each denote a phenyl group, the phenyl groups are optionally bonded to each other to form a fluorene ring; k at two occurrences each independently indicates 0 or 1; m indicates an integer of 3 to 500; p indicates an integer of 3 to 500; X denotes a benzene ring; and the two —$C(CH_3)_2$— groups bonded to the benzene ring are in meta-positions or para-positions relative to each other.

A preferred polymer is a polymerization reaction product of at least one bisphenol compound and at least one aromatic aldehyde or aromatic ketone.

Preferably, the aromatic hydrocarbon group denoted by $R^3$ is a phenyl group, a naphthyl group, an anthryl group or a pyrenyl group.

Exemplary crosslinkable film materials (1) are poly(epoxide) resins disclosed in JP H11-511194 A, which have an epoxy functional value of more than 2.0 and less than 10.

A preferred poly(epoxide) resin is one selected from the group consisting of bisphenol A-epichlorohydrin resin products, epoxy novolaks, o-cresol epoxy novolaks, polyglycidyl ethers, polyglycidyl amines, alicyclic epoxides and polyglycidyl esters.

Preferably, the poly(epoxide) resins have an epoxy functional value of more than 3.5.

Exemplary crosslinkable film materials or novolak film materials (m) are compounds and novolak film materials disclosed in WO 2018/198960 A1, which are represented by the following formula (1):

[Chem. 46]

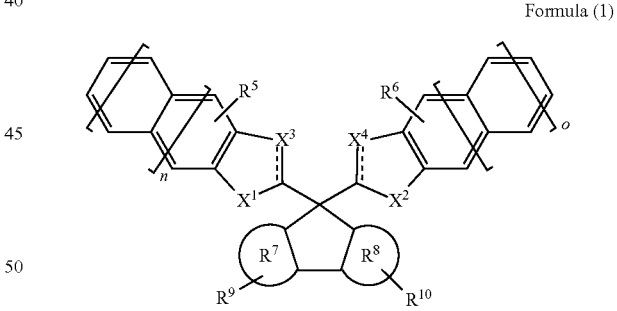

Formula (1)

wherein

[Chem. 47] -----
denotes a single bond or a double bond,
$X^1$ denotes —$N(R^1)$— or —$CH(R^1)$—,
$X^2$ denotes —$N(R^2)$— or —$CH(R^2)$—,
$X^3$ denotes —$N=$, —$CH=$, —$N(R^3)$— or —$CH(R^3)$—,
$X^4$ denotes —$N=$, —$CH=$, —$N(R^4)$— or —$CH(R^4)$—,
$R^1$, $R^2$, $R^3$ and $R^4$ are the same as or different from one another and each denote a hydrogen atom, a linear, branched or cyclic $C_1$-$C_{20}$ alkyl group, a $C_6$-$C_{20}$ aryl group, a $C_2$-$C_{10}$ alkenyl group, a $C_2$-$C_{10}$ alkynyl group, a carboxyl group or a cyano group, the alkyl group and the aryl group being optionally substituted with a $C_1$-$C_6$ acyl group, a $C_1$-$C_6$ alkoxy group, a $C_1$-$C_6$ alkoxycarbonyl group, an amino group, a glycidyl group or a hydroxy group and being optionally interrupted with an oxygen atom or a sulfur atom, $R^5$, $R^6$, $R^9$ and $R^{10}$ are the same as or different from one another and each denote a hydrogen atom, a hydroxy group, a $C_1$-$C_6$ acyl group, a $C_1$-$C_6$ alkoxy group, a $C_1$-$C_6$ alkoxycarbonyl group, a linear, branched or cyclic $C_1$-$C_{10}$ alkyl group, a $C_6$-$C_{20}$ aryl group, a $C_2$-$C_{20}$ alkenyl group or a $C_2$-$C_{10}$ alkynyl group, the acyl group, the alkoxy group, the alkoxycarbonyl group, the alkyl group, the aryl group, the alkenyl group and the alkynyl group optionally having one or more groups selected from the group consisting of amino groups, nitro groups, cyano groups, hydroxy groups, glycidyl groups and carboxyl groups, $R^7$ and $R^8$ are the same as or different from one another and each denote a benzene ring or a naphthalene ring, and n and o are 0 or 1.

Preferably, $R^1$, $R^2$, $R^3$ or $R^4$ in formula (1) is a hydroxy group or a linear, branched or cyclic $C_1$-$C_{20}$ alkyl group optionally substituted with a hydroxy group and optionally interrupted with an oxygen atom or a sulfur atom.

A preferred compound is one that includes one or more units of one or more kinds of repeating units a, b, c, d, e, f, g, h and i represented by the following formulas (2):

[Chem. 48-1]

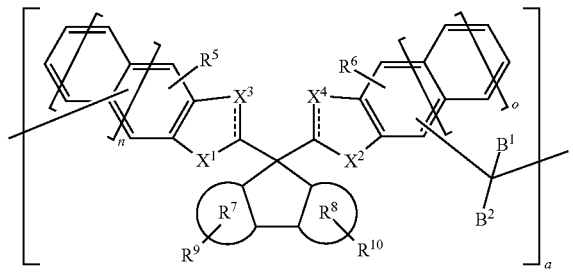

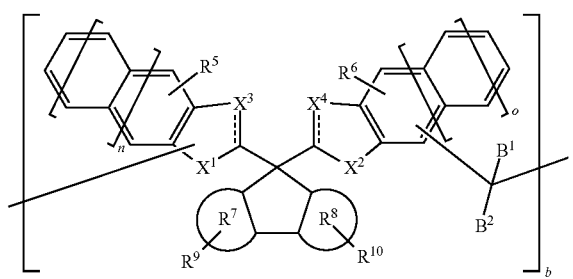

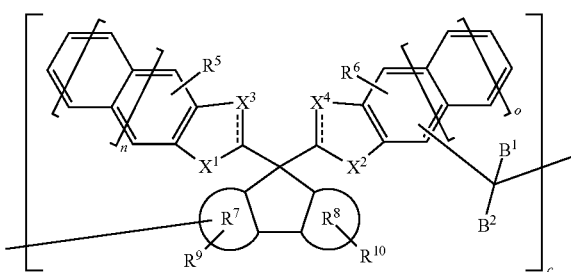

[Chem. 48-2]

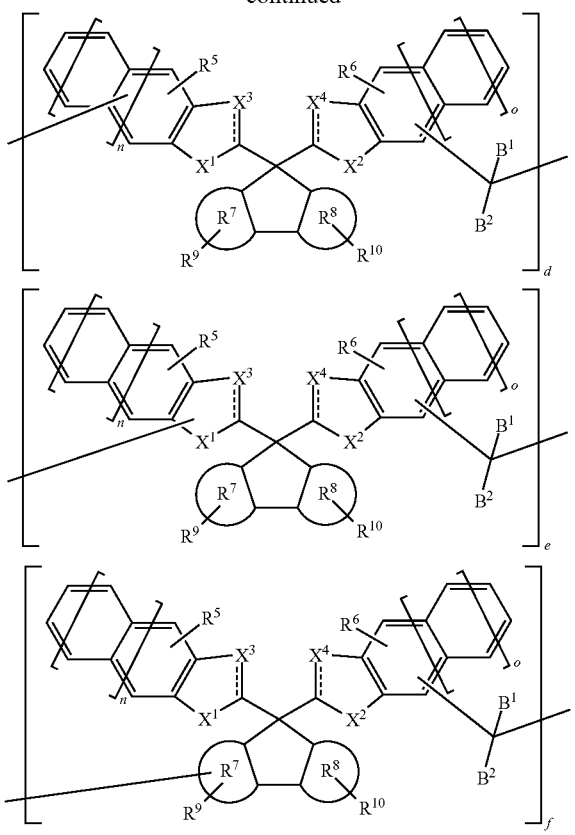

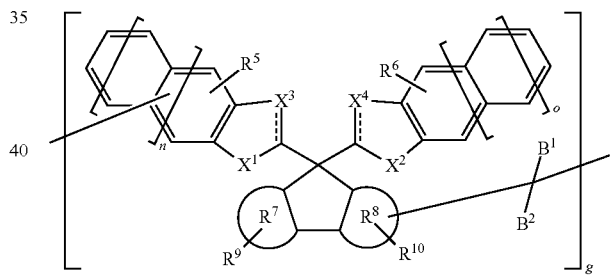

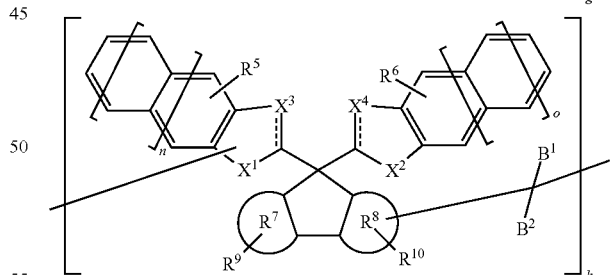

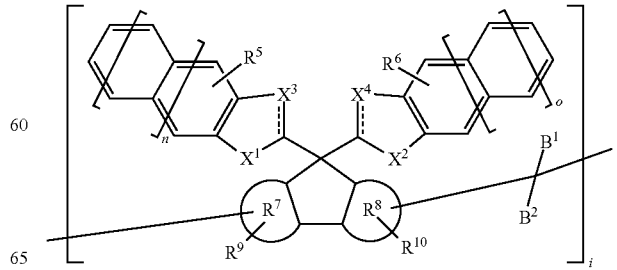

Formulas (2)

In formulas (2),

[Chem. 49] ≡≡≡
  denotes a single bond or a double bond,
  $X^1$ denotes —N($R^1$)—, —CH($R^1$)—, —N< or —CH<,
  $X^2$ denotes —N($R^2$)—, —CH($R^2$)—, —N< or —CH<,
  $X^3$ denotes —N=, —CH=, —N($R^3$)—, —CH($R^3$)—, —N< or —CH<,
  $X^4$ denotes —N=, —CH=, —N($R^4$)—, —CH($R^4$)—, —N< or —CH<,
  $R^1$, $R^2$, $R^3$ and $R^4$ are the same as or different from one another and each denote a hydrogen atom, a linear, branched or cyclic $C_1$-$C_{20}$ alkyl group, a $C_6$-$C_{20}$ aryl group, a $C_2$-$C_{10}$ alkenyl group, a $C_2$-$C_{10}$ alkynyl group, a carboxyl group or a cyano group, the alkyl group and the aryl group being optionally substituted with a $C_1$-$C_6$ acyl group, a $C_1$-$C_6$ alkoxy group, a $C_1$-$C_6$ alkoxycarbonyl group, an amino group, a glycidyl group or a hydroxy group and being optionally interrupted with an oxygen atom or a sulfur atom,
  $R^5$, $R^6$, $R^9$ and $R^{10}$ are the same as or different from one another and each denote a hydrogen atom, a hydroxy group, a $C_1$-$C_6$ acyl group, a $C_1$-$C_6$ alkoxy group, a $C_1$-$C_6$ alkoxycarbonyl group, a linear, branched or cyclic $C_1$-$C_{10}$ alkyl group, a $C_6$-$C_{20}$ aryl group, a $C_2$-$C_{20}$ alkenyl group or a $C_2$-$C_{10}$ alkynyl group, the acyl group, the alkoxy group, the alkoxycarbonyl group, the alkyl group, the aryl group, the alkenyl group and the alkynyl group optionally having one or more groups selected from the group consisting of amino groups, nitro groups, cyano groups, hydroxy groups, glycidyl groups and carboxyl groups,
  $R^7$ and $R^8$ are the same as or different from one another and each denote a benzene ring or a naphthalene ring,
  n and o are 0 or 1, and
  $B^1$ and $B^2$ are the same as or different from one another and each denote a hydrogen atom, a linear, branched or cyclic $C_1$-$C_{20}$ alkyl group optionally interrupted with an oxygen atom or a sulfur atom, or a group derived from an aromatic compound that is selected from the group consisting of $C_6$-$C_{40}$ aryl groups and $C_6$-$C_{40}$ heterocyclic groups; $B^1$ and $B^2$ optionally form a ring together with the carbon atom to which they are bonded; and the group derived from an aromatic compound is optionally substituted with a $C_1$-$C_{20}$ alkyl group, a phenyl group, a fused ring group, a heterocyclic group, a hydroxy group, an amino group, an ether group, an alkoxy group, a cyano group, a nitro group or a carboxyl group in place of a hydrogen atom.

A preferred compound is one that includes one or more units of one or more kinds of repeating units j, k, l, m, r, s, t, u, v and w represented by the following formulas (3):

[Chem. 50-1]

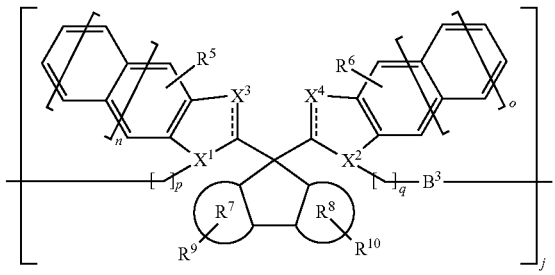

[Chem. 50-2]

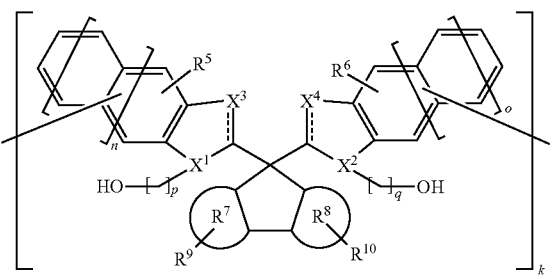

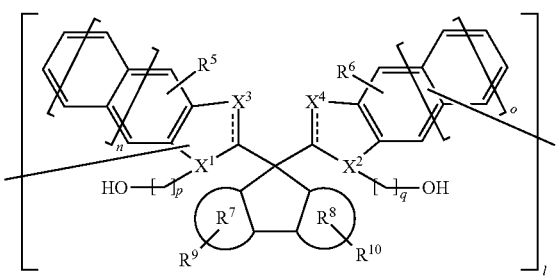

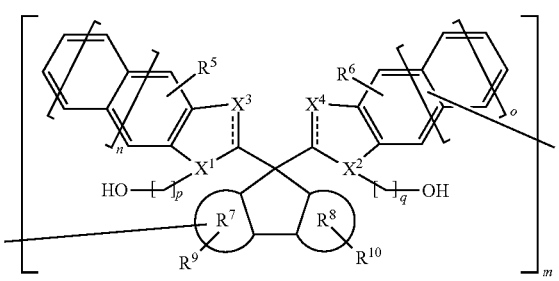

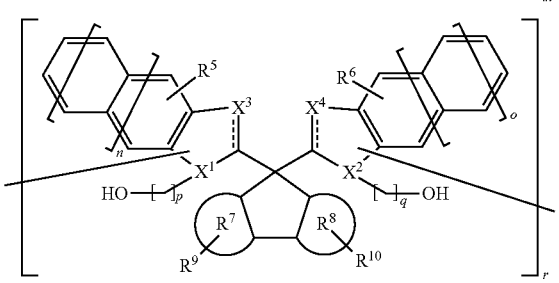

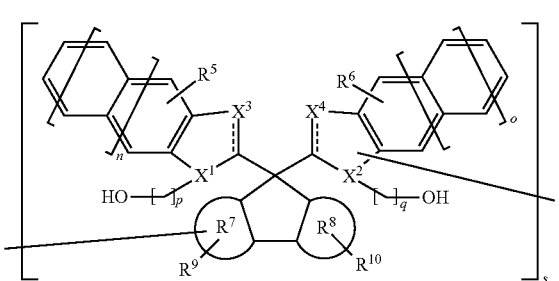

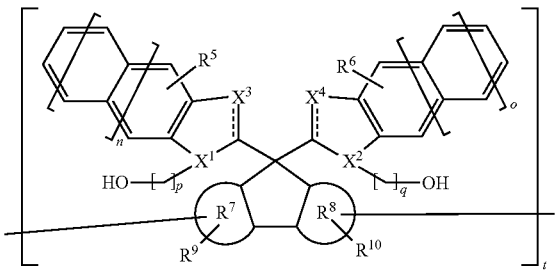

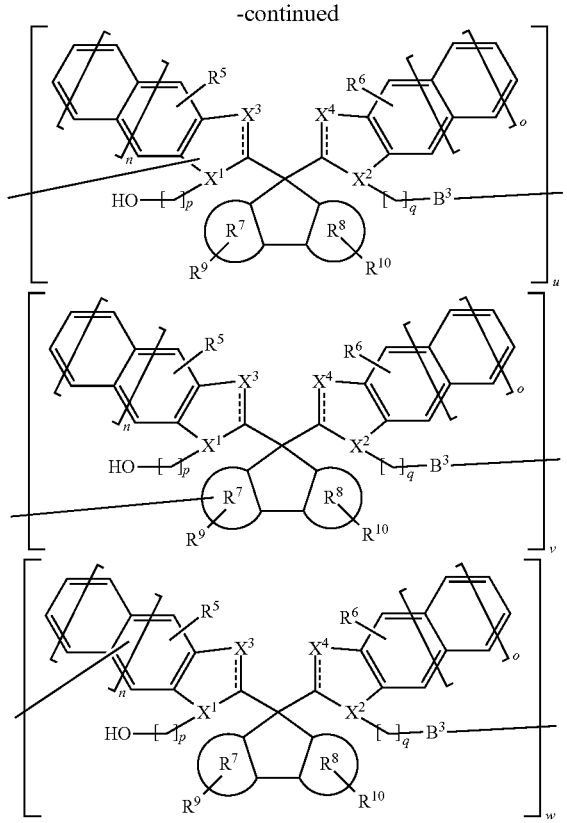

Formulas (3)

In formulas (3),

[Chem. 51] ≕ denotes a single bond or a double bond, $X^1$ denotes —N< or —CH<, $X^2$ denotes —N< or —CH<, $X^3$ denotes —N=, —CH=, —N($R^3$)— or —CH($R^3$)—, $X^4$ denotes —N=, —CH=, —N($R^4$)— or —CH($R^4$)—, $R^3$ and $R^4$ are the same as or different from one another and each denote a hydrogen atom, a linear, branched or cyclic $C_1$-$C_{20}$ alkyl group, a $C_6$-$C_{20}$ aryl group, a $C_2$-$C_{10}$ alkenyl group, a $C_2$-$C_{10}$ alkynyl group, a carboxyl group or a cyano group, the alkyl group and the aryl group being optionally substituted with a $C_1$-$C_6$ acyl group, a $C_1$-$C_6$ alkoxy group, a $C_1$-$C_6$ alkoxycarbonyl group, an amino group, a glycidyl group or a hydroxy group and being optionally interrupted with an oxygen atom or a sulfur atom, $R^5$, $R^6$, $R^9$ and $R^{10}$ are the same as or different from one another and each denote a hydrogen atom, a hydroxy group, a $C_1$-$C_6$ acyl group, a $C_1$-$C_6$ alkoxy group, a $C_1$-$C_6$ alkoxycarbonyl group, a linear, branched or cyclic $C_1$-$C_{10}$ alkyl group, a $C_6$-$C_{20}$ aryl group, a $C_2$-$C_{20}$ alkenyl group or a $C_2$-$C_{10}$ alkynyl group, the acyl group, the alkoxy group, the alkoxycarbonyl group, the alkyl group, the aryl group, the alkenyl group and the alkynyl group optionally having one or more groups selected from the group consisting of amino groups, nitro groups, cyano groups, hydroxy groups, glycidyl groups and carboxyl groups, $R^7$ and $R^8$ are the same as or different from one another and each denote a benzene ring or a naphthalene ring, n and o are 0 or 1, p and q are each an integer of 0 to 20, when p and q are 2 or greater, p quantity of methylene groups, and q quantity of methylene groups are optionally interrupted with an oxygen atom or a sulfur atom, and $B^3$ denotes a direct bond or a group derived from a $C_6$-$C_{40}$ aromatic compound that is optionally substituted with a $C_1$-$C_{20}$ alkyl group, a phenyl group, a fused ring group, a heterocyclic group, a hydroxy group, an amino group, an ether group, an alkoxy group, a cyano group, a nitro group or a carboxyl group.

Preferably, $R^1$, $R^2$, $R^3$ or $R^4$ in formula (1) is a hydroxy group or a linear, branched or cyclic $C_1$-$C_{20}$ alkyl group optionally substituted with a hydroxy group and optionally interrupted with an oxygen atom or a sulfur atom.

Exemplary crosslinkable film materials (n) are epoxy adducts disclosed in WO 2017/002653 A1, which are formed by the reaction of an epoxy group-containing compound having at least two epoxy groups with an epoxy adduct-forming compound having one epoxy addition reactive group.

Examples of the epoxy adducts include those illustrated below:

[Chem. 52]

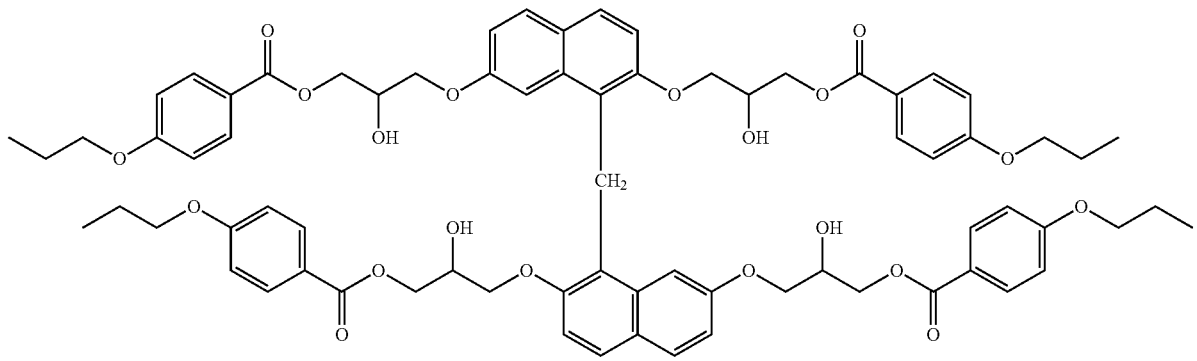

Formula (3-1)

Formula (3-2)
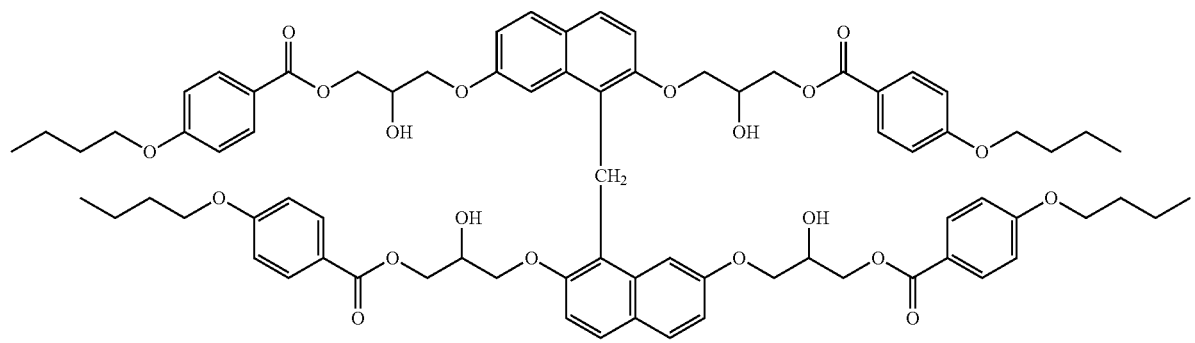
Formula (3-3)
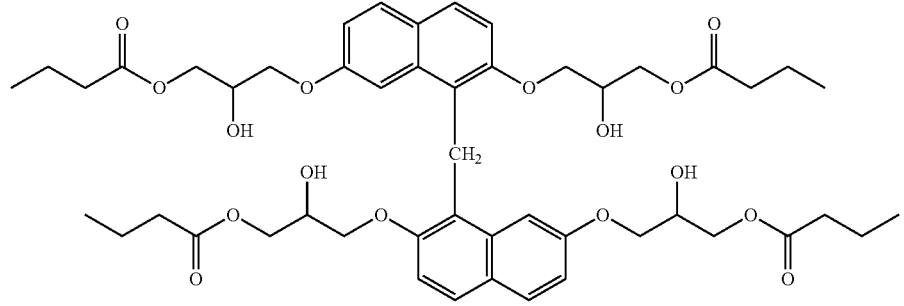
[Chem. 53]
Formula (3-4)
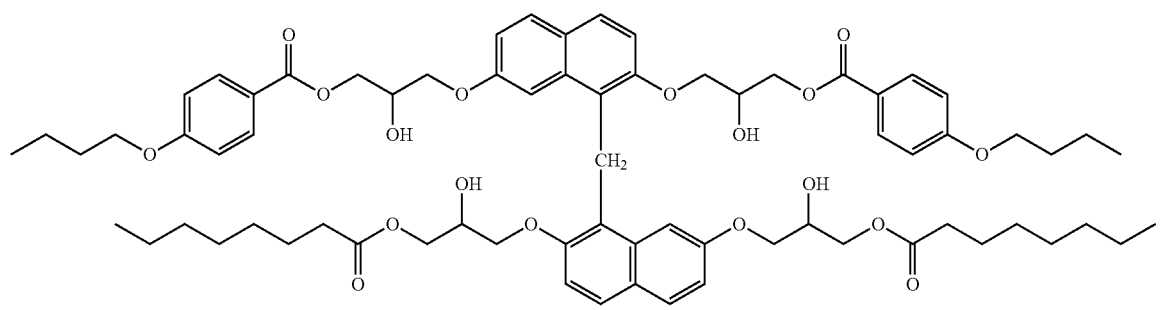
Formula (3-5)
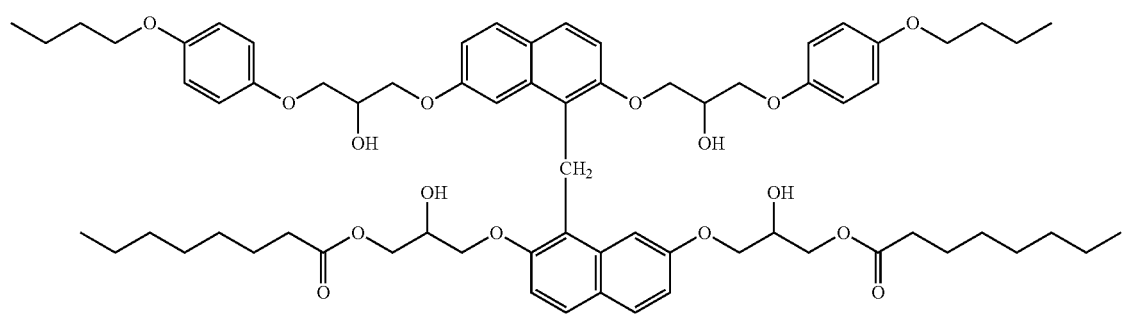

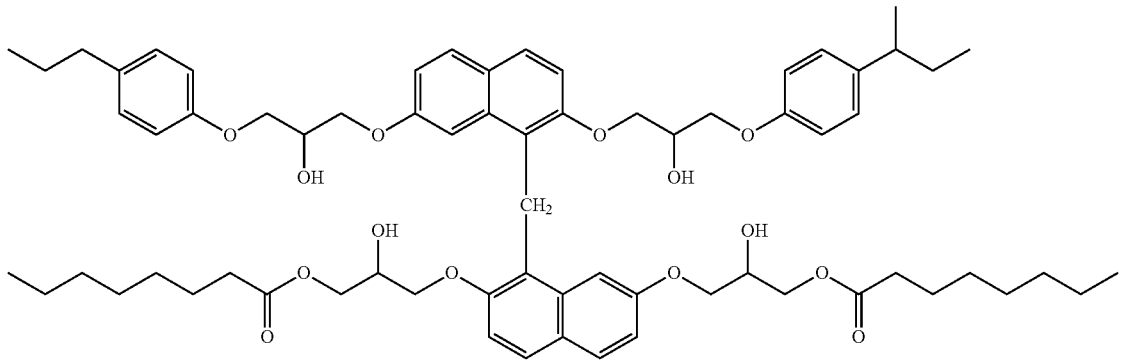
Formula (3-6)
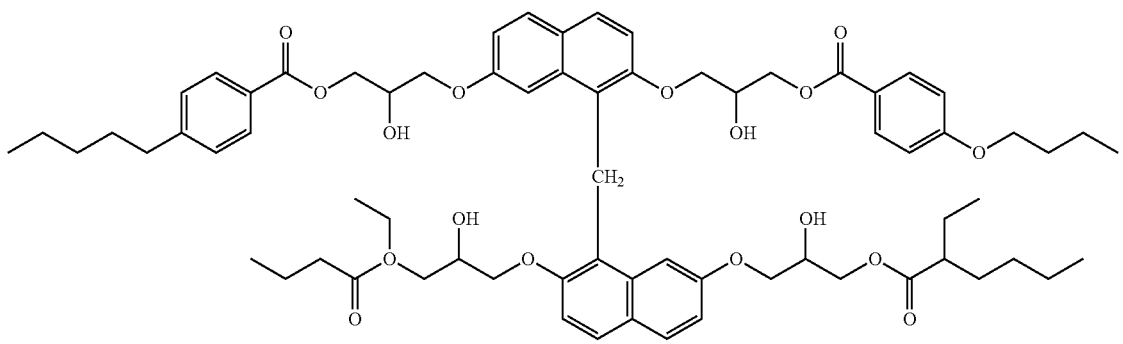
Formula (3-7)
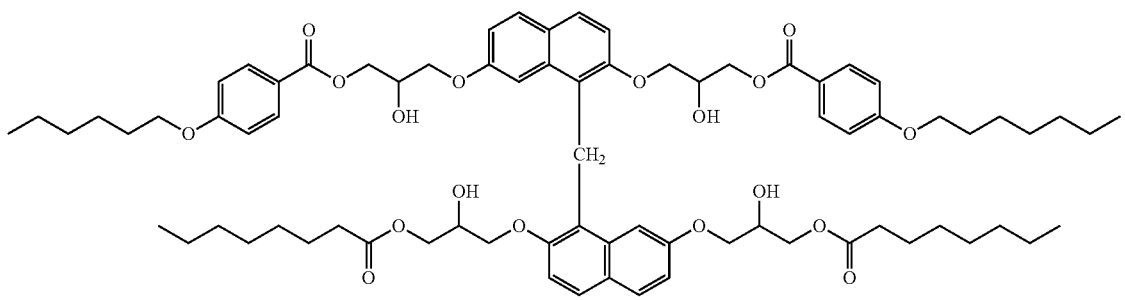
Formula (3-8)
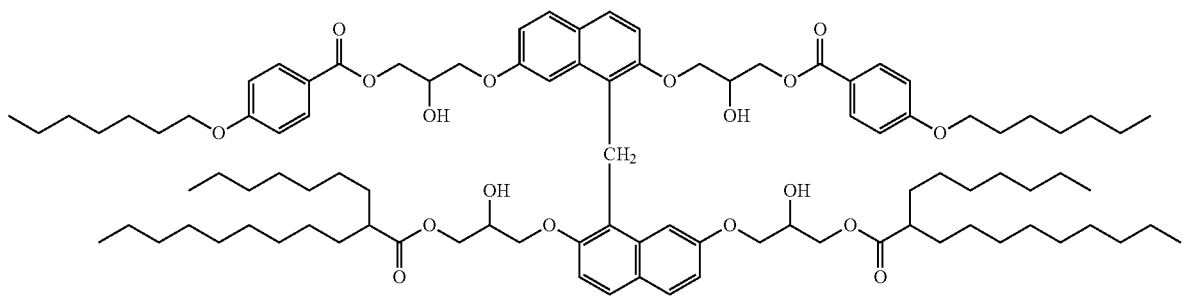
Formula (3-9)

-continued
[Chem. 55]
Formula (3-10)
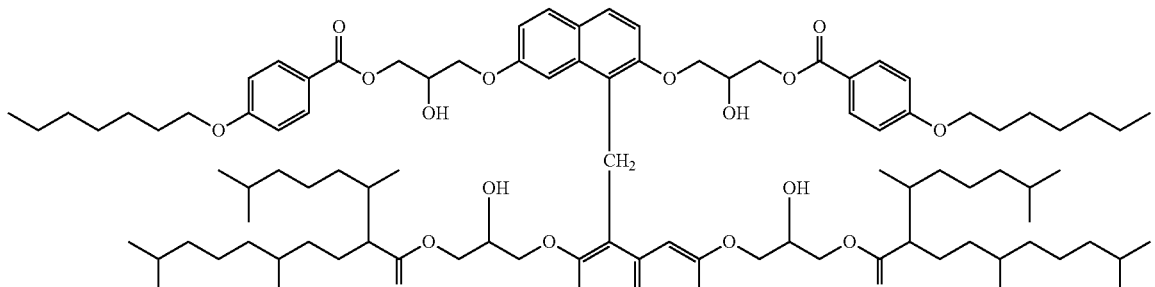
Formula (3-11)
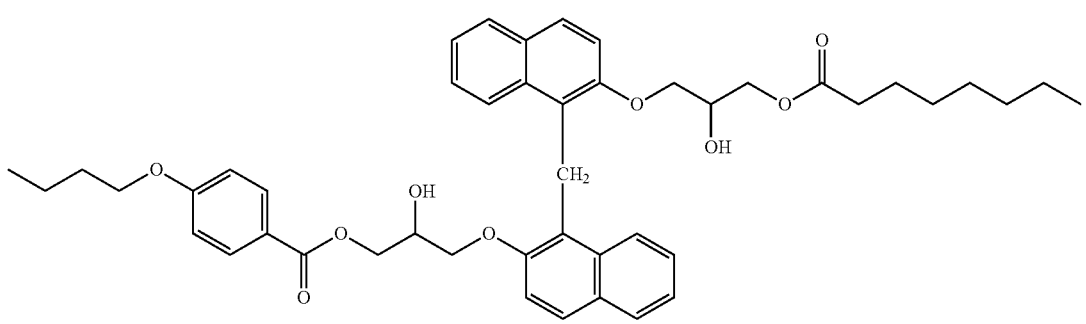
Formula (3-12)
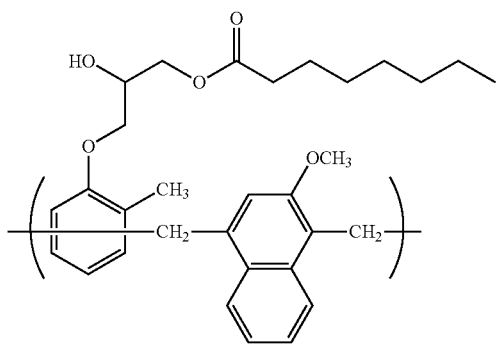
Formula (3-13)
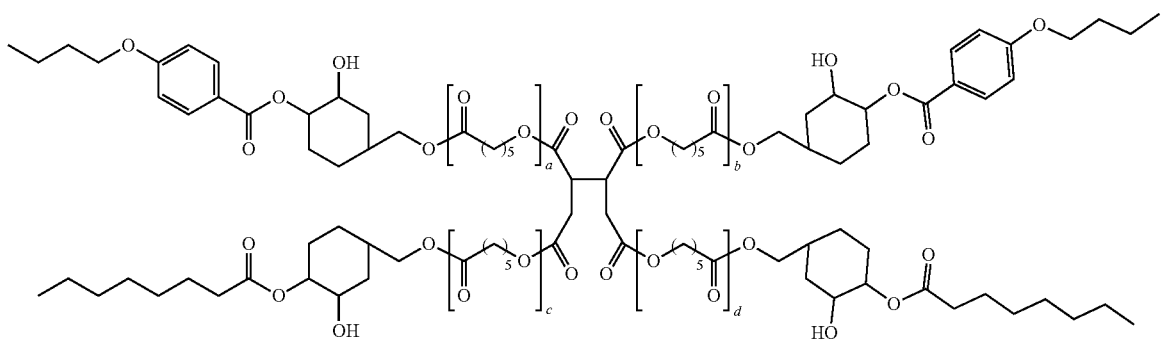

In the formulas, a, b, c and d are each 0 or 1, and a+b+c+d=1.

Exemplary crosslinkable film materials (o) are polymers disclosed in WO 2005/098542 A1, which have a structure represented by formula (1):

[Chem. 56]

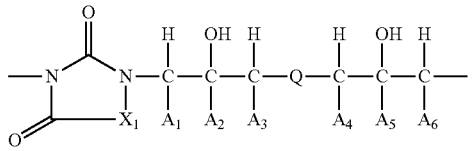
(1)

wherein $A_1$, $A_2$, $A_3$, $A_4$, $A_5$ and $A_6$ each denote a hydrogen atom, a methyl group or an ethyl group; $X_1$ is represented by formula (2), formula (3), formula (4) or formula (5):

[Chem. 57]

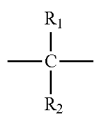
(2)

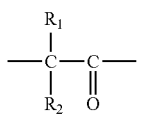
(3)

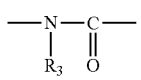
(4)

(5)

wherein $R_1$ and $R_2$ each denote a hydrogen atom, a $C_1$-$C_6$ alkyl group, a $C_3$-$C_6$ alkenyl group, a benzyl group or a phenyl group, the phenyl group being optionally substituted with a group selected from the group consisting of $C_1$-$C_6$ alkyl groups, halogen atoms, $C_1$-$C_6$ alkoxy groups, nitro groups, cyano groups, hydroxy groups and $C_1$-$C_6$ alkylthio groups, $R_1$ and $R_2$ being optionally bonded to each other to form a $C_3$-$C_6$ ring, and $R_3$ denotes a $C_1$-$C_6$ alkyl group, a $C_3$-$C_6$ alkenyl group, a benzyl group or a phenyl group, the phenyl group being optionally substituted with a group selected from the group consisting of $C_1$-$C_6$ alkyl groups, halogen atoms, $C_1$-$C_6$ alkoxy groups, nitro groups, cyano groups, hydroxy groups and $C_1$-$C_6$ alkylthio groups; and Q is represented by formula (6) or formula (7):

[Chem. 58]

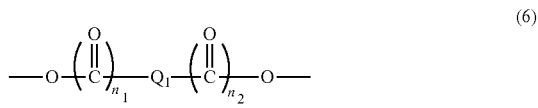
(6)

(7)

wherein $Q_1$ denotes a $C_1$-$C_{10}$ alkylene group, a phenylene group, a naphthylene group or an anthrylene group, the phenylene group, the naphthylene group and the anthrylene group being optionally substituted with a group selected from the group consisting of $C_1$-$C_6$ alkyl groups, halogen atoms, $C_1$-$C_6$ alkoxy groups, nitro groups, cyano groups, hydroxy groups and $C_1$-$C_6$ alkylthio groups, $n_1$ and $n_2$ each indicate a number of 0 or 1, and $X_2$ is represented by formula (2), formula (3) or formula (5).

Preferably, the structure represented by formula (1) is a structure represented by formula (12):

[Chem. 59]

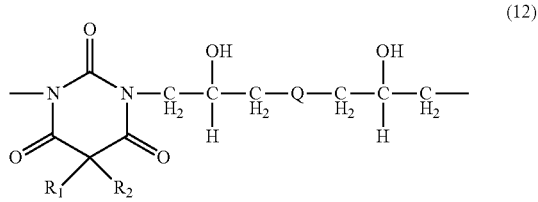
(12)

wherein $R_1$, $R_2$ and Q are the same as defined hereinabove, or a structure represented by formula (13):

[Chem. 60]

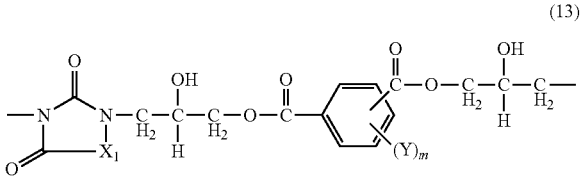
(13)

wherein $X_1$ is the same as defined hereinabove, Y denotes a $C_1$-$C_6$ alkyl group, a halogen atom, a $C_1$-$C_6$ alkoxy group, a nitro group, a cyano group, a hydroxy group or a $C_1$-$C_6$ alkylthio group, m indicates an integer of 0 to 4, and when m is 2 to 4, the plurality of Y may be the same as or different from one another.

Exemplary crosslinkable film materials (p) are polymers disclosed in WO 2006/115074 A1, which include a repeating unit structure represented by formula (1) or formula (2):

[Chem. 61]

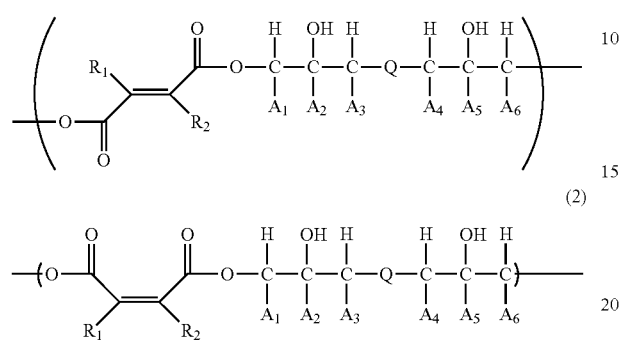

wherein $R_1$ and $R_2$ each denote a hydrogen atom, a methyl group, an ethyl group or a halogen atom, $A_1, A_2, A_3, A_4, A_5$ and $A_6$ each denote a hydrogen atom, a methyl group or an ethyl group; and Q is represented by formula (3) or formula (4):

[Chem. 62]

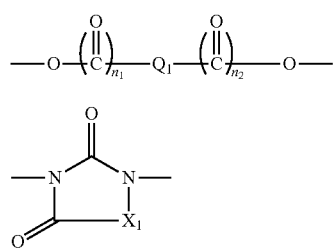

wherein $Q_1$ denotes a $C_1$-$C_{15}$ alkylene group, a phenylene group, a naphthylene group or an anthrylene group, the phenylene group, the naphthylene group and the anthrylene group being optionally substituted with a group selected from the group consisting of $C_1$-$C_6$ alkyl groups, halogen atoms, $C_1$-$C_6$ alkoxy groups, nitro groups, cyano groups, hydroxy groups and $C_1$-$C_6$ alkylthio groups, $n_1$ and $n_2$ each indicate a number of 0 or 1, and $X_1$ is represented by formula (5), (6) or (7):

[Chem. 63]

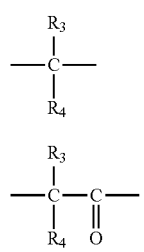

-continued

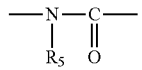

wherein $R_3$ and $R_4$ each denote a hydrogen atom, a $C_1$-$C_6$ alkyl group, a $C_3$-$C_6$ alkenyl group, a benzyl group or a phenyl group, the phenyl group being optionally substituted with a group selected from the group consisting of $C_1$-$C_6$ alkyl groups, halogen atoms, $C_1$-$C_6$ alkoxy groups, nitro groups, cyano groups, hydroxy groups and $C_1$-$C_6$ alkylthio groups, $R_3$ and $R_4$ being optionally bonded to each other to form a $C_3$-$C_6$ ring, and $R_5$ denotes a $C_1$-$C_6$ alkyl group, a $C_3$-$C_6$ alkenyl group, a benzyl group or a phenyl group, the phenyl group being optionally substituted with a group selected from the group consisting of $C_1$-$C_6$ alkyl groups, halogen atoms, $C_1$-$C_6$ alkoxy groups, nitro groups, cyano groups, hydroxy groups and $C_1$-$C_6$ alkylthio groups.

A preferred polymer is one that includes a repeating unit structure represented by formula (12):

[Chem. 64]

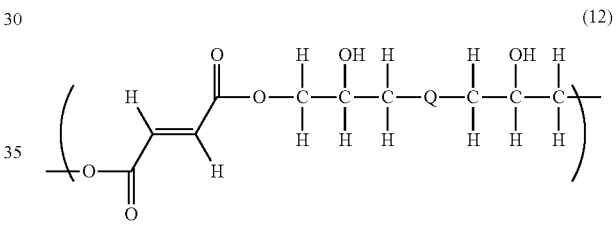

wherein Q is the same as defined hereinabove.

A preferred polymer is one that includes repeating unit structures represented by formula (13) and formula (14):

[Chem. 65]

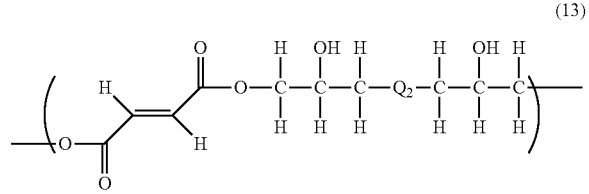

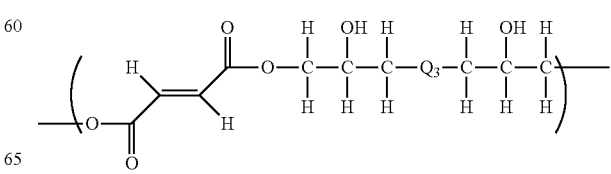

wherein $Q_2$ is represented by formula (15), formula (16) or formula (17):

[Chem. 66]

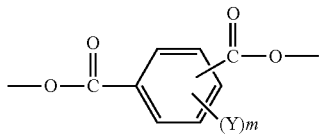
(15)

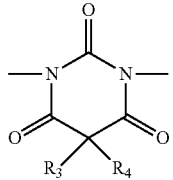
(16)

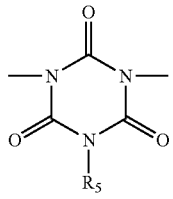
(17)

wherein Y, m, $R_3$, $R_4$ and $R_5$ are the same as defined hereinabove; and $Q_3$ is represented by formula (18):

[Chem. 67]

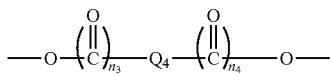
(18)

wherein $Q_4$ denotes a $C_1$-$C_{15}$ alkylene group, and $n_3$ and $n_4$ each indicate a number of 0 or 1.

Exemplary crosslinkable film materials (q) are polymers or combinations of polymers disclosed in WO 2008/069047 A1, in which the polymer includes at least one kind of a unit structure selected from the group consisting of unit structures represented by the following formulas (1), (2) and (3):

[Chem. 68]

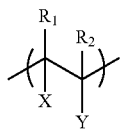
Formula (1)

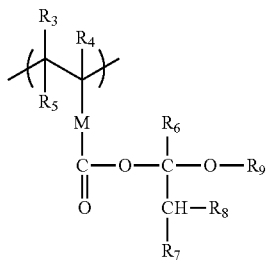
Formula (2)

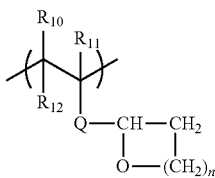
Formula (3)

wherein
X denotes a hydrogen atom or an aromatic fused ring,
Y denotes an aromatic fused ring, and X and Y are optionally bonded to each other to form a fused ring,
$R_1$, $R_2$, $R_3$, $R_4$, $R_5$, $R_{10}$, $R_{11}$ and $R_{12}$ each denote a hydrogen atom, a halogen atom or a $C_1$-$C_3$ alkyl group,
$R_6$, $R_7$ and $R_8$ each denote a hydrogen atom, or a chain or cyclic $C_1$-$C_{10}$ alkyl group,
$R_9$ denotes a chain or cyclic $C_1$-$C_{10}$ alkyl group or a $C_6$-$C_{20}$ aromatic group,
$R_7$ and $R_8$ are optionally bonded to each other to form a ring,
M and Q each denote a direct bond or a linking group, and
n indicates an integer of 0 or 1; and the polymer or combination of polymers satisfies $0.3 \leq a \leq 0.95$, $0.005 \leq b \leq 0.7$, and $0 \leq c \leq 0.45$ wherein a is the proportion of the number of unit structure represented by formula (1), b is the proportion of the number of unit structure represented by formula (2), and c is the proportion of the number of unit structure represented by formula (3), relative to the total number of all the unit structures constituting the polymer or polymers taken as 1.0.

A preferred polymer is one that includes unit structures represented by formulas (1) and (2), and satisfies $0.305 \leq a+b \leq 1$, $0.3 \leq a \leq 0.95$, and $0.005 \leq b \leq 0.7$ wherein a is the proportion of the number of unit structure represented by formula (1) and b is the proportion of the number of unit structure represented by formula (2), relative to the total number of all the unit structures constituting the polymer taken as 1.0.

A preferred polymer is one that includes unit structures represented by formulas (1) and (3), and satisfies $0.35 \leq a+c \leq 1$, $0.3 \leq a \leq 0.95$, and $0.05 \leq c \leq 0.7$ wherein a is the proportion of the number of unit structure represented by formula (1) and c is the proportion of the number of unit structure represented by formula (3), relative to the total number of all the unit structures constituting the polymer taken as 1.0.

A preferred polymer is one that includes unit structures represented by formulas (1), (2) and (3), and satisfies $0.355 \leq a+b+c \leq 1$, $0.3 \leq a \leq 0.9$, $0.005 \leq b \leq 0.65$, and $0.05 \leq c \leq 0.65$ wherein a is the proportion of the number of unit structure represented by formula (1), b is the proportion of the number of unit structure represented by formula (2), and c is the proportion of the number of unit structure represented by formula (3), relative to the total number of all the unit structures constituting the polymer taken as 1.0.

Preferably, the unit structure represented by formula (1) is a unit structure derived from vinylnaphthalene, acenaphthylene, vinylanthracene, vinylcarbazole or a derivative thereof.

Exemplary crosslinkable film materials (r) are compounds disclosed in WO 2018/203464 A1, which are represented by the following formula (2):

[Chem. 69]

Ar-Q-Ar (2)

wherein Ar at two occurrences each denotes an aryl group, the aryl group having at least one hydroxy group as a substituent; and Q denotes a divalent linking group having at least one benzene ring or naphthalene ring, a methylene group or a single bond. The molecular weight of the compounds is, for example, within the range of 150 to 600.

In formula (2), the aryl group represented by Ar may be, for example, a phenyl group, a biphenylyl group, a naphthyl group, an anthryl group or a phenanthryl group. When Q denotes a divalent linking group having at least one benzene ring or naphthalene ring, the divalent linking group may be, for example, a divalent group that is a methylene group substituted with a phenyl group, a biphenylyl group or a naphthyl group in place of at least one of the two hydrogen atoms, a divalent aromatic group selected from the group consisting of a phenylene group, a biphenylylene group and a naphthylene group, or a divalent group having the above divalent aromatic group and a methylene group, an ether group (—O— group) or a sulfide group (—S— group). Examples of such monomers include compounds represented by the following formulas (2-1) to (2-6):

[Chem. 70]

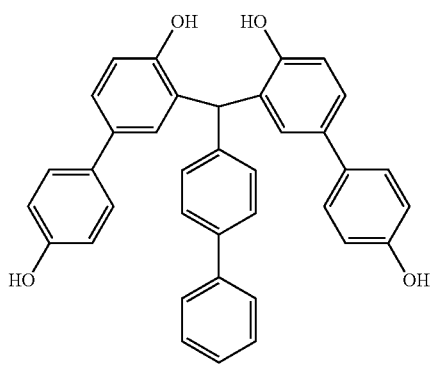

(2-1)

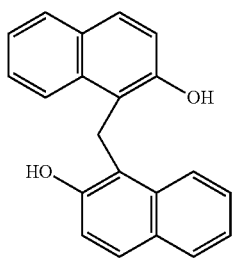

(2-2)

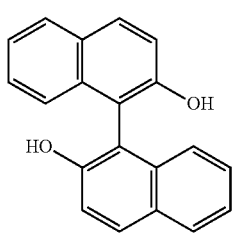

(2-3)

-continued

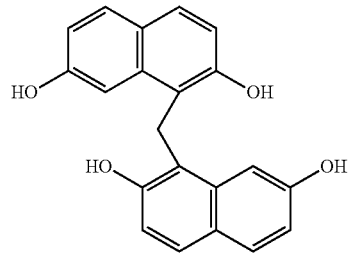

(2-4)

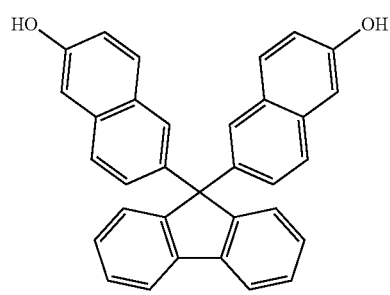

(2-5)

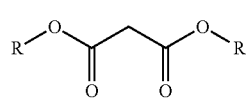

(2-6)

wherein m indicates an integer of 0 to 3.

Exemplary crosslinkable film materials (s) are fullerene derivatives disclosed in WO 2011/108365 A1 and WO 2016/143436 A1, which contain, per molecule of the fullerene, 1 to 6 molecules of a malonic acid diester represented by the following formula (1):

[Chem. 71]

$$\underset{R}{\overset{O}{\diagup}} \underset{O}{\overset{}{\diagdown}} \underset{O}{\overset{}{\diagup}} \underset{R}{\overset{O}{\diagdown}}$$

(1)

wherein R independently at each occurrence denotes a $C_1$-$C_{10}$ alkyl group.

Exemplary crosslinkable film materials (t) are polyfunctional (meth)acrylate compounds disclosed in WO 2011/132640 A1, which have a molecular weight of 300 to 10,000 and are liquid at room temperature and atmospheric pressure.

A preferred compound is one that has 2 to 20 (meth)acrylate groups in the molecule.

Preferably, the molecular weight of the compounds is 300 to 2,300.

Examples of such compounds include the following:
[Chem. 72]
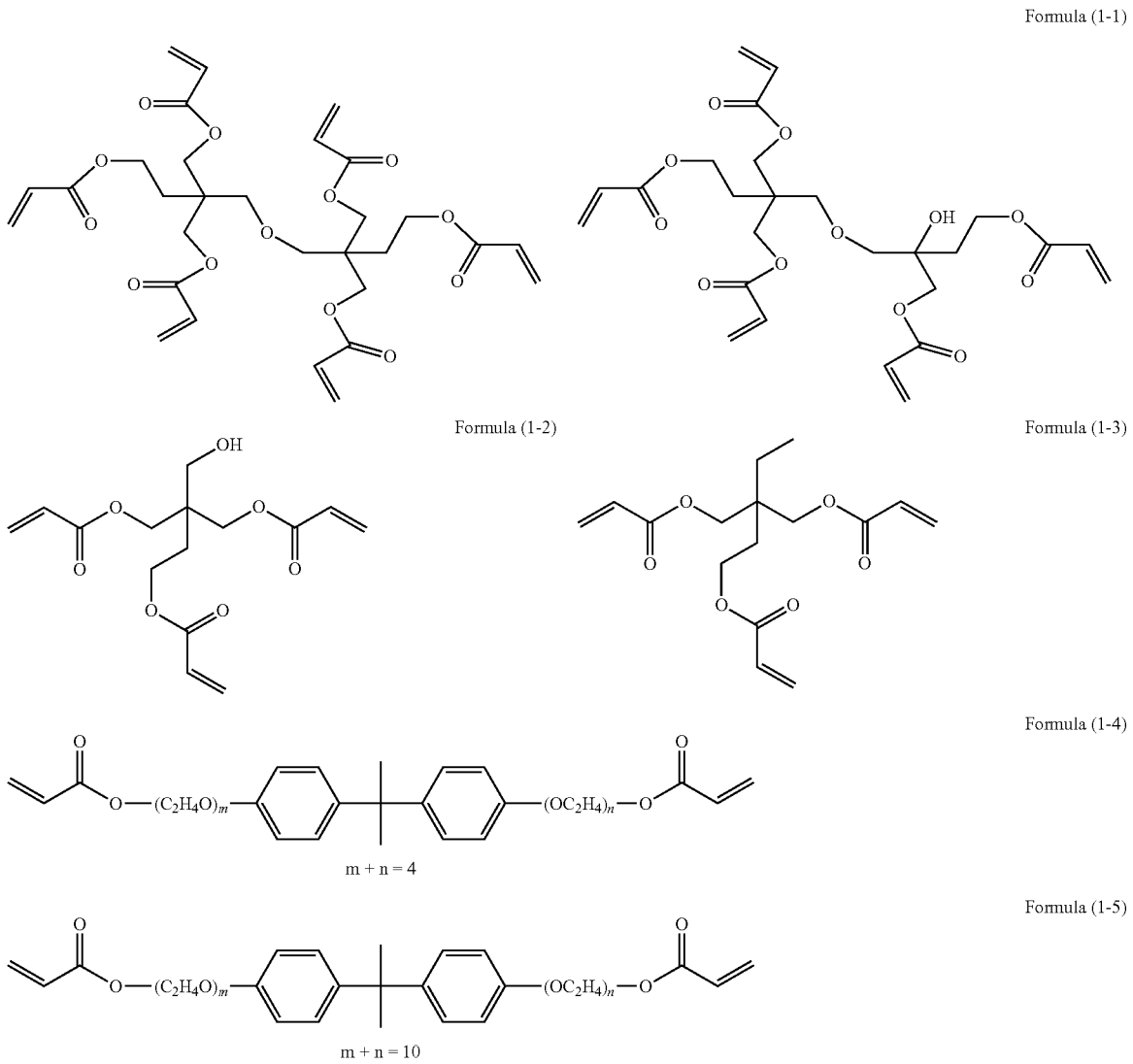
[Chem. 73]
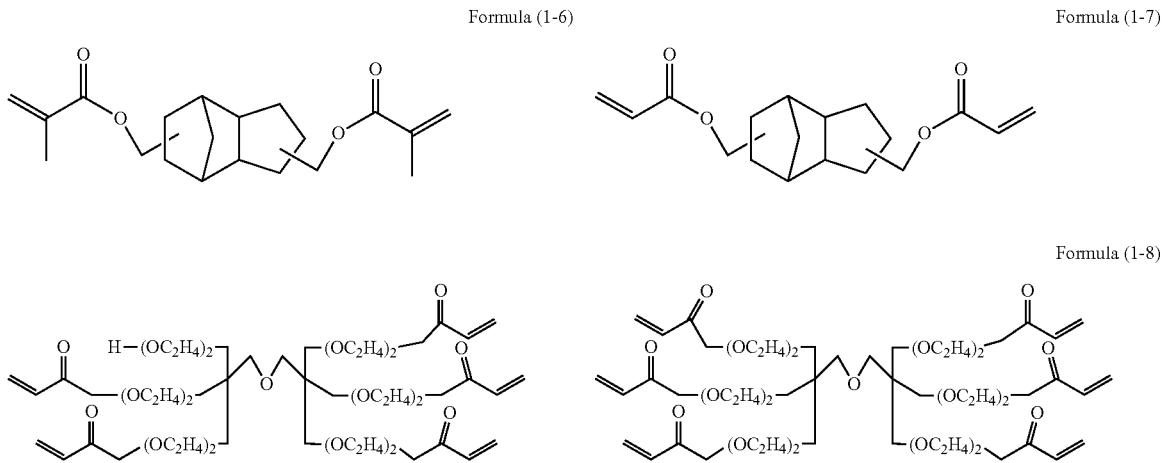

-continued

Formula (1-9)

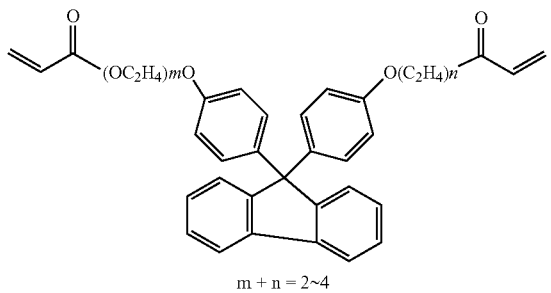

m + n = 2~4

Formula (1-10)

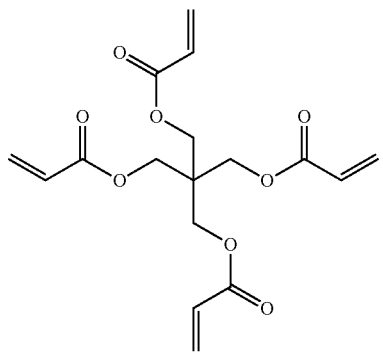

Exemplary crosslinkable film materials (u) are compounds (E) disclosed in WO 2017/154921 A1. The compounds (E) include a partial structure (I) and a partial structure (II). The partial structure (II) includes a hydroxy group resulting from the reaction of an epoxy group with a proton-generating compound. The partial structure (I) is at least one partial structure selected from the group consisting of partial structures represented by formulas (1-1) to (1-5) below, or is a partial structure that is a combination of a partial structure represented by formula (1-6) and a partial structure represented by formula (1-7) or formula (1-8). The partial structure (II) is a partial structure represented by formula (2-1) or formula (2-2) below.

[Chem. 74]

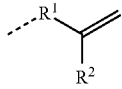

Formula (1-1)

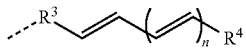

Formula (1-2)

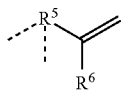

Formula (1-3)

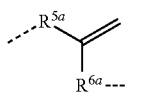

Formula (1-4)

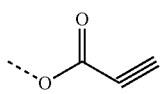

Formula (1-5)

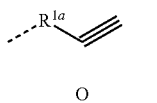

Formula (1-6)

Formula (1-7)

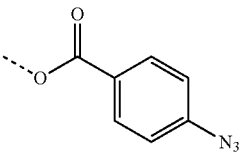

Formula (1-8)

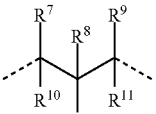

Formula (2-1)

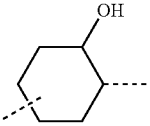

Formula (2-2)

wherein $R^1$, $R^{1a}$, $R^3$, $R^5$, $R^{5a}$ and $R^{6a}$ each denote a $C_1$-$C_{10}$ saturated hydrocarbon group, a $C_6$-$C_{40}$ aromatic hydrocarbon group, an oxygen atom, a carbonyl group, a sulfur atom, a nitrogen atom, an amide group, an amino group, or a combination of any thereof, $R^2$, $R^{2a}$, $R^4$ and $R^6$ each denote a hydrogen atom, a $C_1$-$C_{10}$ saturated hydrocarbon group, a $C_2$-$C_{10}$ unsaturated hydrocarbon group, an oxygen atom, a carbonyl group, an amide group, an amino group, or a combination of any thereof, $R^2$, $R^{2a}$, $R^4$ and $R^6$ each denote a monovalent group, $R^1$, $R^{1a}$, $R^3$, $R^{5a}$ and $R^{6a}$ each denote a divalent group, $R^5$ denotes a trivalent group, $R^7$, $R^8$, $R^9$, $R^{10}$ and $R^{11}$ each denote a hydrogen atom or a $C_1$-$C_{10}$ saturated hydrocarbon group, n indicating the number of the repeating units is within the range of 1 to 10, and the dotted lines indicate chemical bonds with adjacent atoms.

Preferably, the compounds (E) include epoxy groups and hydroxy groups in a molar ratio of 0≤(epoxy groups)/(hydroxy groups)≤0.5, and include partial structures (II) in a molar ratio of 0.01≤(partial structures (II))/(partial structures (I)+ partial structures (II))≤0.8.

A preferred compound (E) is a compound including at least one partial structure (I) and at least one partial structure (II).

Preferably, $R^{5a}$ and $R^{6a}$ are each a divalent group that comprises a $C_1$-$C_{10}$ alkylene group, a $C_6$-$C_{40}$ arylene group, an oxygen atom, a carbonyl group, a sulfur atom, or a combination of any thereof.

Preferably, the compounds (E) include 1 to 1000 partial structures (I) and 1 to 1000 partial structures (II).

Exemplary crosslinkable film materials (v) are compounds disclosed in WO 2018/030198 A1, which include a hydrocarbon structure, and at least one photodegradable nitrogen-containing structure and/or at least one photodegradable sulfur-containing structure.

A preferred compound is one that has one or more photodegradable nitrogen-containing structures and/or one or more photodegradable sulfur-containing structures in the molecule.

Preferably, the compound includes a hydrocarbon structure, and a photodegradable nitrogen-containing structure and/or a photodegradable sulfur-containing structure in the molecule, or is a combination of compounds that has these structures in different molecules.

Preferably, the hydrocarbon structure is a linear, branched or cyclic, saturated or unsaturated $C_1$-$C_{40}$ hydrocarbon group.

Preferably, the photodegradable nitrogen-containing structure is a structure that generates a reactive nitrogen-containing functional group or a reactive carbon-containing functional group when irradiated with ultraviolet light, or is a structure that includes a reactive nitrogen-containing functional group or a reactive carbon-containing functional group formed by ultraviolet irradiation.

Preferably, the photodegradable nitrogen-containing structure is a photodegradable nitrogen-containing structure that optionally contains a sulfur atom, and the structure comprises an azide structure, a tetrazole structure, a triazole structure, an imidazole structure, a pyrazole structure, an azole structure, a diazo structure, or a combination of any thereof.

Preferably, the photodegradable sulfur-containing structure is a structure that generates an organic sulfur radical or a carbon radical when irradiated with ultraviolet light, or is a structure that includes an organic sulfur radical or a carbon radical formed by ultraviolet irradiation.

Preferably, the photodegradable sulfur-containing structure is a photodegradable sulfur-containing structure that optionally contains a nitrogen atom, and the structure comprises a trisulfide structure, a disulfide structure, a sulfide structure, a thioketone structure, a thiophene structure, a thiol structure, or a combination of any thereof.

Preferred compounds are illustrated below:

[Chem. 75-1]

Formula (1-1)

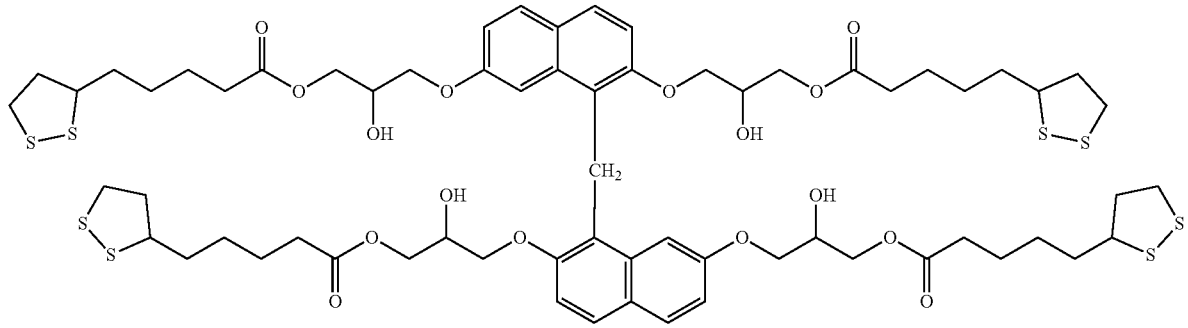

Formula (1-2)

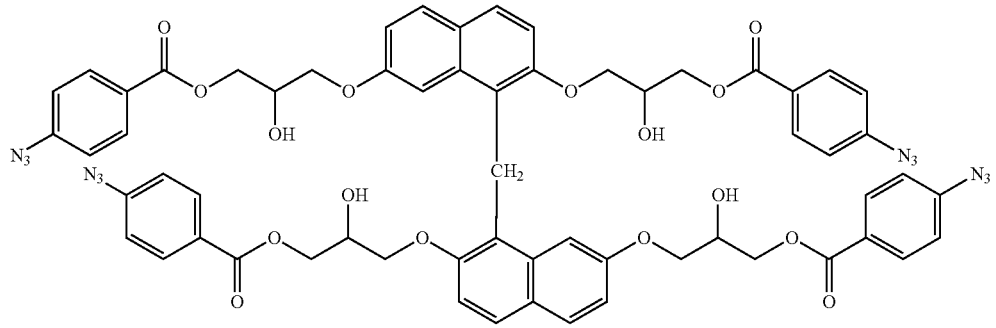

Formula (1-3)

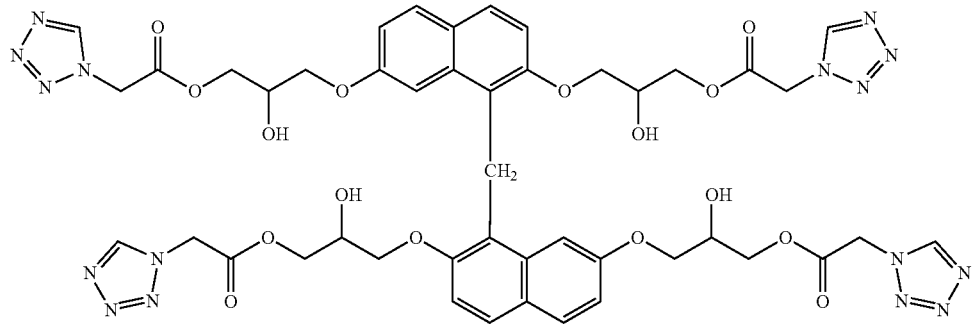

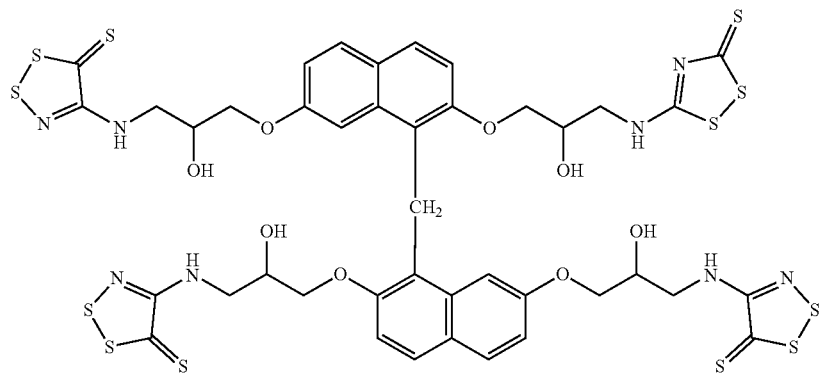
Formula (1-4)
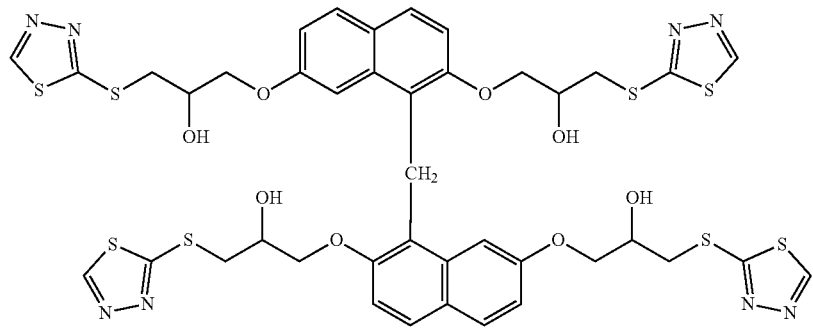
Formula (1-5)
[Chem. 75-2]
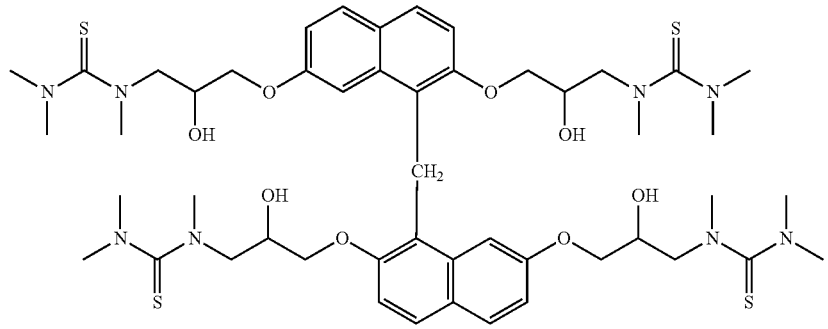
Formula (1-6)

Exemplary crosslinkable film materials (w) are compounds disclosed in WO 2019/013293 A1, which are represented by the following formula (1):

[Chem. 76]

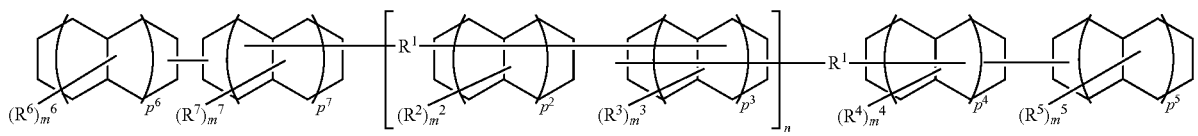

(1)

wherein $R^1$ independently at each occurrence is a $C_1$-$C_{30}$ divalent group, $R^2$ to $R^7$ are each independently a linear, branched or cyclic $C_1$-$C_{10}$ alkyl group, a $C_6$-$C_{10}$ aryl group, a $C_2$-$C_{10}$ alkenyl group, a thiol group or a hydroxy group, at least one $R^5$ is a hydroxy group or a thiol group, $m^2$, $m^3$ and $m^6$ are each independently an integer of 0 to 9, $m^4$ and $m^7$ are each independently an integer of 0 to 8, $m^5$ is an integer of 1 to 9, n is an integer of 0 to 4, and $p^2$ to $p^7$ are each independently an integer of 0 to 2.

A preferred compound is illustrated below:

[Chem. 77]

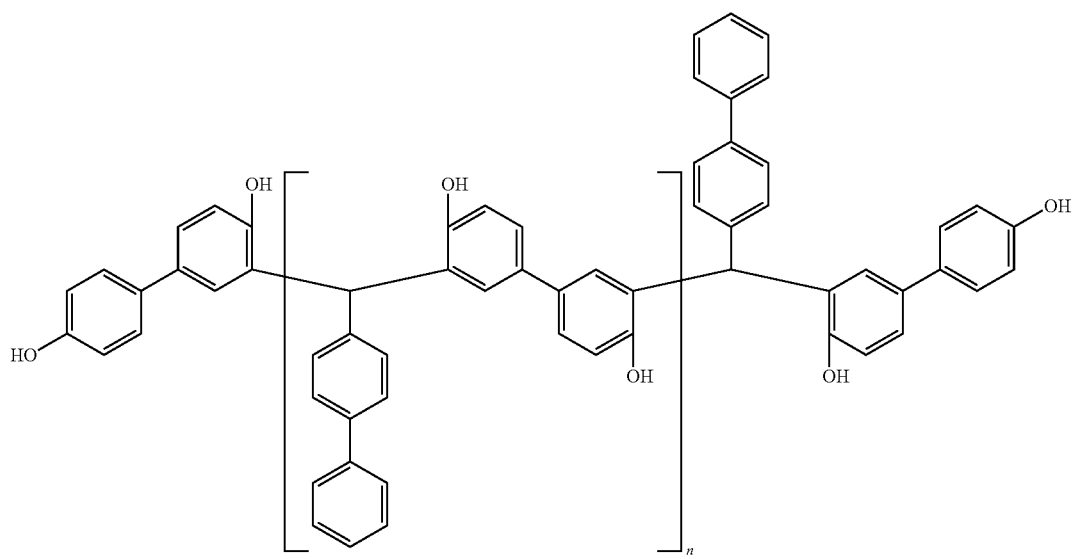

(5)

n = 0(61%), n = 1(25%), n = 2(9%), n = 4(5%)

Exemplary crosslinkable film materials (x) are compounds disclosed in JP 2016-216367 A, which are represented by the following general formula (1):

[Chem. 78]

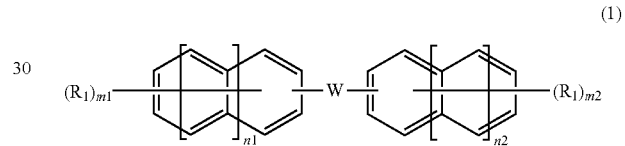

(1)

wherein $n_1$ and $n_2$ each independently indicate 0 or 1, W is a single bond or any of the structures represented by formulas (2) below, $R_1$ is any of the structures represented by the general formulas (3) below, m1 and m2 each independently indicate an integer of 0 to 7, and m1+m2 is 1 or more and 14 or less.

[Chem. 79]

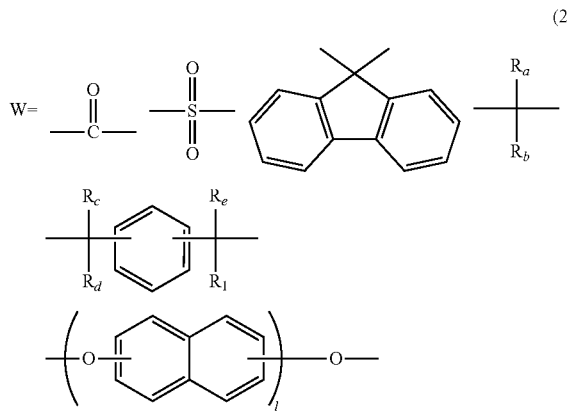
(2)

wherein l indicates an integer of 0 to 3, $R_a$ to $R_f$ each independently denote a hydrogen atom or a $C_1$-$C_{10}$ alkyl, phenyl or phenylethyl group optionally substituted with fluorine, and $R_a$ and $R_b$ are optionally bonded to each other to form a cyclic compound.

[Chem. 80]

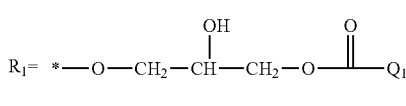
(3)

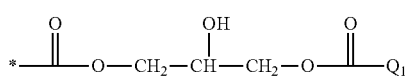

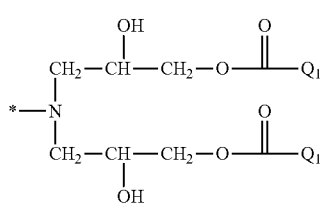

wherein * indicates a bond to the aromatic ring; $Q_1$ denotes a linear or branched, saturated or unsaturated $C_1$-$C_{30}$ hydrocarbon group, a $C_4$-$C_{20}$ alicyclic group, or a substituted or unsubstituted phenyl, naphthyl, anthracenyl or pyrenyl group; and when $Q_1$ denotes a linear or branched, saturated or unsaturated $C_1$-$C_{30}$ hydrocarbon group, $Q_1$ may be substituted with an oxygen atom or a carbonyl group in place of a methylene group.

Preferably, the compounds represented by the general formula (1) are compounds represented by the following general formula (4):

[Chem. 81]

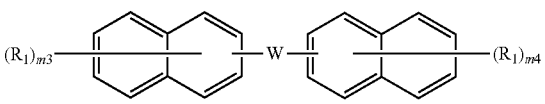
(4)

wherein, m3 and m4 each indicate 1 or 2, and W and $R_1$ are the same as defined hereinabove.

Preferably, W is a single bond or any of the structures represented by the following formulas (5).

[Chem. 82]

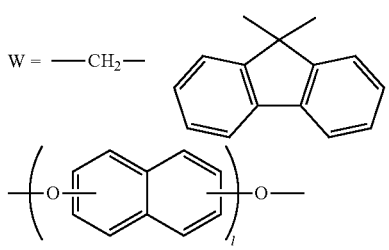
(5)

wherein l is the same as defined hereinabove.

Preferably, the compounds represented by the general formula (1) have two or more $Q_1$ groups in the molecule, and the $Q_1$ groups include one or more kinds of structures represented by the general formula (6) below and one or more kinds of structures represented by the general formula (7) below.

[Chem. 83]

**—$R_h$ (6)

wherein ** indicates a bond to the carbonyl group, $R_h$ denotes a linear or branched, saturated or unsaturated $C_1$-$C_{30}$ hydrocarbon group, and $R_h$ may be substituted with an oxygen atom or a carbonyl group in place of a methylene group.

[Chem. 84]

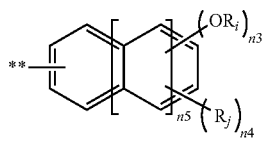
(7)

wherein ** indicates a bond to the carbonyl group, $R_i$ denotes a hydrogen atom or a linear or branched $C_1$-$C_{10}$ hydrocarbon group, $R_j$ denotes a linear or branched $C_1$-$C_{10}$ hydrocarbon group, a halogen atom, a nitro group, an amino group, a nitrile group, a $C_1$-$C_{10}$ alkoxycarbonyl group or a $C_1$-$C_{10}$ alkanoyloxy group, $n_3$ and $n_4$ indicating the numbers of the substituents on the aromatic ring are each an integer of 0 to 7 with the proviso that $n_3+n_4$ is 0 or more and 7 or less, and $n_5$ indicates 0 to 2.

Exemplary crosslinkable film materials (y) are compounds disclosed in JP 2017-119670 A, which are represented by the following general formula (1A):

[Chem. 85]

$$R-(R_1)_{(m1+m2)} \quad (1A)$$

wherein R is a single bond, a $C_1$-$C_{50}$ organic group, an ether bond, a —SO— group or a —SO$_2$— group, $R_1$ is a group represented by the general formula (1B) below, and m1 and m2 are integers satisfying $1 \leq m1 \leq 5$, $1 \leq m2 \leq 5$, and $2 \leq m1+m2 \leq 8$.

[Chem. 86]

$$-R_1 = -X^1 - X \quad (1B)$$

wherein $X^1$ is a group represented by any of the general formulas (1C) below, and X is a group represented by any of the general formulas (1D) below.

[Chem. 87]

$$X^1 = \begin{array}{l} -CH_2-CH(OH)-CH_2-O-C(=O)-(X) \\ -O-CH_2-CH(OH)-CH_2-O-C(=O)-(X) \\ -C(=O)-O-CH_2-CH(OH)-CH_2-(X) \\ -C(=O)-O-CH_2-CH(OH)-CH_2-O-(X) \\ -CH_2-CH(CH_2OH)-O-C(=O)-(X) \\ -O-CH_2-CH(CH_2OH)-O-C(=O)-(X) \\ -C(=O)-O-CH(CH_2OH)-CH_2-X \\ -C(=O)-O-CH(CH_2OH)-CH_2-O-(X) \end{array} \quad (1C)$$

wherein (X) indicates a bond to X.

[Chem. 88]

(1D) — structure showing naphthalene ring with $(X^3)_{n5}$ substituents and $(-O-X^2-O-CH=CH_2)_{n2}$ group, with $n1$ index wherein $X^2$ is a $C_1$-$C_{10}$ divalent organic group, $n_1$ is 0 or 1, $n_2$ is 1 or 2, $X^3$ is a group represented by the general formula (1E) below, and $n_5$ is 0, 1 or 2.

[Chem. 89)

$$X^3 = -CH_2-\underset{}{\bigcirc}-OR^{10} \quad (1E)$$

wherein $R^{10}$ is a hydrogen atom or a saturated or unsaturated $C_1$-$C_{10}$ hydrocarbon group, and the benzene ring in the formula may be substituted with a methyl group or a methoxy group in place of a hydrogen atom.

Preferably, the molecular weight of the compounds is 2,500 or less.

Preferably, the compounds are represented by the general formula (2A) below or the general formula (3A) below.

[Chem. 90]

(2A)

wherein R is a single bond, a $C_1$-$C_{50}$ organic group, an ether bond, a —SO— group or a —SO$_2$— group, $R_2$ is a group represented by the general formula (2B) below, and m3 and m4 are integers satisfying $1 \leq m3 \leq 5$, $1 \leq m4 \leq 5$, and $2 \leq m3+m4 \leq 8$.

[Chem. 91]

—R$_2$=—X$^{11}$—X'   (2B)

wherein $X^{11}$ is a group represented by any of the general formulas (2C) below, and X' is a group represented by the general formula (2D) below.

[Chem. 92]

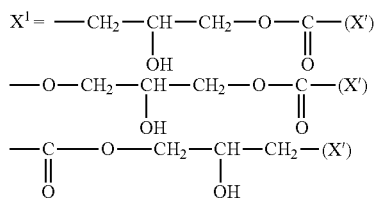
(2C)

-continued

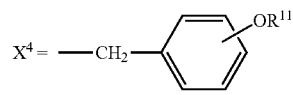

wherein (X') indicates a bond to X'.

[Chem. 93]

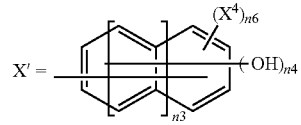
(2D)

wherein $n_3$ is 0 or 1, $n_4$ is 1 or 2, $X^4$ is a group represented by the general formula (2E) below, and $n_6$ is 0, 1 or 2.

[Chem. 94]

$X^4 =$ —CH$_2$—⌬—OR$^{11}$   (2E)

wherein $R^{11}$ is a hydrogen atom or a saturated or unsaturated $C_1$-$C_{10}$ hydrocarbon group, and the benzene ring in the formula may be substituted with a methyl group or a methoxy group in place of a hydrogen atom.

[Chem. 94]

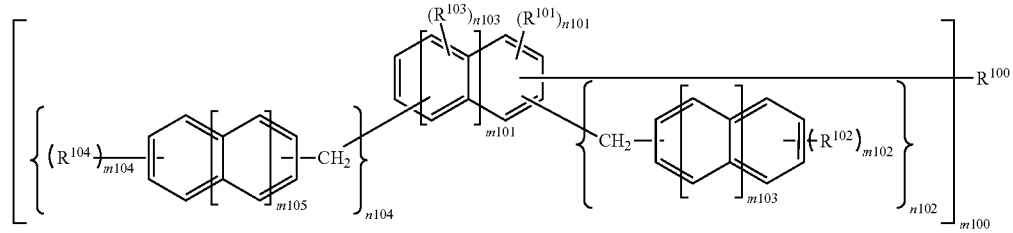
(3A)

wherein $R^{101}$, $R^{102}$, $R^{103}$ and $R^{104}$ are each independently a hydroxy group; m100 is 1, 2 or 3; when m100 is 1, $R^{100}$ is a hydrogen atom or a hydroxy group; when m100 is 2, $R^{100}$ is a single bond or a group represented by any of the general formulas (3B) below; when m100 is 3, $R^{100}$ is a group represented by the general formula (3C) below; the aromatic rings in the formula may be substituted with a methyl group or a methoxy group in place of a hydrogen atom; m101 is 0 or 1; m102 is 1 or 2; m103 is 0 or 1; m104 is 1 or 2; m105 is 0 or 1; when m101 is 0, n101 and n102 are integers satisfying $0 \leq n101 \leq 3$, $0 \leq n102 \leq 3$, and $1 \leq n101+n102 \leq 4$; and when m101 is 1, n101, n102, n103 and n104 are integers satisfying $0 \leq n101 \leq 2$, $0 \leq n102 \leq 2$, $0 \leq n103 \leq 2$, $0 \leq n104 \leq 2$, and $2 \leq n101+n102+n103+n104 \leq 8$.

[Chem. 96]

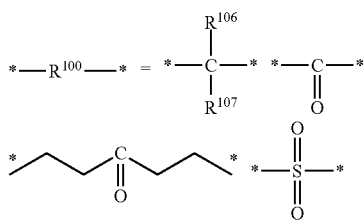

(3B)

wherein * indicates a bond, $R^{106}$ and $R^{107}$ are each a hydrogen atom or a $C_1$-$C_{24}$ organic group containing no ester bonds, and $R^{106}$ and $R^{107}$ are optionally bonded to each other form a cyclic structure.

[Chem. 97]

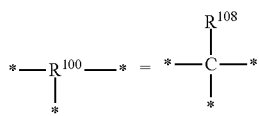

(3C)

wherein * indicates a bond, and $R^{108}$ is a hydrogen atom or a $C_1$-$C_{15}$ organic group.

Exemplary polyether film materials (z) are polymers disclosed in WO 2012/050064 which are represented by the following general formula (1). The polymers include a unit structure represented by the following formula (1):

[Chem. 98]

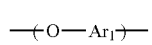

Formula (1)

wherein $Ar_1$ denotes an organic group comprising a $C_6$-$C_{50}$ arylene or heterocyclic group; a unit structure represented by the following formula (2):

[Chem. 99]

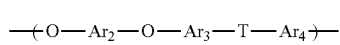

Formula (2)

wherein $Ar_2$, $Ar_3$ and $Ar_4$ each denote an organic group comprising a $C_6$-$C_{50}$ arylene or heterocyclic group, and T denotes a carbonyl group or a sulfonyl group; or a combination of a unit structure represented by formula (1) and a unit structure represented by formula (2).

The crosslinkable film material (B) preferably comprises at least one member selected from the group consisting of:
(B1) film materials containing an aliphatic ring (for example, (a) and (m) described above),
(B2) novolak film materials (for example, (b), (c), (d), (e), (f), (g), (h), (i), (j), (k) and (l) described above),
(B3) polyether film materials (for example, (z) described above),
(B4) polyester film materials (for example, (o) and (p) described above),
(B5) compounds differing from the crosslinking compounds (A) (for example, (m), (n), (r), (s), (t), (u), (v), (w), (x) and (y) described above),
(B6) film materials containing an aromatic fused ring (for example, (q) described above),
(B7) acrylic resins and
(B8) methacrylic resins.

When the resist underlayer film-forming composition according to the present invention includes the crosslinkable film material (B) (a film material or a polymer), the content of the crosslinkable film material (B) is usually within the range of 1 to 99.9% by mass, preferably 50 to 99.9% by mass, more preferably 50 to 95% by mass, and still more preferably 50 to 90% by mass based on the total solid content.

[(C) Acid Catalysts]

The acid catalyst optionally contained in the resist underlayer film-forming composition according to the present invention is not particularly limited as long as the catalyst can promote the reaction between the crosslinking compound (A) and the crosslinkable film material (B).

Examples of the acid catalysts include sulfonic acid compounds and carboxylic acid compounds such as pyridinium p-toluenesulfonate, pyridinium p-hydroxybenzenesulfonate, pyridinium trifluoromethanesulfonate, p-toluenesulfonic acid, p-hydroxybenzenesulfonic acid, trifluoromethanesulfonic acid, salicylic acid, camphorsulfonic acid, 5-sulfosalicylic acid, chlorobenzenesulfonic acid, methyl 4-phenolsulfonate, benzenesulfonic acid, naphthalenesulfonic acid, citric acid and benzoic acid, and thermal acid generators such as trifluoromethanesulfonic acid quaternary ammonium salts K-PURE [registered trademark] series TAG2689, TAG2690, TAG2678 and CXC-1614 (all manufactured by King Industries, Inc.), 2,4,4,6-tetrabromocyclohexadienone, benzoin tosylate, 2-nitrobenzyl tosylate and other organosulfonic acid alkyl esters. The acid catalysts may be used each alone or in combination of two or more. Of the acid catalysts described above, pyridinium p-hydroxybenzenesulfonate is preferable.

Photoacid generators may also be used as the acid catalysts. Preferred examples of the photoacid generators include onium salt-based photoacid generators such as bis(4-t-butylphenyl)iodonium trifluoromethanesulfonate and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. Preferred specific examples include sulfonic acid-based photoacid generators such as TPS-Tf, DTBPI-PFBS, TPS-CS and TPS-PFBS (manufactured by Toyo Gosei Co., Ltd.). The photoacid generator may be used in 0.2 to 10% by mass, and preferably 0.4 to 5% by mass based on the total solid content.

Ion exchange resins for catalysts may be used to ensure that undesired substances such as unreacted acids and catalysts, and inactivated catalysts will not remain in the reaction system. For example, strong acid ion exchange resins of sulfonic acid type may be used as the ion exchange resins for catalysts.

When the resist underlayer film-forming composition according to the present invention includes the acid catalyst, the content of the acid catalyst is, for example, 1% by mass to 30% by mass, and preferably 5% by mass to 15% by mass based on the content of the crosslinking agent.

(D) Solvents

In the resist underlayer film-forming composition according to the present invention, the crosslinking compound (A) and optional components such as the crosslinkable film material (B), the acid catalyst (C) and other components are dissolved in a solvent. The solvent is not particularly limited as long as the components described above may be uniformly dissolved.

Examples include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monoethyl ether, propylene glycol monomethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide and N,N-dimethylacetamide. The solvents may be used each alone or in combination of two or more.

Of the solvents enumerated above, propylene glycol monomethyl ether, propylene glycol monomethyl ether acetate, ethyl lactate, butyl lactate and cyclohexanone are preferable. The solvent used in the preparation of the crosslinking compound (A) or the crosslinkable film material (B) may be advantageously used continuously as the solvent, thus contributing to the effective use of resources.

The solvent that is used may be a mixture of the above solvent and a high-boiling solvent such as propylene glycol monobutyl ether or propylene glycol monobutyl ether acetate.

The amount of the solvent is preferably selected so that the solid content in the resist underlayer film-forming composition according to the present invention will be within the range of 0.1 to 70% by mass, more preferably 0.1 to 60% by mass. The solid content indicates the content of all the components forming the resist underlayer film-forming composition except the solvent.

[Additional Components]

Where necessary, the resist underlayer film-forming composition according to the present invention may contain additional components such as surfactants, rheology modifiers, adhesion aids and light absorbers in addition to the components described above.

The resist underlayer film-forming composition of the present invention may contain a surfactant as an optional component in order to enhance the applicability to a semiconductor substrate. Examples of the surfactants include nonionic surfactants, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkyl aryl ethers such as polyoxyethylene octyl phenyl ether and polyoxyethylene nonyl phenyl ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine surfactants such as EFTOP [registered trademark] series EF301, EF303 and EF352 (all manufactured by Mitsubishi Materials Electronic Chemicals Co., Ltd.), MEGAFACE [registered trademark] series F171, F173, R-30, R-30N, R-40 and R-40-LM (all manufactured by DIC CORPORATION), FLUORAD series FC430 and FC431 (all manufactured by Sumitomo 3M Ltd.), ASAHI GUARD [registered trademark] AG710 and SURFLON [registered trademark] series S-382, SC101, SC102, SC103, SC104, SC105 and SC106 (all manufactured by AGC Inc.); and organosiloxane polymer KP341 (manufactured by Shin-Etsu Chemical Co., Ltd.). The surfactants may be used each alone or in combination of two or more. The amount in which the surfactant is added is usually 2.0% by mass or less, and preferably 1.0% by mass or less relative to the total solid content in the resist underlayer film-forming composition of the present invention. The surfactants may be added each alone or in combination of two or more.

A rheology modifier may be added mainly to enhance the fluidity of the resist underlayer film-forming composition and thereby, particularly in the baking step, to enhance the uniformity in thickness of a resist underlayer film and to increase the filling performance of the resist underlayer film-forming composition with respect to the inside of holes. Specific examples thereof include phthalic acid derivatives such as dimethyl phthalate, diethyl phthalate, diisobutyl phthalate, dihexyl phthalate and butyl isodecyl phthalate; adipic acid derivatives such as di-n-butyl adipate, diisobutyl adipate, diisooctyl adipate and octyl decyl adipate; maleic acid derivatives such as di-n-butyl maleate, diethyl maleate and dinonyl maleate; oleic acid derivatives such as methyl oleate, butyl oleate and tetrahydrofurfuryl oleate; and stearic acid derivatives such as n-butyl stearate and glyceryl stearate. The rheology modifier is usually added in a proportion of less than 30% by mass relative to the total solid content in the resist underlayer film-forming composition.

An adhesion aid may be added mainly to enhance the adhesion between the resist underlayer film-forming composition and a substrate or a resist and thereby to prevent the detachment of the resist particularly during development. Specific examples thereof include chlorosilanes such as trimethylchlorosilane, dimethylvinylchlorosilane, methyldiphenylchlorosilane and chloromethyldimethylchlorosilane; alkoxysilanes such as trimethylmethoxysilane, dimethyldiethoxysilane, methyldimethoxysilane, dimethylvinylethoxysilane, diphenyldimethoxysilane and phenyltriethoxysilane; silazanes such as hexamethyldisilazane, N,N'-bis(trimethylsilyl)urea, dimethyltrimethylsilylamine and trimethylsilylimidazole; silanes such as vinyltrichlorosilane, γ-chloropropyltrimethoxysilane, γ-aminopropyltriethoxysilane and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole and mercaptopyrimidine; and urea or thiourea compounds such as 1,1-dimethylurea and 1,3-dimethylurea. The adhesion aid is usually added in a proportion of less than 5% by mass, preferably less than 2% by mass relative to the total solid content in the lithographic resist underlayer film-forming composition.

Some example light absorbers that may be suitably used are commercially available light absorbers described in "Kougyouyou Shikiso no Gijutsu to Shijou (Technology and Market of Industrial Dyes)" (CMC Publishing Co., Ltd.) and "Senryou Binran (Dye Handbook)" (edited by The Society of Synthetic Organic Chemistry, Japan), such as, for example, C. I. Disperse Yellow 1, 3, 4, 5, 7, 8, 13, 23, 31, 49, 50, 51, 54, 60, 64, 66, 68, 79, 82, 88, 90, 93, 102, 114 and 124; C. I. Disperse Orange 1, 5, 13, 25, 29, 30, 31, 44, 57, 72 and 73; C. I. Disperse Red 1, 5, 7, 13, 17, 19, 43, 50, 54, 58, 65, 72, 73, 88, 117, 137, 143, 199 and 210; C. I. Disperse Violet 43; C. I. Disperse Blue 96; C. I. Fluorescent Brightening Agent 112, 135 and 163; C. I. Solvent Orange 2 and 45; C. I. Solvent Red 1, 3, 8, 23, 24, 25, 27 and 49; C. I. Pigment Green 10; and C. I. Pigment Brown 2. The light absorber is usually added in a proportion of 10% by mass or less, preferably 5% by mass or less relative to the total solid content in the resist underlayer film-forming composition.

The resist underlayer film-forming composition according to the present invention may contain a crosslinking agent other than the crosslinking compound represented by formula (I). Examples of such crosslinking agents include melamine-based crosslinking agents, substituted urea-based crosslinking agents, and polymers thereof. Crosslinking agents having at least two crosslinking substituents are preferable, with examples including methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea and methoxymethylated thiourea. Further, condensates of these compounds may also be used.

Of the compounds described above, methoxymethylated glycoluril is preferable.

Examples of the crosslinking agents other than the crosslinking compounds of formula (I) include compounds represented by formula (2-1) or formula (2-2) below (hereinafter, these compounds will be written as the "crosslinking agents (B)").

[Chem. 100]

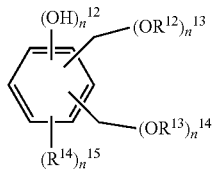

(2-1)

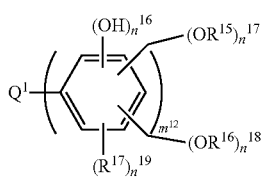

(2-2)

In formula (2-1) and formula (2-2), $Q^1$ is a single bond or an organic group with a valence indicated by $m^{12}$; $R^{12}$ and $R^{15}$ are each independently a $C_2$-$C_{10}$ alkyl group or a $C_2$-$C_{10}$ alkyl group having a $C_1$-$C_{10}$ alkoxy group; $R^{13}$ and $R^{16}$ are each independently a hydrogen atom or a methyl group; $R^{14}$ and $R^{17}$ are each independently a $C_1$-$C_{10}$ alkyl group or a $C_6$-$C_{40}$ aryl group; $n^{12}$ is an integer of 1 to 3; $n^{13}$ is an integer of 2 to 5; $n^{14}$ is an integer of 0 to 3; $n^{15}$ is an integer of 0 to 3; $3 \leq (n^{12}+n^{13}+n^{14}+n^{15}) \leq 6$; $n^{16}$ is an integer of 1 to 3; $n^{17}$ is an integer of 1 to 4; $n^{18}$ is an integer of 0 to 3; $n^{19}$ is an integer of 0 to 3; $2 \leq (n^{16}+n^{17}+n^{18}+n^{19}) \leq 5$; and $m^{12}$ is an integer of 2 to 10.

Specifically, $Q^1$ may be a single bond, or an organic group with a valence indicated by $m^{12}$ that is selected from a $C_1$-$C_{10}$ chain hydrocarbon group, a $C_6$-$C_{40}$ aromatic group or a combination thereof. Here, examples of the chain hydrocarbon groups include those alkyl groups described later, and examples of the aromatic groups include those aryl groups described later.

Examples of the $C_2$-$C_{10}$ alkyl groups include ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group and 2-ethyl-3-methyl-cyclopropyl group.

Examples of the $C_1$-$C_{10}$ alkyl groups include methyl group and the $C_2$-$C_{10}$ alkyl groups mentioned above.

Examples of the $C_1$-$C_{10}$ alkoxy groups include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group and 1-ethyl-2-methyl-n-propoxy group.

Examples of the $C_6$-$C_{40}$ aryl groups include phenyl group, naphthyl group and anthryl group.

Specific examples of the cros slinking agents (B) include, but are not limited to, compounds represented by the following formulas (3-1) to (3-40):
[Chem. 101]
(3-1)
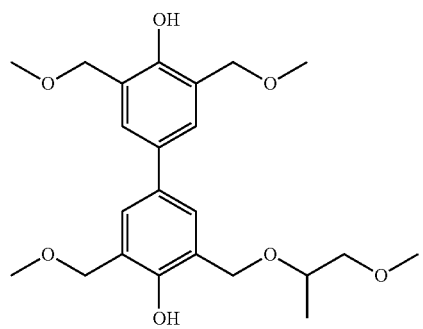
(3-2)
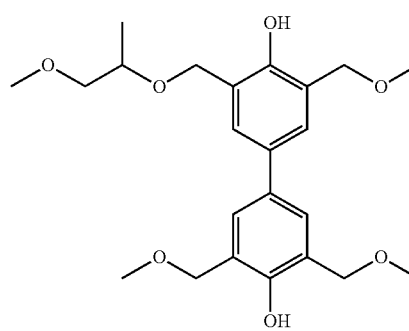
(3-3)
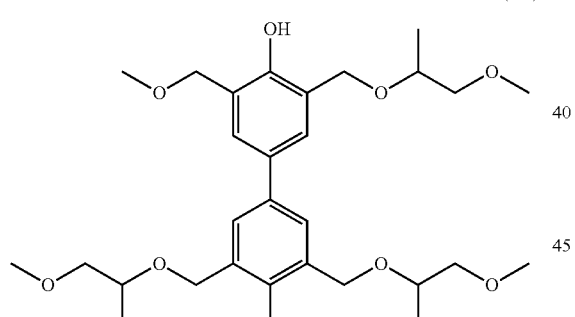
(3-4)
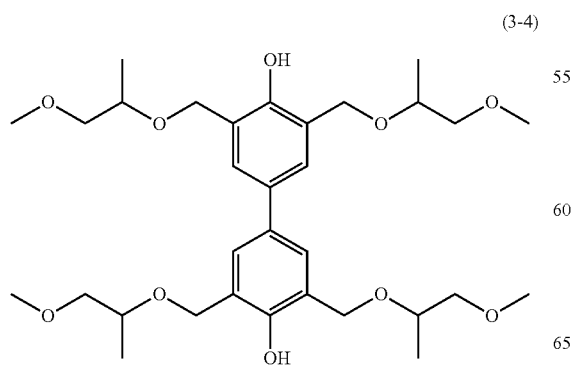
(3-5)
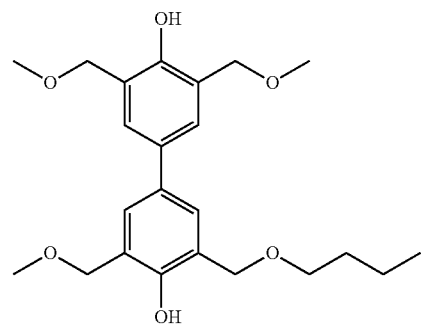
(3-6)
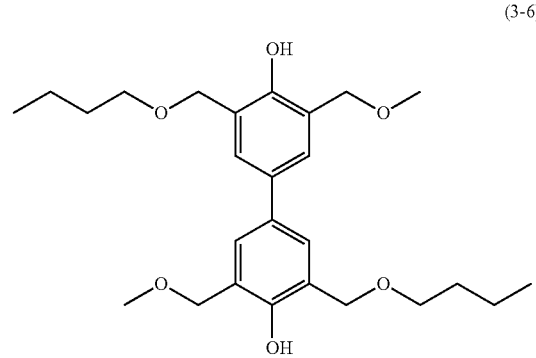
(3-7)
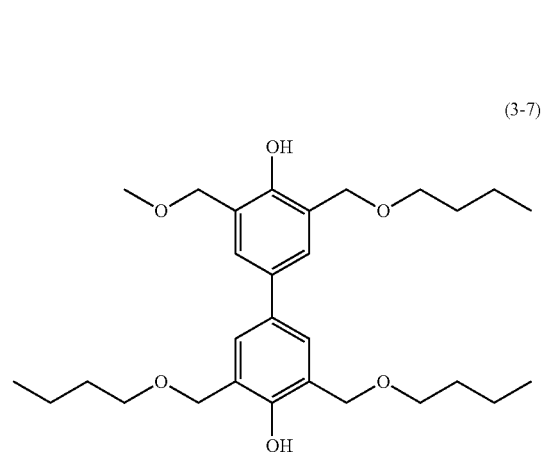
(3-8)
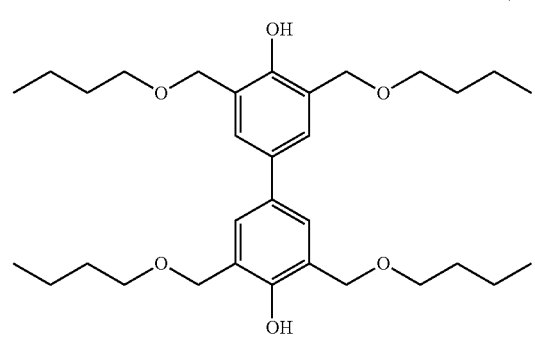

[Chem. 102]
(3-9)
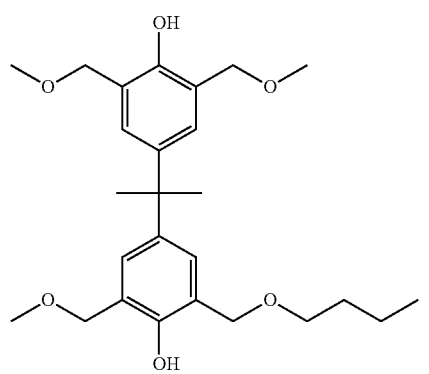
(3-10)
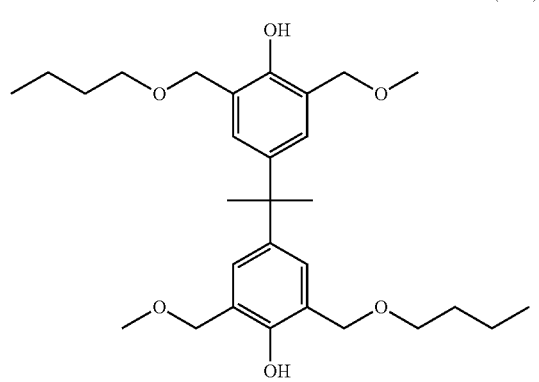
(3-11)
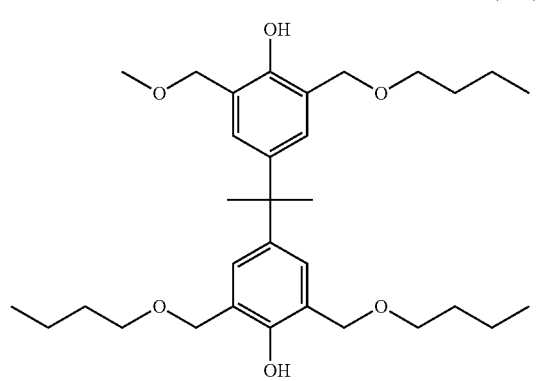
(3-12)
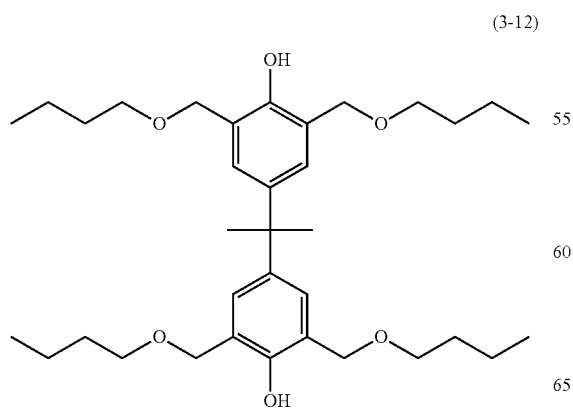
(3-13)
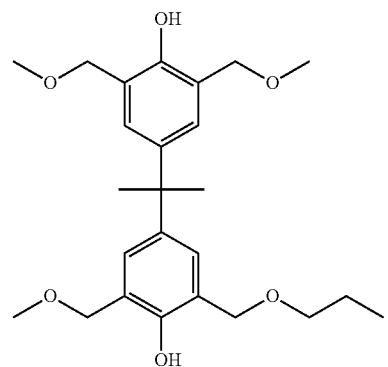
(3-14)
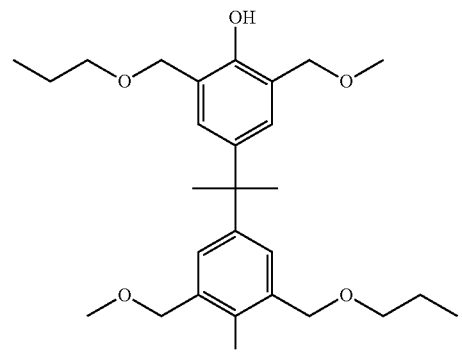
(3-15)
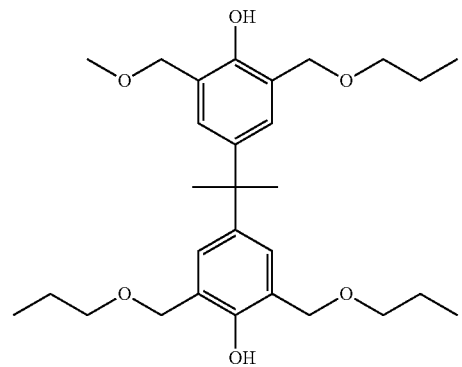
(3-16)
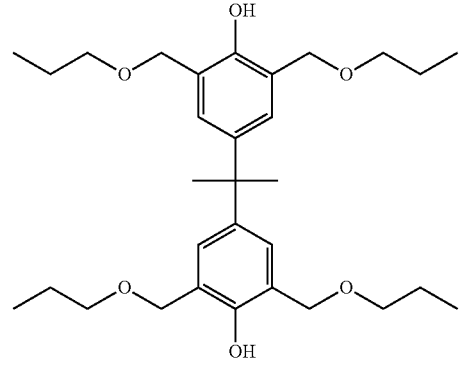

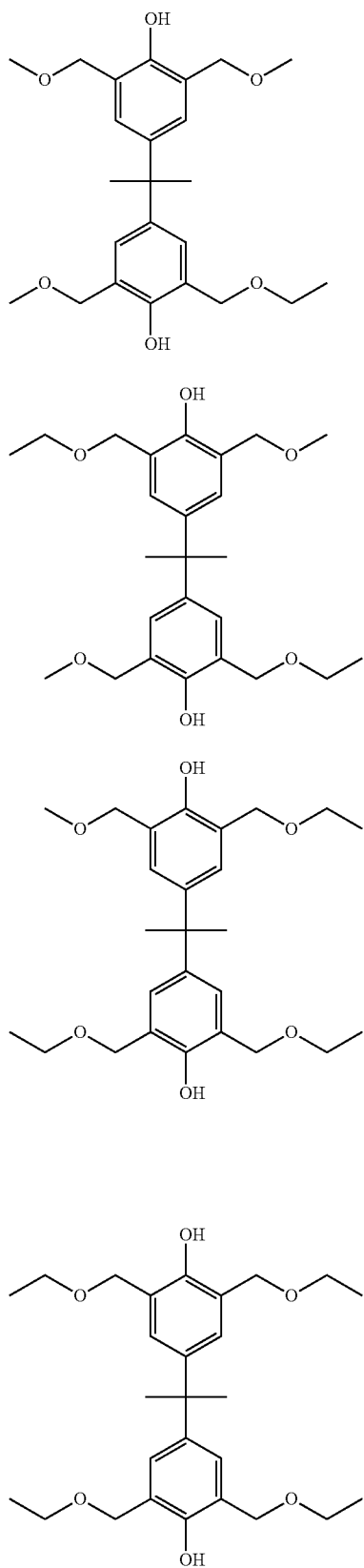
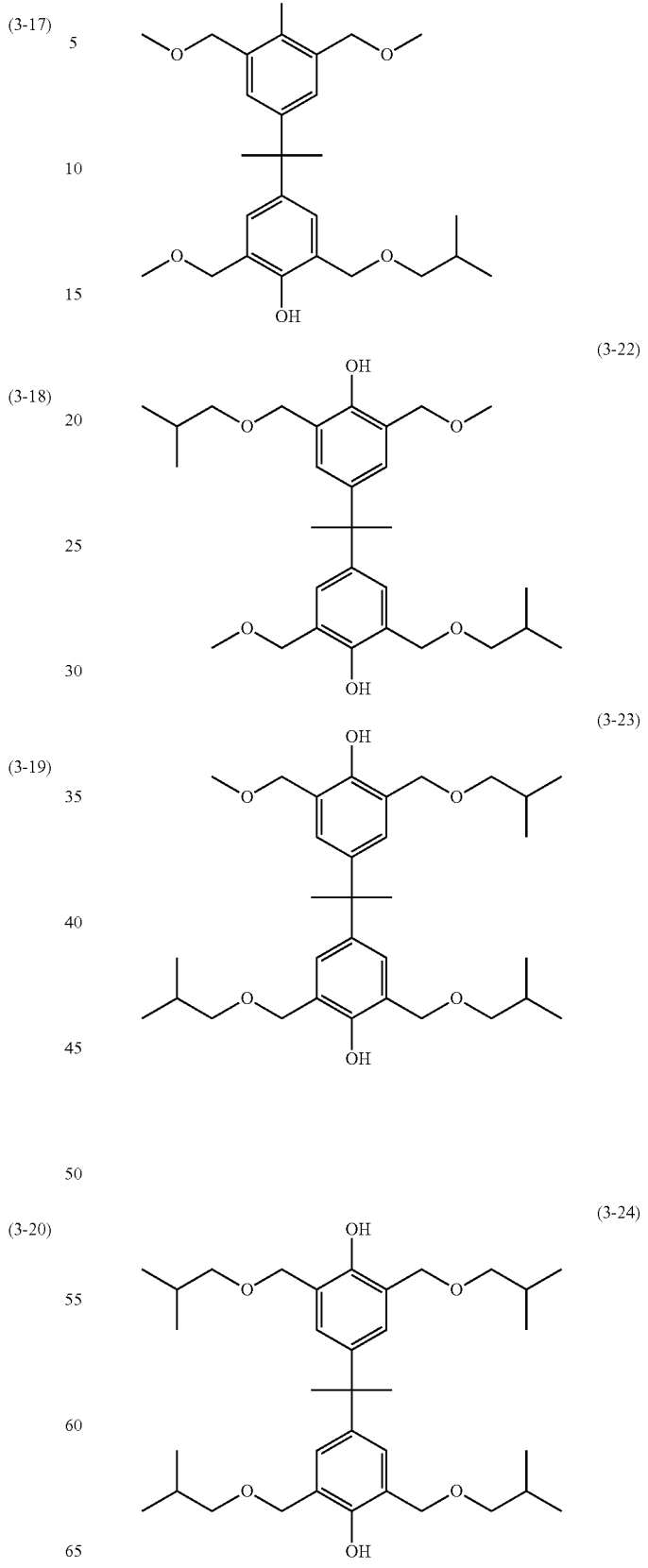

[Chem. 104]
(3-25) 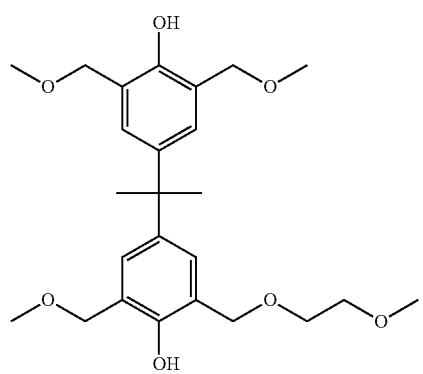
(3-26) 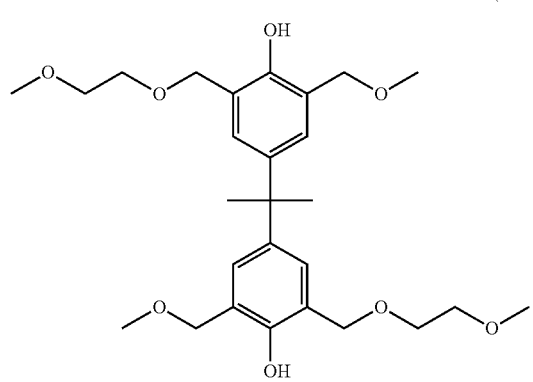
(3-27) 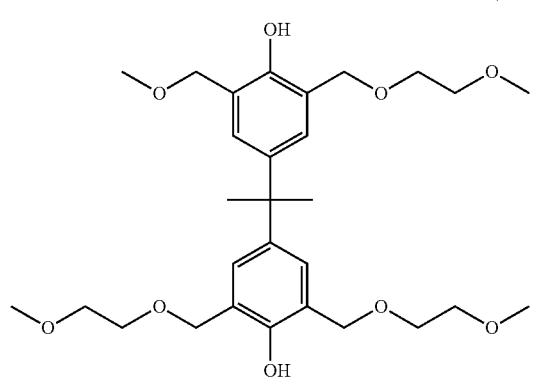
(3-28) 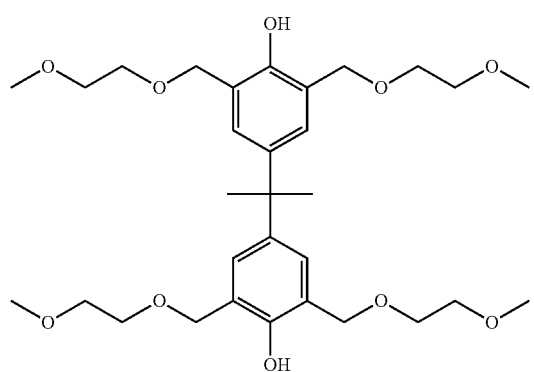
(3-29) 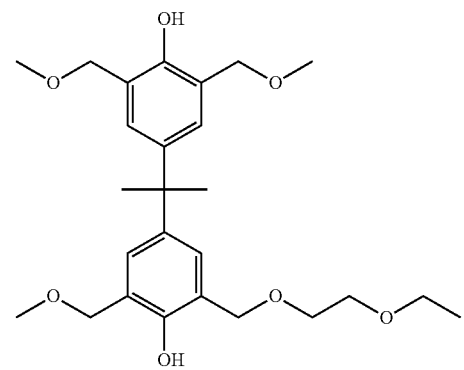
(3-30) 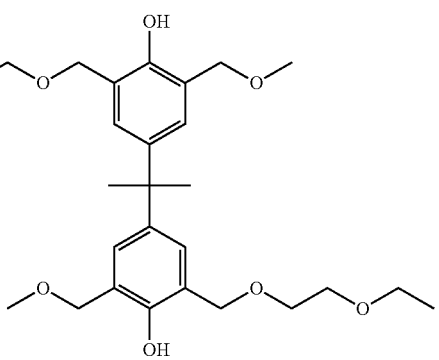
(3-31) 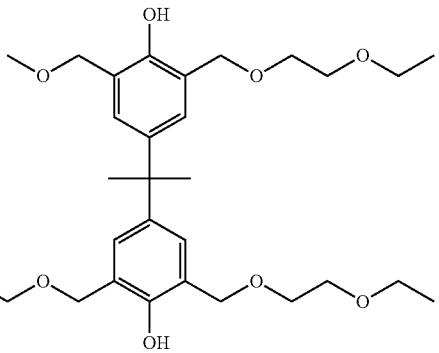
(3-32) 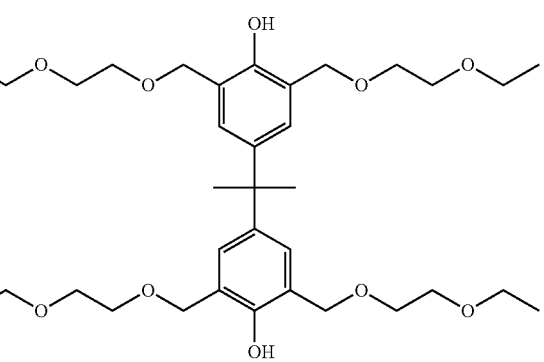

-continued
[Chem. 105]
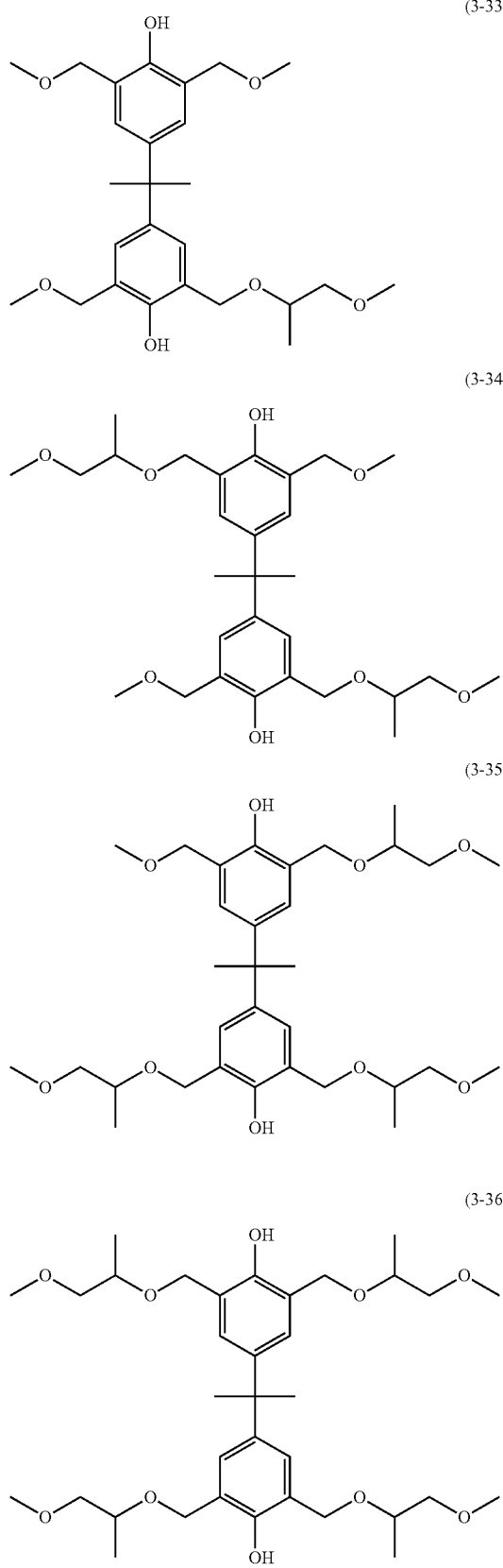
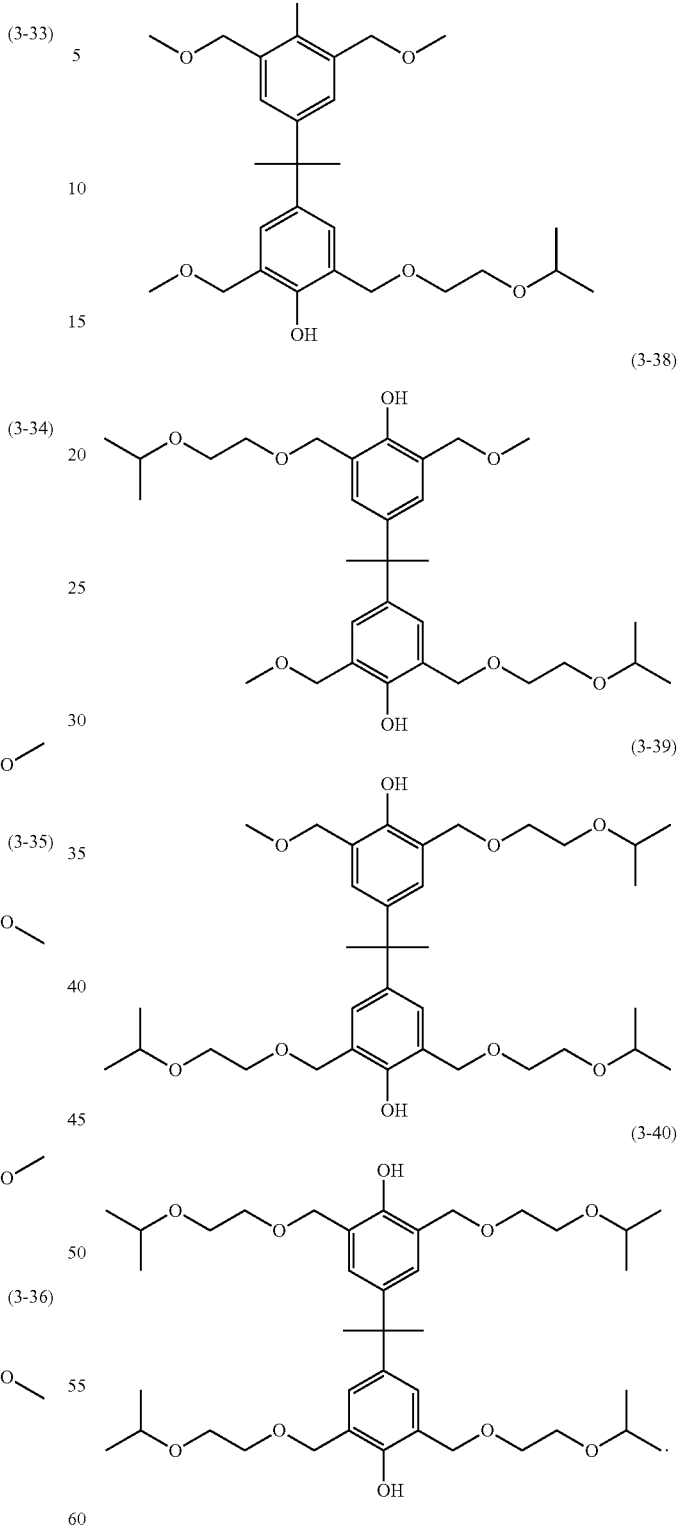
In the resist underlayer film-forming composition of the present embodiment, the crosslinking agents (B) may be used each alone or in combination of two or more.
In the present embodiment, the crosslinking agent (B) may be synthesized appropriately using a known technique without limitation. For example, the crosslinking agent may be obtained by reacting a compound represented by formula (2'-1) or formula (2'-2) below with a hydroxyl-containing ether compound or a $C_2$-$C_{10}$ alcohol. Incidentally, the cross-linking agent (B) is written as mono-substituted, di-substituted, tri-substituted or tetra-substituted when 1 mole of the compound represented by formula (2'-1) or formula (2'-2) is substituted with 1 mole, 2 mole, 3 mole or 4 mole of the hydroxyl-containing ether compound or the $C_2$-$C_{10}$ alcohol, respectively.

[Chem. 106]

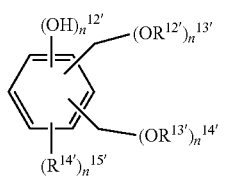
(2'-1)

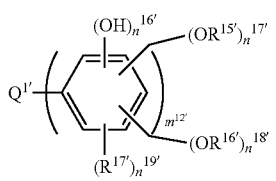
(2'-2)

In formula (2'-1) and formula (2'-2), $Q^{1'}$ is a single bond or an organic group with a valence indicated by $m^{12'}$. Specifically, $Q^{1'}$ may be a single bond or an organic group with a valence indicated by $m^{12'}$ that is selected from a $C_1$-$C_{10}$ chain hydrocarbon group, a $C_6$-$C_{40}$ aromatic group or a combination thereof. Here, examples of the chain hydrocarbon groups include the alkyl groups mentioned hereinabove, and examples of the aromatic groups include the aryl groups mentioned hereinabove.

$R^{12'}$, $R^{13'}$, $R^{15'}$ and $R^{16'}$ are each independently a hydrogen atom or a methyl group; $R^{14'}$ and $R^{17'}$ are each independently a $C_1$-$C_{10}$ alkyl group or a $C_6$-$C_{40}$ aryl group; $n^{12'}$ is an integer of 1 to 3; $n^{13'}$ is an integer of 2 to 5; $n^{14'}$ is an integer of 0 to 3; $n^{15'}$ is an integer of 0 to 3; $3 \leq (n^{12'}+n^{13'}+n^{14'}+n^{15'}) \leq 6$; $n^{16'}$ is an integer of 1 to 3; $n^{17'}$ is an integer of 1 to 4; $n^{18'}$ is an integer of 0 to 3; $n^{19'}$ is an integer of 0 to 3; $2 \leq (n^{16'}+n^{17'}+n^{18'}+n^{19'}) \leq 5$; and $m^{12'}$ is an integer of 2 to 10.

Specific examples of the compounds represented by formula (2'-1) or formula (2'-2) include, but are not limited to, compounds represented by the following formulas (4-1) to (4-27).

[Chem. 107]

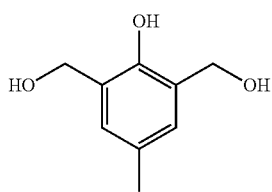
(4-1)

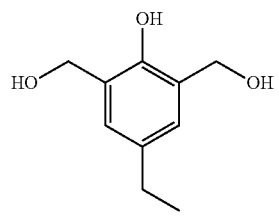
(4-2)

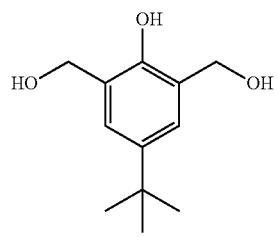
(4-3)

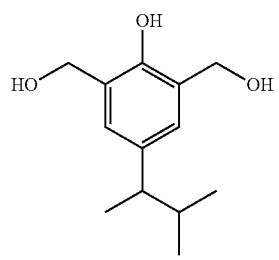
(4-4)

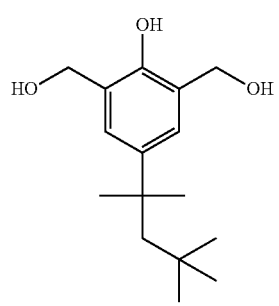
(4-5)

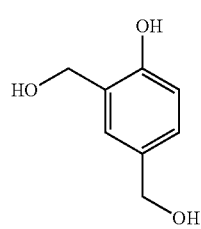
(4-6)

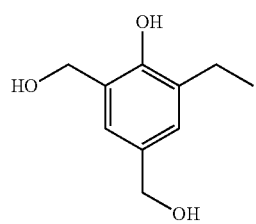
(4-7)

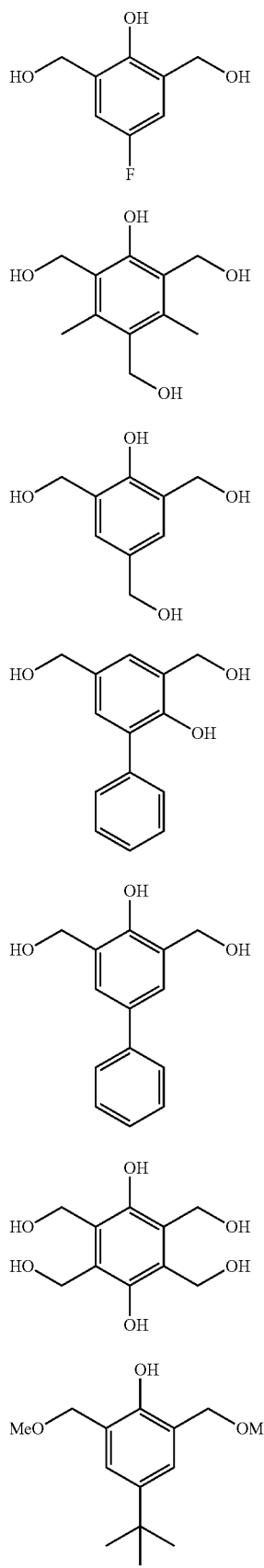
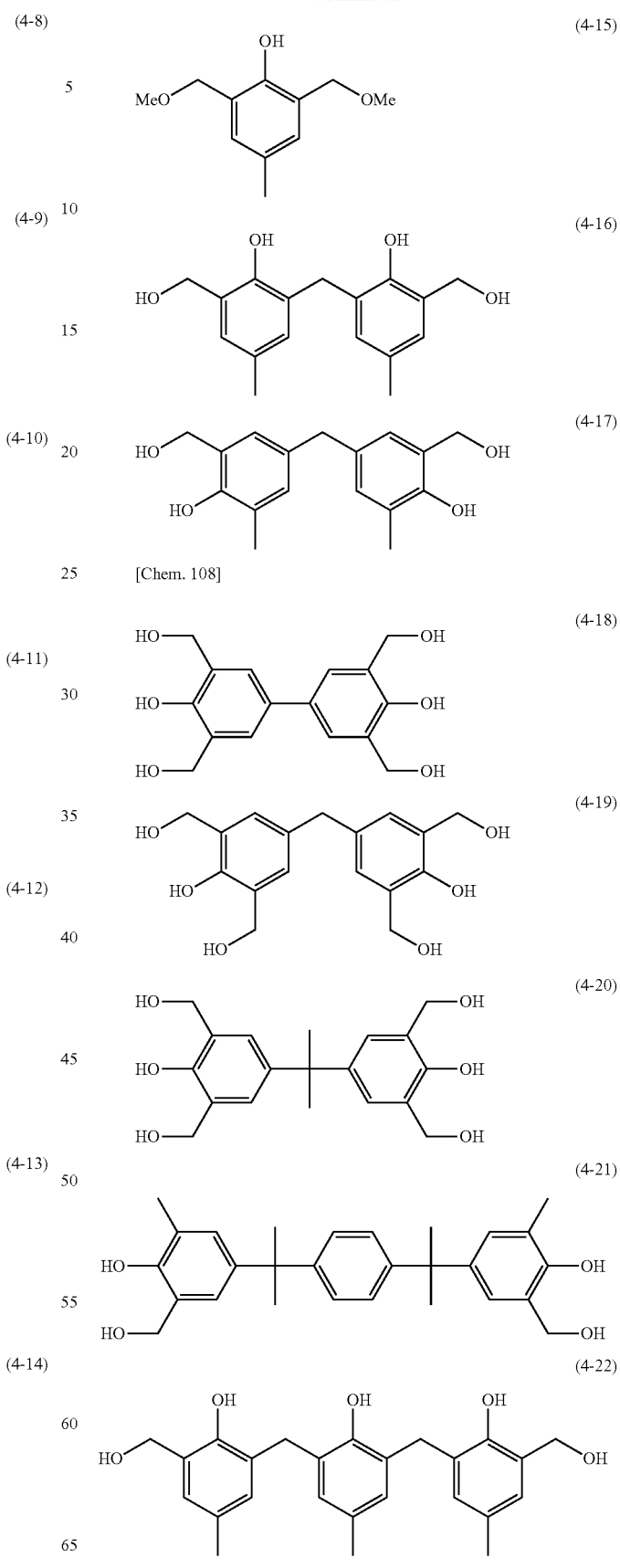

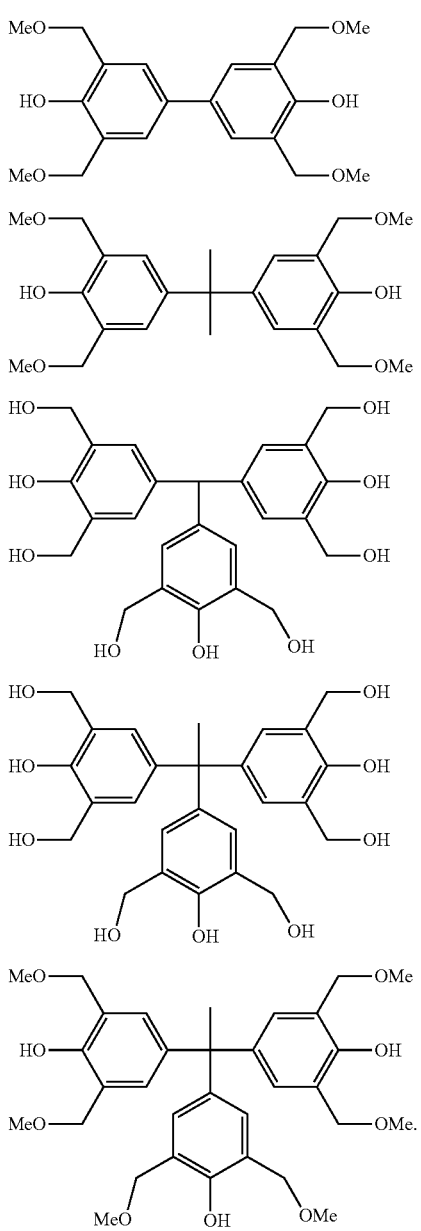

Specifically, the crosslinking agent (B) may be obtained by reacting a compound represented by the above formula (2'-1) or (2'-2) with a hydroxyl-containing ether compound or a $C_2$-$C_{10}$ alcohol in the presence of an acid catalyst.

The resist underlayer film-forming composition according to the present invention may be prepared by uniformly mixing the components described hereinabove by a conventional method. The resist underlayer film-forming composition thus prepared is preferably used after being filtered through, for example, a filter having a pore size of 0.2 μm or 0.1 μm, and/or a filter having a pore size of 0.01 μm.

[Methods for Producing Patterned Substrates]

A method for producing a patterned substrate using the resist underlayer film-forming composition according to the present invention includes the steps of: applying the resist underlayer film-forming composition according to the present invention onto a semiconductor substrate and curing the resist underlayer film-forming composition to form a resist underlayer film; applying a resist onto the resist underlayer film and baking the resist to form a resist film; exposing the semiconductor substrate coated with the resist underlayer film and the resist; and developing the exposed resist film exposed to perform patterning. These steps will be sequentially described below.

Examples of the semiconductor substrates to which the resist underlayer film-forming composition according to the present invention is applied include silicon substrates, germanium substrates, and compound semiconductor wafers such as gallium arsenide, indium phosphide, gallium nitride, indium nitride and aluminum nitride. The semiconductor substrate that is used may have an inorganic film on its surface. For example, such an inorganic film is formed by ALD (atomic layer deposition), CVD (chemical vapor deposition), reactive sputtering, ion plating, vacuum deposition or spin coating (spin on glass: SOG). Examples of the inorganic films include polysilicon films, silicon oxide films, silicon nitride films, BPSG (boro-phospho silicate glass) films, titanium nitride films, titanium oxynitride films, tungsten films, gallium nitride films and gallium arsenide films.

The resist underlayer film-forming composition according to the present invention is applied onto the semiconductor substrate with an appropriate applicator such as a spinner or a coater. Thereafter, the coating film is cured to form a cured coating film as a resist underlayer film according to the present invention.

The coating film may be cured by, for example, calcination (baking) of the coating film with a heating device such as a hot plate, or photocuring of the coating film by application of light (for example, ultraviolet light).

The baking conditions are appropriately selected from baking temperatures of 100° C. to 400° C. and amounts of baking time of 0.3 minutes to 60 minutes. Preferably, the baking temperature is within the range of 120° C. to 350° C., and the baking time is within the range of 0.5 minutes to 30 minutes. More preferably, the baking temperature is within the range of 150° C. to 300° C., and the baking time is within the range of 0.8 minutes to 10 minutes. Most preferably, the baking temperature is within the range of 200° C. to 260° C., and the baking time is within the range of 0.8 minutes to 3 minutes. The film thickness of the resist underlayer film that is formed is, for example, within the range of 0.001 μm to 10 μm, preferably 0.002 μm to 1 μm, more preferably 0.005 μm to 0.5 μm, and most preferably 0.02 to 0.3 μm. If the temperature at the time of baking is lower than the above range, the resist underlayer mthat is formed may sometimes be crosslinked insufficiently and may sometimes be poorly resistant to a resist solvent or an aqueous hydrogen peroxide solution. If, on the other hand, the temperature during baking is higher than the above range, the resist underlayer film may sometimes be decomposed by heat.

When the coating film is cured by calcination (baking) alone, the resist underlayer film according to the present invention is a calcined product of the coating film.

Instead of by calcination (baking) alone, the coating film may be cured by heat treatment at a relatively low temperature (for example, a temperature lower by 10 to 80° C. than the baking temperature mentioned above) followed by photocuring treatment to complete the curing. Alternatively, the curing may be completed by quick heat treatment at the baking temperature mentioned above, and subsequent photocuring treatment.

Ultraviolet light is preferably used for the photocuring treatment. The irradiation energy is usually within the range of 100 to 1,000 mJ/cm².

Appropriate combination of thermosetting and photocuring provides further improvement in the flatness of the resist underlayer film.

Next, a resist pattern is formed on the resist underlayer film. The resist pattern may be formed by a general method, specifically, by applying a photoresist solution onto the resist underlayer film (after one or more layers of coating materials are formed as required), followed by prebaking (if necessary), irradiation (photoexposure) with light or electron beam through a predetermined mask, post-exposure baking (PEB) (if necessary), development, rinsing and drying. The resist used in the present invention is a photoresist or an electron beam resist. The photoresist solution used for the formation of the resist pattern is not particularly limited as long as the resist is sensitive to the light that is used for exposure. A positive photoresist may be used.

Examples include chemically amplified photoresists composed of a photo acid generator and a binder having a group that is decomposed by an acid to increase the alkali dissolution rate; chemically amplified photoresists composed of an alkali-soluble binder, a photo acid generator, and a low-molecular compound that is decomposed by an acid to increase the alkali dissolution rate of the photoresist; chemically amplified photoresists composed of a photo acid generator, a binder having a group that is decomposed by an acid to increase the alkali dissolution rate, and a low-molecular compound that is decomposed by an acid to increase the alkali dissolution rate of the photoresist; and DNQ-novolak type non-chemically amplified photoresists that utilize the difference in alkali dissolution rate between exposed portions and unexposed portions. Specific examples include PAR710 (produce name) manufactured by Sumitomo Chemical Co., Ltd., TDUR-P3435LP and THMR-iP1800 (produce names) manufactured by TOKYO OHKA KOGYO CO., LTD., and SEPR430 (produce name) manufactured by Shin-Etsu Chemical Co., Ltd. Negative photoresists may also be used instead of the positive photoresists.

The electron beam resist that is applied on top of the resist underlayer film in the present invention may be, for example, a composition that includes a resin containing a Si—Si bond in the main chain and an aromatic ring at a terminal, and an acid generator generating an acid when irradiated with an electron beam; or a composition that includes poly(p-hydroxystyrene) substituted with an organic group including N-carboxyamine in place of a hydroxy group, and an acid generator generating an acid when irradiated with an electron beam. In the latter electron beam resist composition, the acid generated from the acid generator by electron beam application reacts with the N-carboxyaminoxy group at a polymer side chain, the polymer side chain thus being decomposed into a hydroxy group, and the composition comes to exhibit alkali solubility and is dissolved by an alkaline developing solution to form a resist pattern. Examples of the acid generators that generate an acid upon irradiation with an electron beam include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane and 2-chloro-6-(trichloromethyl)pyridine, onium salts such as triphenylsulfonium salts and diphenyliodonium salts, and sulfonic acid esters such as nitrobenzyl tosylate and dinitrobenzyl tosylate.

The exposure is performed through a mask (a reticle) designed to form a predetermined pattern while using, for example, i-line radiation, KrF excimer laser beam, ArF excimer laser beam, EUV (extreme ultraviolet ray) or EB (electron beam). An alkaline developing solution is used for the development, and conditions are appropriately selected from development temperatures of 5° C. to 50° C., and amounts of development time of 10 seconds to 300 seconds. Examples of the alkaline developing solutions include aqueous alkaline solutions including aqueous solutions of alkali metal hydroxides such as potassium hydroxide and sodium hydroxide, aqueous solutions of quaternary ammonium hydroxides such as tetramethylammonium hydroxide, tetraethylammonium hydroxide and choline, and aqueous solutions of amines such as ethanolamine, propylamine and ethylenediamine. Additional components such as surfactants may be added to the developing solutions. An organic solvent such as butyl acetate may be used in place of the alkaline developing solution to develop portions of the photoresist that remain low in alkali dissolution rate.

Next, the resist underlayer film is dry-etched using the thus-formed resist pattern as a mask. When the inorganic film described above is present on the surface of the semiconductor substrate that is used, the etching process exposes the surface of the inorganic film. When there is no inorganic film on the surface of the semiconductor substrate that is used, the etching process exposes the surface of the semiconductor substrate.

Further, the semiconductor substrate is wet-etched with an aqueous hydrogen peroxide solution through the dry-etched resist underlayer film (and also through the resist pattern when the resist pattern remains on the resist underlayer film) as a mask, thereby forming a desired pattern. Examples of the wet etchants include basic aqueous hydrogen peroxide solutions obtained by adjusting the pH of hydrogen peroxide solution to basic by mixing with a substance showing basicity, for example, ammonia, sodium hydroxide, potassium hydroxide, sodium cyanide, potassium cyanide or an organic amine such as triethanolamine, and acidic aqueous hydrogen peroxide solutions obtained by mixing hydrogen peroxide solution with an inorganic acid such as hydrochloric acid or sulfuric acid. Other wet etchants which may be used are those that can change the pH to basic, for example, a mixture of urea and hydrogen peroxide solution that generates ammonia by thermal decomposition of urea when heated and ends up showing a basic pH. The temperature at which the basic aqueous hydrogen peroxide solution or the acidic aqueous hydrogen peroxide solution is used is desirably 25° C. to 90° C., and more desirably 40° C. to 80° C. The amount of wet etching time is desirably 0.5 minutes to 30 minutes, and more desirably 1 minute to 20 minutes.

A semiconductor device may be manufactured by, as described hereinabove, performing the steps of: forming a resist underlayer film on a semiconductor substrate using the resist underlayer film-forming composition, forming a resist film on the resist underlayer film, forming a resist pattern by applying light or electron beam followed by development, etching the underlayer film through the resist pattern, and processing the semiconductor substrate through the patterned underlayer film.

EXAMPLES

Next, the contents of the present invention will be described in detail by presenting Examples and other experiments. However, it should be construed that the scope of the present invention is not limited to such examples.

The (illustrative) chemical structures and the abbreviations of raw materials used in Synthesis Examples are as follows.

[Chem. 109]

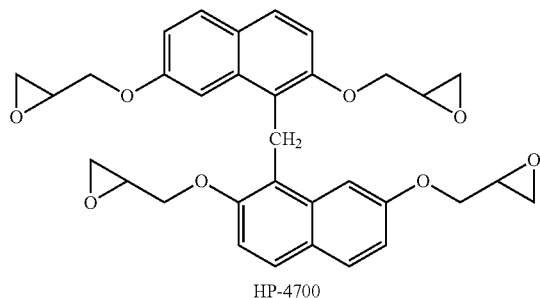

HP-4700

[Chem. 110]

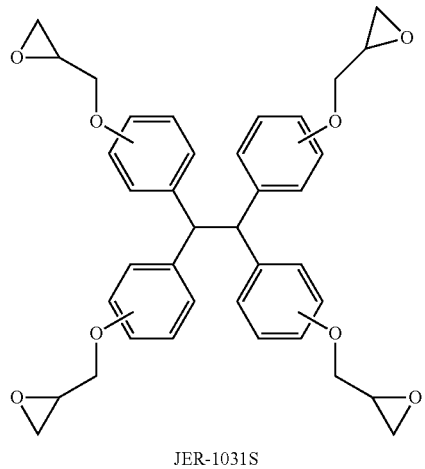

JER-1031S

[Chem. 111]

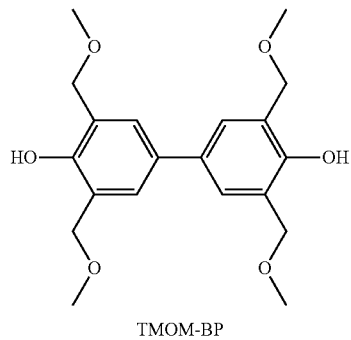

TMOM-BP

[Chem. 112]

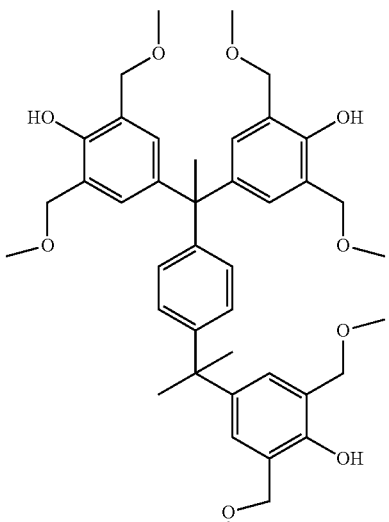

HMOM-TPPA

[Chem. 113]

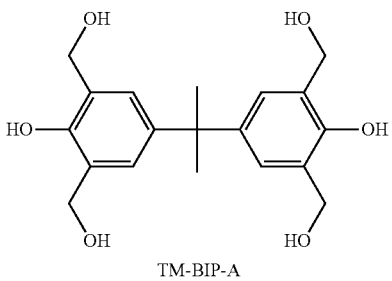

TM-BIP-A

[Chem. 114]

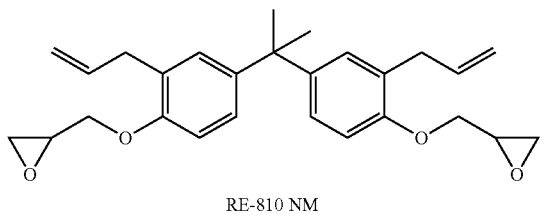

RE-810 NM

[Chem. 115]

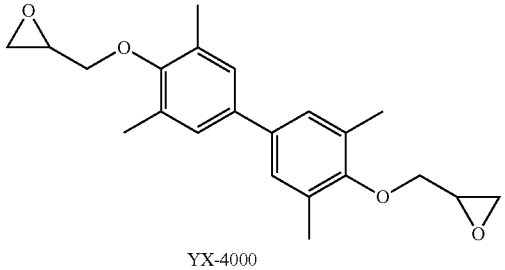

YX-4000

[Chem. 116]

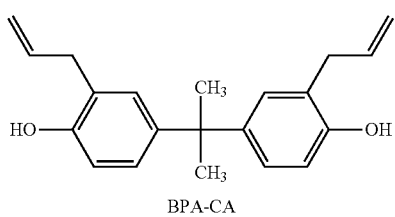

BPA-CA

[Chem. 117]

PL-LI

[Chem. 118]

HP-6000 wherein m indicates an integer of 0 to 3.

[Chem. 119]

NC-7300L

[Chem. 120]

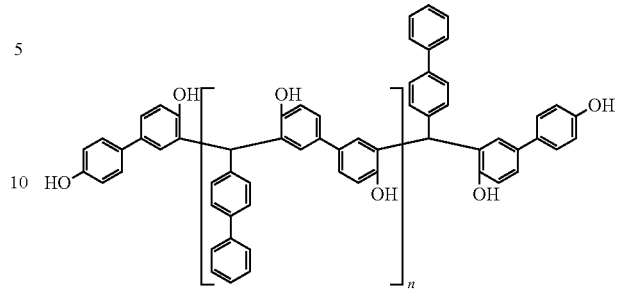

NeoFARIT 7177C
n = 0(61%), n = 1(25%), n = 2(9%), n = 4(5%)

[Chem. 121]

EHPE-3150

The weight average molecular weight of resins (polymers) obtained in Synthesis Examples described below is the results determined by gel permeation chromatography (hereinafter, abbreviated as GPC). The measurement was performed using a GPC device manufactured by TOSOH CORPORATION under the following measurement conditions.

GPC columns: Shodex KF803L, Shodex KF802 and Shodex KF801 (registered trademarks) (SHOWA DENKO K.K.)

Column temperature: 40° C.

Solvent: Tetrahydrofuran (THF)

Flow rate: 1.0 ml/min

Standard samples: Polystyrenes (manufactured by TOSOH CORPORATION)

Synthesis Example 1

A 100 mL two-necked flask was charged with 12.17 g of 2-hydroxy-1-naphthaldehyde (manufactured by Tokyo Chemical Industry Co., Ltd.), 15.00 g of HP-6000 (manufactured by DIC CORPORATION), 0.60 g of ethyltriphenylphosphonium bromide (manufactured by HOKKO CHEMICAL INDUSTRY CO., LTD.) and 27.76 g of propylene glycol monomethyl ether (hereinafter abbreviated as PGME in the present specification). The solution was heated to 140° C. and was stirred under reflux for about 17.5 hours. After the completion of the reaction, 27.8 g of an anion exchange resin (produce name: DOWEX [registered trademark] 550A, Muromachi Technos Co., Ltd.) and 27.8 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-1). The weight average molecular weight Mw in terms of polystyrene measured by GPC was 660.

[Chem. 122]

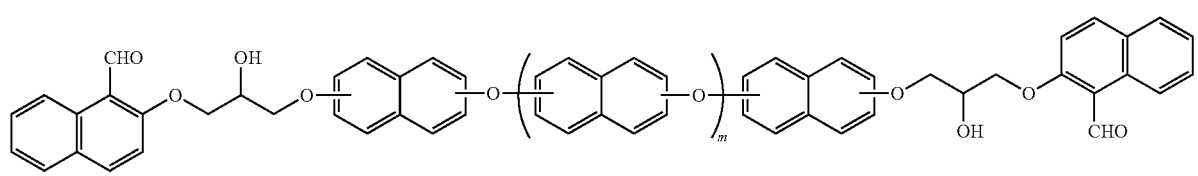

Formula (1-1)

Synthesis Example 2

A 100 mL two-necked flask was charged with 15.36 g of 2-hydroxy-1-naphthaldehyde (manufactured by Tokyo Chemical Industry Co., Ltd.), 15.00 g of YX-4000 (manufactured by Mitsubishi Chemical Corporation), 0.75 g of ethyltriphenylphosphonium bromide (manufactured by HOKKO CHEMICAL INDUSTRY CO., LTD.) and 31.1 g of PGME. The solution was heated to 140° C. and was stirred under reflux for about 17.5 hours. After the completion of the reaction, 31.1 g of an anion exchange resin (produce name: DOWEX [registered trademark] 550A, Muromachi Technos Co., Ltd.) and 31.1 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-2). The weight average molecular weight Mw in terms of polystyrene measured by GPC was 590.

[Chem. 123]

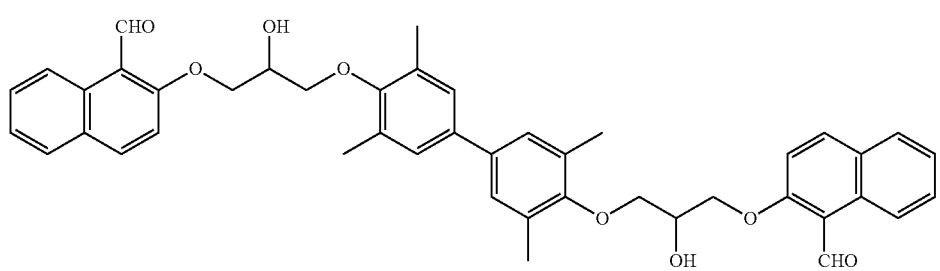

Formula (1-2)

Synthesis Example 3

A 100 mL two-necked flask was charged with 17.55 g of 2-hydroxy-1-naphthaldehyde (manufactured by Tokyo Chemical Industry Co., Ltd.), 15.00 g of HP-4700 (manufactured by DIC Corporation), 0.86 g of ethyltriphenylphosphonium bromide (manufactured by HOKKO CHEMICAL INDUSTRY CO., LTD.) and 33.4 g of PGME. The solution was heated to 140° C. and was stirred under reflux for about 17.5 hours. After the completion of the reaction, 33.4 g of an anion exchange resin (produce name: DOWEX [registered trademark] 550A, Muromachi Technos Co., Ltd.) and 33.4 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-3). The weight average molecular weight Mw in terms of polystyrene measured by GPC was 1,100.

[Chem. 124]

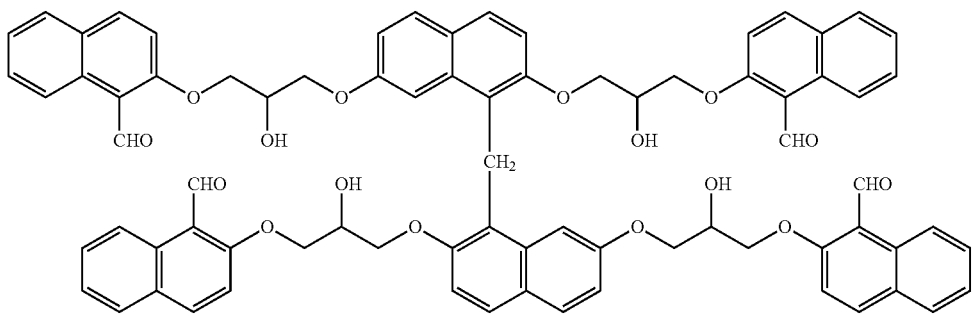

Formula (1-3)

Synthesis Example 4

A 100 mL two-necked flask was charged with 13.50 g of 2-hydroxy-1-naphthaldehyde (manufactured by Tokyo Chemical Industry Co., Ltd.), 9.30 g of GT-401 (ε-caprolactone modified with tetra(3,4-epoxycyclohexylmethyl) butanetetracarboxylate, manufactured by Daicel Corporation), 0.66 g of ethyltriphenylphosphonium bromide (manufactured by HOKKO CHEMICAL INDUSTRY CO., LTD.) and 22.8 g of PGME. The solution was heated to 140° C. and was stirred under reflux for about 17.5 hours. After the completion of the reaction, 20.6 g of an anion exchange resin (produce name: DOWEX [registered trademark] 550A, Muromachi Technos Co., Ltd.) and 20.6 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-4). The weight average molecular weight Mw in terms of polystyrene measured by GPC was 1,200.

[Chem. 125]

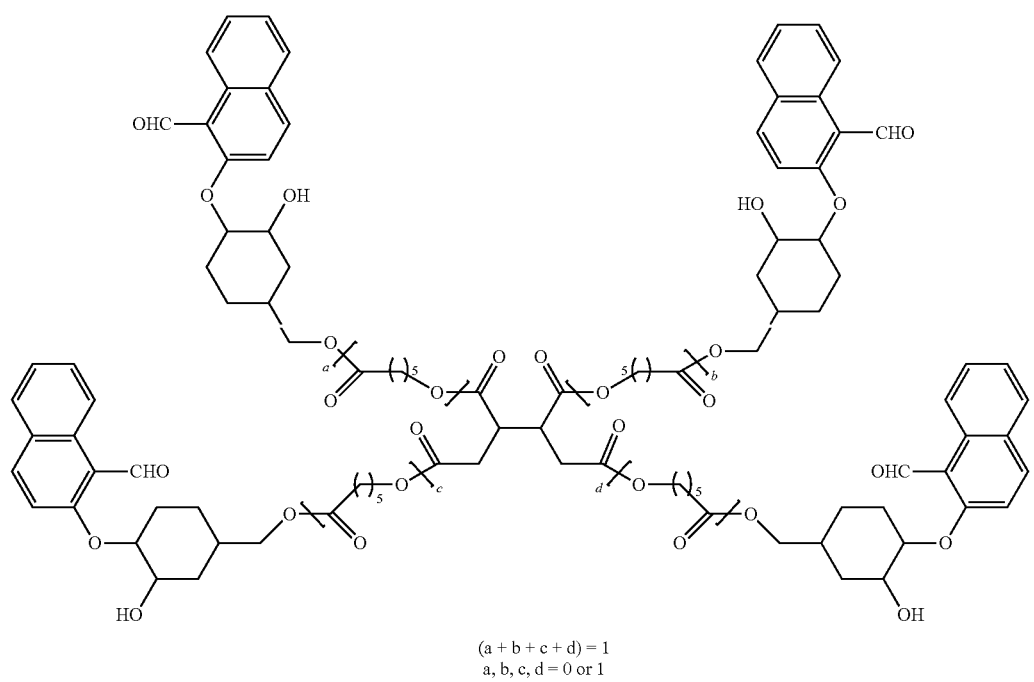

Formula (1-4)

$(a + b + c + d) = 1$
$a, b, c, d = 0 \text{ or } 1$

Synthesis Example 5

A 100 mL two-necked flask was charged with 12.19 g of 2-hydroxy-1-naphthaldehyde (manufactured by Tokyo Chemical Industry Co., Ltd.), 15.00 g of 9,9-bis(4-glycidyloxyphenyl)fluorene (manufactured by Tokyo Chemical Industry Co., Ltd.), 0.60 g of ethyltriphenylphosphonium bromide (manufactured by HOKKO CHEMICAL INDUSTRY CO., LTD.) and 27.8 g of PGME. The solution was heated to 140° C. and was stirred under reflux for about 13 hours. After the completion of the reaction, 27.8 g of an anion exchange resin (produce name: DOWEX [registered trademark] 550A, Muromachi Technos Co., Ltd.) and 27.8 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-5). The weight average molecular weight Mw in terms of polystyrene measured by GPC was 610.

Synthesis Example 7

A 100 mL two-necked flask was charged with 8.16 g of terephthalaldehydic acid (manufactured by Tokyo Chemical Industry Co., Ltd.), 8.00 g of HP-4700 (manufactured by DIC Corporation), 0.46 g of ethyltriphenylphosphonium bromide (manufactured by HOKKO CHEMICAL INDUSTRY CO., LTD.) and 38.7 g of PGME. The solution was heated to 140° C. and was stirred under reflux for about 14 hours. After the completion of the reaction, 16.6 g of an anion exchange resin (produce name: DOWEX [registered trademark] 550A, Muromachi Technos Co., Ltd.) and 16.6 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-7). The weight average molecular weight Mw in terms of polystyrene measured by GPC was 1,450.

[Chem. 126]

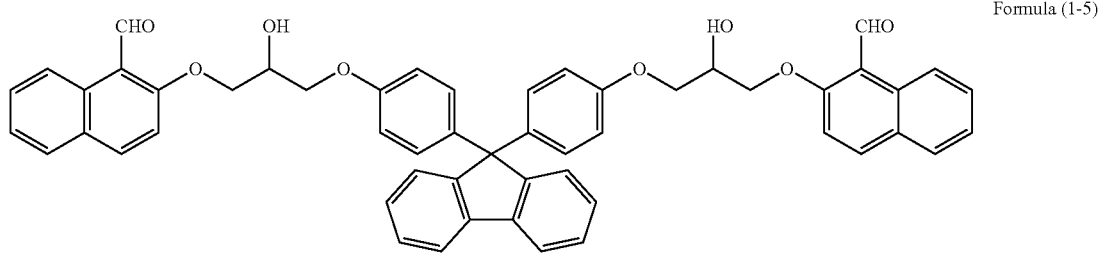

Formula (1-5)

Synthesis Example 6

A 100 mL two-necked flask was charged with 13.33 g of 2-hydroxy-1-naphthaldehyde (manufactured by Tokyo Chemical Industry Co., Ltd.), 15.00 g of RE810-NM (manufactured by Nippon Kayaku Co., Ltd.), 0.65 g of ethyltriphenylphosphonium bromide (manufactured by HOKKO CHEMICAL INDUSTRY CO., LTD.) and 28.9 g of PGME. The solution was heated to 140° C. and was stirred under reflux for about 13 hours. After the completion of the reaction, 29.0 g of an anion exchange resin (produce name: DOWEX [registered trademark] 550A, Muromachi Technos Co., Ltd.) and 29.0 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-6). The weight average molecular weight Mw in terms of polystyrene measured by GPC was 780.

[Chem. 127]

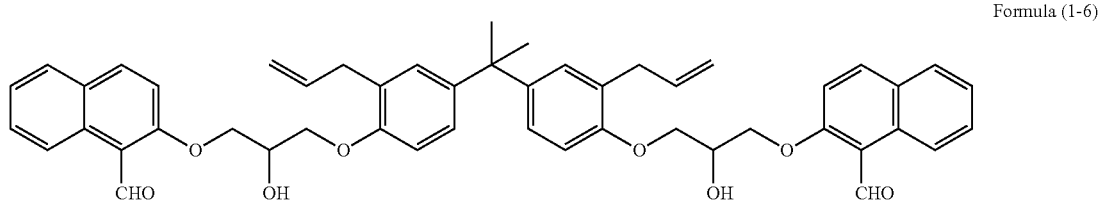

Formula (1-6)

[Chem. 128]

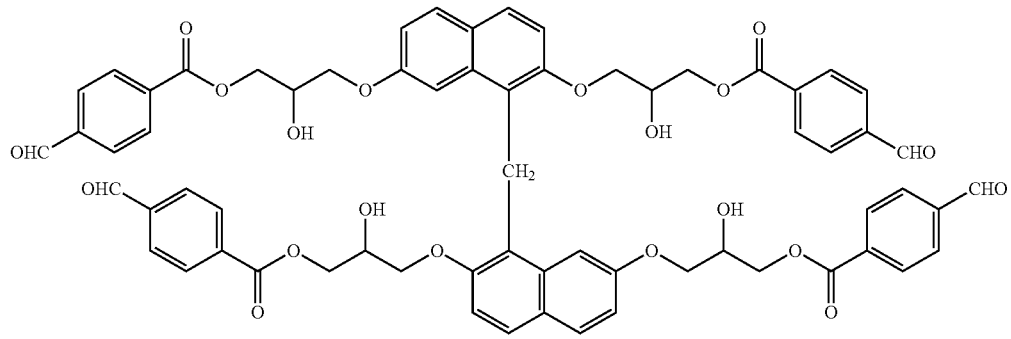

Formula (1-7)

Synthesis Example 8

A 100 mL two-necked flask was charged with 4.59 g of 4-hydroxy-isophthalaldehyde (manufactured by Tokyo Chemical Industry Co., Ltd.), 4.50 g of HP-4700 (manufactured by DIC Corporation), 0.26 g of ethyltriphenylphosphonium bromide (manufactured by HOKKO CHEMICAL INDUSTRY CO., LTD.) and 9.34 g of PGME. The solution was heated to 140° C. and was stirred under reflux for about 14 hours. After the completion of the reaction, 9.3 g of an anion exchange resin (produce name: DOWEX [registered trademark] 550A, Muromachi Technos Co., Ltd.) and 9.3 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-8). The weight average molecular weight Mw in terms of polystyrene measured by GPC was 1,500.

acetate (hereinafter abbreviated as PGMEA in the present specification). An anion exchange resin (produce name: DOWEX [registered trademark] 550A, Muromachi Technos Co., Ltd.) and a cation exchange resin (produce name: Amberlite [registered trademark] 15JWET, ORGANO CORPORATION) were added, and ion exchange treatment was performed at room temperature for 4 hours.

Separation of the ion exchange resins gave a compound solution (1-9).

Synthesis Example 10

A 100 mL two-necked flask was charged with 72.46 g of PGME, 26.00 g of RE810-NM (manufactured by Nippon Kayaku Co., Ltd.), 20.81 g of BPA-CA (manufactured by KONISHI CHEMICAL IND CO., LTD.), 2.18 g of ethyltriphenylphosphonium bromide and 0.32 g of hydroquinone. The reaction was performed at 140° C. for 24 hours to give a solution containing the reaction product. After the solution was diluted to 20% by mass with PGME, 147.90 g of an

[Chem. 129]

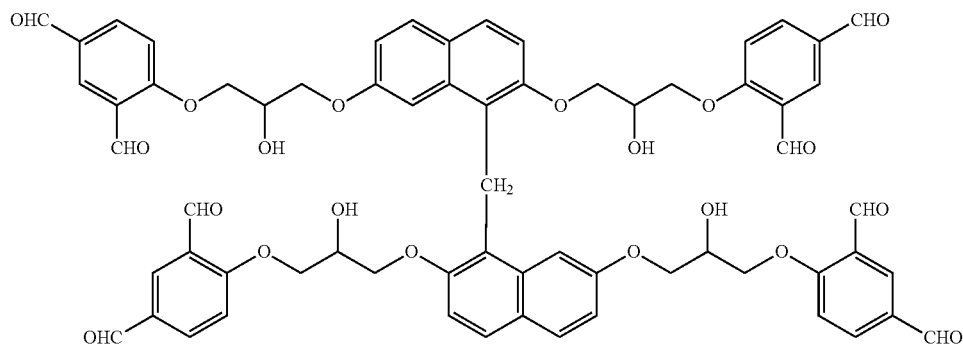

Formula (1-8)

Synthesis Example 9

A polymer was obtained by the method described in Synthesis Example 10 of Japanese Patent No. 6191831. The weight average molecular weight Mw in terms of polystyrene measured by GPC was 2,000. The polymer obtained was dissolved into propylene glycol monomethyl ether anion exchange resin (produce name: DOWEX [registered trademark] 550A, Muromachi Technos Co., Ltd.) and 147.90 g of a cation exchange resin (produce name: Amberlite [registered trademark] 15JWET, ORGANO CORPORATION) were added. The mixture was stirred at 60° C. for 4 hours and was filtered to separate the resins. A solution of a compound having a structure of formula (1-10) was then obtained. The weight average molecular weight Mw in terms of polystyrene measured by GPC was 18,000.

[Chem. 130]

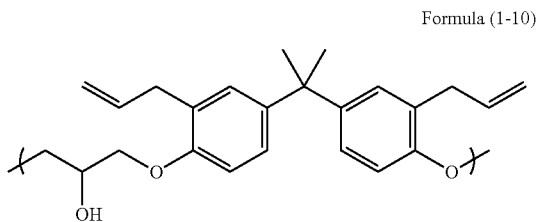

Formula (1-10)

Synthesis Example 11

A 100 mL two-necked flask was charged with 4.37 g of acrylic acid (manufactured by Tokyo Chemical Industry Co., Ltd.), 10.00 g of HP-4700 (manufactured by DIC Corporation), 0.56 g of ethyltriphenylphosphonium bromide (manufactured by HOKKO CHEMICAL INDUSTRY CO., LTD.), 0.03 g of hydroquinone (manufactured by Tokyo Chemical Industry Co., Ltd.) and 34.91 g of PGME. The solution was heated to 100° C. and was stirred under reflux for about 21 hours. After the completion of the reaction, 15.0 g of an anion exchange resin (produce name: DOWEX [registered trademark] 550A, Muromachi Technos Co., Ltd.) and 15.0 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-11). The weight average molecular weight Mw in terms of polystyrene measured by GPC was 1,400.

filtered through a polytetrafluoroethylene microfilter having a pore size of 0.1 μm. A solution of a resist underlayer film-forming composition was thus prepared.

Example 2

A solution was obtained by adding 0.05 g of PGMEA containing 1% by mass of a surfactant (MEGAFACE R-40 manufactured by DIC CORPORATION), 0.62 g of the solution from Synthesis Example 2 of the compound having the structure of formula (1-2) (solid content: 23.6% by mass), 0.73 g of PGME containing 2% by mass of pyridinium p-hydroxybenzenesulfonate (Tokyo Chemical Industry Co., Ltd.), 5.35 g of PGMEA and 1.61 g of PGME to 1.63 g of the compound solution (1-9) obtained in Synthesis Example 9 (solid content: 29.9% by mass). The solution was filtered through a polytetrafluoroethylene microfilter having a pore size of 0.1 μm. A solution of a resist underlayer film-forming composition was thus prepared.

Example 3

A solution was obtained by adding 0.05 g of PGMEA containing 1% by mass of a surfactant (MEGAFACE R-40 manufactured by DIC CORPORATION), 0.57 g of the solution from Synthesis Example 3 of the compound having the structure of formula (1-3) (solid content: 25.9% by mass), 0.73 g of PGME containing 2% by mass of pyridinium p-hydroxybenzenesulfonate (Tokyo Chemical Industry Co., Ltd.), 5.35 g of PGMEA and 1.67 g of PGME to 1.63 g of the compound solution (1-9) obtained in Synthesis Example 9 (solid content: 29.9% by mass). The solution was filtered through a polytetrafluoroethylene microfilter having a pore size of 0.1 μm. A solution of a resist underlayer film-forming composition was thus prepared.

Example 4

A solution was obtained by adding 0.05 g of PGMEA containing 1% by mass of a surfactant (MEGAFACE R-40

[Chem. 131]

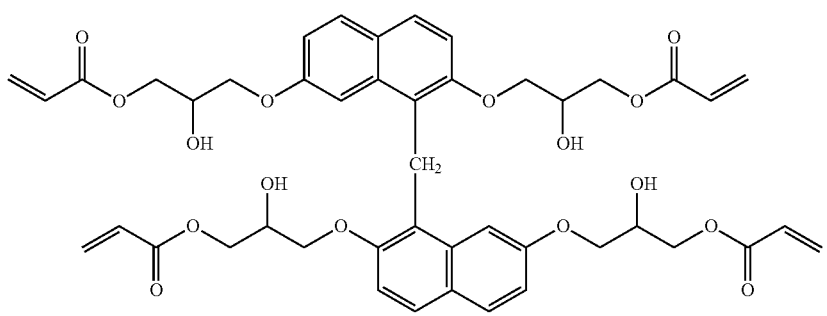

Formula (1-11)

Example 1

A solution was obtained by adding 0.05 g of PGMEA containing 1% by mass of a surfactant (MEGAFACE R-40 manufactured by DIC CORPORATION), 0.60 g of the solution from Synthesis Example 1 of the compound having the structure of formula (1-1) (solid content: 24.2% by mass), 0.73 g of PGME containing 2% by mass of pyridinium p-hydroxybenzenesulfonate (Tokyo Chemical Industry Co., Ltd.), 5.35 g of PGMEA and 1.63 g of PGME to 3.34 g of the compound solution (1-9) obtained in Synthesis Example 9 (solid content: 29.9% by mass). The solution was manufactured by DIC CORPORATION), 0.68 g of the solution from Synthesis Example 4 of the compound having the structure of formula (1-4) (solid content: 21.5% by mass), 0.73 g of PGME containing 2% by mass of pyridinium p-hydroxybenzenesulfonate (Tokyo Chemical Industry Co., Ltd.), 5.35 g of PGMEA and 1.55 g of PGME to 1.63 g of the compound solution (1-9) obtained in Synthesis Example 9 (solid content: 29.9% by mass). The solution was filtered through a polytetrafluoroethylene microfilter having a pore size of 0.1 μm. A solution of a resist underlayer film-forming composition was thus prepared.

Example 5

A solution was obtained by adding 0.05 g of PGMEA containing 1% by mass of a surfactant (MEGAFACE R-40 manufactured by DIC CORPORATION), 0.54 g of the solution from Synthesis Example 5 of the compound having the structure of formula (1-5) (solid content: 27.1% by mass), 0.73 g of PGME containing 2% by mass of pyridinium p-hydroxybenzenesulfonate (Tokyo Chemical Industry Co., Ltd.), 5.35 g of PGMEA and 1.69 g of PGME to 1.63 g of the compound solution (1-9) obtained in Synthesis Example 9 (solid content: 29.9% by mass). The solution was filtered through a polytetrafluoroethylene microfilter having a pore size of 0.1 μm. A solution of a resist underlayer film-forming composition was thus prepared.

Example 6

A solution was obtained by adding 0.05 g of PGMEA containing 1% by mass of a surfactant (MEGAFACE R-40 manufactured by DIC CORPORATION), 0.63 g of the solution from Synthesis Example 6 of the compound having the structure of formula (1-6) (solid content: 23.4% by mass), 0.73 g of PGME containing 2% by mass of pyridinium p-hydroxybenzenesulfonate (Tokyo Chemical Industry Co., Ltd.), 5.35 g of PGMEA and 1.61 g of PGME to 1.63 g of the compound solution (1-9) obtained in Synthesis Example 9 (solid content: 29.9% by mass). The solution was filtered through a polytetrafluoroethylene microfilter having a pore size of 0.1 μm. A solution of a resist underlayer film-forming composition was thus prepared.

Example 7

A solution was obtained by adding 0.09 g of PGMEA containing 1% by mass of a surfactant (MEGAFACE R-40 manufactured by DIC CORPORATION), 1.06 g of the solution from Synthesis Example 7 of the compound having the structure of formula (1-7) (solid content: 25.5% by mass), 1.35 g of PGME containing 2% by mass of pyridinium p-hydroxybenzenesulfonate (Tokyo Chemical Industry Co., Ltd.), 7.46 g of PGMEA and 2.02 g of PGME to 3.02 g of the compound solution (1-9) obtained in Synthesis Example 9 (solid content: 29.9% by mass). The solution was filtered through a polytetrafluoroethylene microfilter having a pore size of 0.1 μm. A solution of a resist underlayer film-forming composition was thus prepared.

Example 8

A solution was obtained by adding 0.09 g of PGMEA containing 1% by mass of a surfactant (MEGAFACE R-40 manufactured by DIC CORPORATION), 1.64 g of the solution from Synthesis Example 8 of the compound having the structure of formula (1-8) (solid content: 16.5% by mass), 1.35 g of PGME containing 2% by mass of pyridinium p-hydroxybenzenesulfonate (Tokyo Chemical Industry Co., Ltd.), 0.56 g of PGMEA, 0.06 g of PGME and 8.28 g of cyclohexanone to 3.02 g of the compound solution (1-9) obtained in Synthesis Example 9 (solid content: 29.9% by mass). The solution was filtered through a polytetrafluoroethylene microfilter having a pore size of 0.1 μm. A solution of a resist underlayer film-forming composition was thus prepared.

Example 9

A solution was obtained by adding 0.10 g of PGMEA containing 1% by mass of a surfactant (MEGAFACE R-40 manufactured by DIC CORPORATION), 1.73 g of the solution from Synthesis Example 1 of the compound having the structure of formula (1-1) (solid content: 24.2% by mass), 1.57 g of PGME containing 2% by mass of pyridinium p-hydroxybenzenesulfonate (Tokyo Chemical Industry Co., Ltd.), 3.95 g of PGMEA and 3.50 g of PGME to 4.15 g of the solution from Synthesis Example 11 of the compound having the structure of formula (1-11) (solid content: 25.3% by mass). The solution was filtered through a polytetrafluoroethylene microfilter having a pore size of 0.1 μm. A solution of a resist underlayer film-forming composition was thus prepared.

Example 10

A solution was obtained by adding 0.10 g of PGMEA containing 1% by mass of a surfactant (MEGAFACE R-40 manufactured by DIC CORPORATION), 1.63 g of the solution from Synthesis Example 3 of the compound having the structure of formula (1-3) (solid content: 25.9% by mass), 1.57 g of PGME containing 2% by mass of pyridinium p-hydroxybenzenesulfonate (Tokyo Chemical Industry Co., Ltd.), 3.95 g of PGMEA and 3.61 g of PGME to 4.15 g of the solution from Synthesis Example 11 of the compound having the structure of formula (1-11) (solid content: 25.3% by mass). The solution was filtered through a polytetrafluoroethylene microfilter having a pore size of 0.1 μm. A solution of a resist underlayer film-forming composition was thus prepared.

Example 11

A solution was obtained by adding 0.10 g of PGMEA containing 1% by mass of a surfactant (MEGAFACE R-40 manufactured by DIC CORPORATION), 1.73 g of the solution from Synthesis Example 1 of the compound having the structure of formula (1-1) (solid content: 24.2% by mass), 1.57 g of PGME containing 2% by mass of pyridinium p-hydroxybenzenesulfonate (Tokyo Chemical Industry Co., Ltd.), 6.74 g of PGMEA and 1.20 g of PGME to 3.66 g of PGMEA containing NeoFARIT 7177C (manufactured by MITSUBISHI GAS CHEMICAL COMPANY, INC.) (solid content: 28.7% by mass). The solution was filtered through a polytetrafluoroethylene microfilter having a pore size of 0.1 μm. A solution of a resist underlayer film-forming composition was thus prepared.

Example 12

A solution was obtained by adding 0.10 g of PGMEA containing 1% by mass of a surfactant (MEGAFACE R-40 manufactured by DIC CORPORATION), 1.62 g of the solution from Synthesis Example 3 of the compound having the structure of formula (1-3) (solid content: 25.9% by mass), 1.57 g of PGME containing 2% by mass of pyridinium p-hydroxybenzenesulfonate (Tokyo Chemical Industry Co., Ltd.), 6.74 g of PGMEA and 1.31 g of PGME to 3.66 g of PGMEA containing NeoFARIT 7177C (manufactured by MITSUBISHI GAS CHEMICAL COMPANY, INC.) (solid content: 28.7% by mass). The solution was filtered through a polytetrafluoroethylene microfilter having a pore size of 0.1 µm. A solution of a resist underlayer film-forming composition was thus prepared.

Example 13

A solution was obtained by adding 0.10 g of PGMEA containing 1% by mass of a surfactant (MEGAFACE R-40 manufactured by DIC CORPORATION), 1.73 g of the solution from Synthesis Example 1 of the compound having the structure of formula (1-1) (solid content: 24.2% by mass), 1.57 g of PGME containing 2% by mass of pyridinium p-hydroxybenzenesulfonate (Tokyo Chemical Industry Co., Ltd.), 3.95 g of PGMEA and 2.43 g of PGME to 5.22 g of the solution from Synthesis Example 10 of the compound having the structure of formula (1-10) (solid content: 20.1% by mass). The solution was filtered through a polytetrafluoroethylene microfilter having a pore size of 0.1 µm. A solution of a resist underlayer film-forming composition was thus prepared.

Example 14

A solution was obtained by adding 0.10 g of PGMEA containing 1% by mass of a surfactant (MEGAFACE R-40 manufactured by DIC CORPORATION), 1.62 g of the solution from Synthesis Example 3 of the compound having the structure of formula (1-3) (solid content: 25.9% by mass), 1.57 g of PGME containing 2% by mass of pyridinium p-hydroxybenzenesulfonate (Tokyo Chemical Industry Co., Ltd.), 3.95 g of PGMEA and 2.54 g of PGME to 5.22 g of the solution from Synthesis Example 10 of the compound having the structure of formula (1-10) (solid content: 20.1% by mass). The solution was filtered through a polytetrafluoroethylene microfilter having a pore size of 0.1 µm. A solution of a resist underlayer film-forming composition was thus prepared.

Comparative Example 1

A solution was obtained by adding 0.09 g of PGMEA containing 1% by mass of a surfactant (MEGAFACE R-40 manufactured by DIC CORPORATION), 0.27 g of TMOM-BP (manufactured by Honshu Chemical Industry Co., Ltd.), 1.35 g of PGME containing 2% by mass of pyridinium p-hydroxybenzenesulfonate (Tokyo Chemical Industry Co., Ltd.), 7.46 g of PGMEA and 2.81 g of PGME to 3.02 g of the compound solution (1-9) obtained in Synthesis Example 9 (solid content: 29.9% by mass). The solution was filtered through a polytetrafluoroethylene microfilter having a pore size of 0.1 µm. A solution of a resist underlayer film-forming composition was thus prepared.

Comparative Example 2

A solution was obtained by adding 0.09 g of PGMEA containing 1% by mass of a surfactant (MEGAFACE R-40 manufactured by DIC CORPORATION), 0.27 g of PL-LI (manufactured by Midori Kagaku Co., Ltd.), 1.35 g of PGME containing 2% by mass of pyridinium p-hydroxybenzenesulfonate (Tokyo Chemical Industry Co., Ltd.), 7.46 g of PGMEA and 2.81 g of PGME to 3.02 g of the compound solution (1-9) obtained in Synthesis Example 9 (solid content: 29.9% by mass). The solution was filtered through a polytetrafluoroethylene microfilter having a pore size of 0.1 µm. A solution of a resist underlayer film-forming composition was thus prepared.

Comparative Example 3

A solution was obtained by adding 0.10 g of PGMEA containing 1% by mass of a surfactant (MEGAFACE R-40 manufactured by DIC CORPORATION), 0.42 g of PL-LI (manufactured by Midori Kagaku Co., Ltd.), 1.57 g of PGME containing 2% by mass of pyridinium p-hydroxybenzenesulfonate (Tokyo Chemical Industry Co., Ltd.), 3.95 g of PGMEA and 4.18 g of PGME to 4.15 g of the solution from Synthesis Example 11 of the compound having the structure of formula (1-11) (solid content: 25.3% by mass). The solution was filtered through a polytetrafluoroethylene microfilter having a pore size of 0.1 µm. A solution of a resist underlayer film-forming composition was thus prepared.

Comparative Example 4

A solution was obtained by adding 0.10 g of PGMEA containing 1% by mass of a surfactant (MEGAFACE R-40 manufactured by DIC CORPORATION), 0.42 g of PL-LI (manufactured by Midori Kagaku Co., Ltd.), 1.57 g of PGME containing 2% by mass of pyridinium p-hydroxybenzenesulfonate (Tokyo Chemical Industry Co., Ltd.), 6.74 g of PGMEA and 2.51 g of PGME to 3.66 g of PGMEA containing NeoFARIT 7177C (manufactured by MITSUBISHI GAS CHEMICAL COMPANY, INC.) (solid content: 28.7% by mass). The solution was filtered through a polytetrafluoroethylene microfilter having a pore size of 0.1 µm. A solution of a resist underlayer film-forming composition was thus prepared.

Comparative Example 5

A solution was obtained by adding 0.10 g of PGMEA containing 1% by mass of a surfactant (MEGAFACE R-40 manufactured by DIC CORPORATION), 0.42 g of PL-LI (manufactured by Midori Kagaku Co., Ltd.), 1.57 g of PGME containing 2% by mass of pyridinium p-hydroxybenzenesulfonate (Tokyo Chemical Industry Co., Ltd.), 3.95 g of PGMEA and 3.74 g of PGME to 5.22 g of the solution from Synthesis Example 10 of the compound having the structure of formula (1-10) (solid content: 20.1% by mass). The solution was filtered through a polytetrafluoroethylene microfilter having a pore size of 0.1 μm. A solution of a resist underlayer film-forming composition was thus prepared.

(Test of Dissolution into Resist Solvents)

The solutions of the resist underlayer film-forming compositions prepared in Comparative Examples 1 to 5 and Examples 1 to 14 were each applied onto a silicon wafer using a spin coater, and the coatings were calcined on a hot plate at 300° C. for 60 seconds to form resist underlayer films (film thickness: 0.20 μm). These resist underlayer films were soaked in resist solvents, specifically, ethyl lactate, propylene glycol monomethyl ether, propylene glycol monomethyl ether acetate and cyclohexanone. The resist underlayer films were insoluble in these solvents.

(Determination of Curing Finish Temperature)

The solutions of the resist underlayer film-forming compositions prepared in Comparative Examples 1 to 2 and Examples 1 to 8 were each applied onto a silicon wafer using a spin coater. The coatings were calcined on a hot plate at various temperatures for 60 seconds to form resist underlayer films (film thickness: 0.20 μm). The temperature (the curing finish temperature) was measured at which the resist underlayer film became insoluble in a 7:3 mixed solvent of propylene glycol monomethyl ether and propylene glycol monomethyl ether acetate. The same procedures as in the test of dissolution into resist solvents were carried out. Table 1 shows the results.

TABLE 1

Curing finish temperature

| | Curing finish temperature (° C.) |
|---|---|
| Comparative Example 1 | 180 |
| Comparative Example 2 | 180 |
| Example 1 | 300 |
| Example 2 | 300 |
| Example 3 | 280 |
| Example 4 | 300 |
| Example 5 | 300 |
| Example 6 | 280 |
| Example 7 | 300 |
| Example 8 | 240 |

Examples 1 to 8 resulted in a higher curing finish temperature than Comparative Examples 1 and 2. These results show that the crosslinking agents used in Examples provide a higher fluidity and slower curing than the conventional cros slinking agents.

(Measurement of Optical Constants)

The solutions of the resist underlayer film-forming compositions prepared in Comparative Examples 1 to 5 and Examples 1 to 14 were each applied onto a silicon wafer using a spin coater, and the coatings were calcined on a hot plate at 300° C. for 60 seconds to form resist underlayer films (film thickness: 0.05 μm). These resist underlayer films were analyzed with a spectroscopic ellipsometer to measure the refractive index (n value) and the optical absorption coefficient (k value, also called the attenuation coefficient) at a wavelength of 193 nm. Table 2 shows the results.

TABLE 2

Refractive index n and optical absorption coefficient k

| | | n/k 193 nm |
|---|---|---|
| Comparative Example 1 | 300° C. Calcined film | 1.40/0.57 |
| Comparative Example 2 | 300° C. Calcined film | 1.47/0.57 |
| Comparative Example 3 | 300° C. Calcined film | 1.57/0.24 |
| Comparative Example 4 | 300° C. Calcined film | 1.46/0.55 |
| Comparative Example 5 | 300° C. Calcined film | 1.52/0.48 |
| Example 1 | 300° C. Calcined film | 1.41/0.54 |
| Example 2 | 300° C. Calcined film | 1.42/0.52 |
| Example 3 | 300° C. Calcined film | 1.41/0.51 |
| Example 4 | 300° C. Calcined film | 1.44/0.50 |
| Example 5 | 300° C. Calcined film | 1.42/0.56 |
| Example 6 | 300° C. Calcined film | 1.42/0.54 |
| Example 7 | 300° C. Calcined film | 1.43/0.55 |
| Example 8 | 300° C. Calcined film | 1.42-0.53 |
| Example 9 | 300° C. Calcined film | 1.48/0.26 |
| Example 10 | 300° C. Calcined film | 1.47-0.22 |
| Example 11 | 300° C. Calcined film | 1.43/0.55 |
| Example 12 | 300° C. Calcined film | 1.42/0.54 |
| Example 13 | 300° C. Calcined film | 1.47/0.54 |
| Example 14 | 300° C. Calcined film | 1.47/0.52 |

It is possible to significantly change the optical constants of the cros slinking agents by changing the type of the epoxy compound or the aldehyde compound. From the comparison of Examples 1 to 8 using these cros slinking agents with Comparative Examples 1 and 2 using the conventional crosslinking agents, changing the type of the crosslinking agent permits variation of the optical constants of the materials having the same compositional ratio. A similar tendency is seen in Comparative Example 3 vs. Examples 9 and 10, in Comparative Example 4 vs. Examples 11 and 12, and in Comparative Example 5 vs. Examples 13 and 14, showing that the reflectance can be lowered by selecting an appropriate crosslinking agent.

[Measurement of Dry Etching Speed]

The dry etching speed was measured using the following etcher and etching gas:

RIE-10NR (manufactured by Samco) and $CF_4$

The solutions of the resist underlayer film-forming compositions prepared in Comparative Examples 1 to 5 and Examples 1 to 14 were each applied onto a silicon wafer using a spin coater, and the coatings were calcined on a hot plate at 300° C. for 60 seconds to form resist underlayer films (film thickness: 0.20 μm). The dry etching speed was measured using CF4 gas as the etching gas. The dry etching speeds of Comparative Examples 1 to 5 and Examples 1 to 14 were expressed as a relative ratio of dry etching speed. The dry etching speed rates were those of (resist underlayer film)/(KrF photoresist). Table 3 shows the results.

TABLE 3

Relative ratio of dry etching speed

|  |  | Etching rate |
|---|---|---|
| Comparative Example 1 | 300° C. Calcined film | 0.88 |
| Comparative Example 2 | 300° C. Calcined film | 0.95 |
| Comparative Example 3 | 300° C. Calcined film | 1.39 |
| Comparative Example 4 | 300° C. Calcined film | 1.07 |
| Comparative Example 5 | 300° C. Calcined film | 1.16 |
| Example 1 | 300° C. Calcined film | 0.86 |
| Example 2 | 300° C. Calcined film | 0.87 |
| Example 3 | 300° C. Calcined film | 0.87 |
| Example 4 | 300° C. Calcined film | 0.89 |
| Example 5 | 300° C. Calcined film | 0.86 |
| Example 6 | 300° C. Calcined film | 0.87 |
| Example 7 | 300° C. Calcined film | 0.90 |
| Example 8 | 300° C. Calcined film | 0.90 |
| Example 9 | 300° C. Calcined film | 1.15 |
| Example 10 | 300° C. Calcined film | 1.17 |
| Example 11 | 300° C. Calcined film | 0.94 |
| Example 12 | 300° C. Calcined film | 0.95 |
| Example 13 | 300° C. Calcined film | 1.03 |
| Example 14 | 300° C. Calcined film | 1.03 |

It is possible to significantly change the etching rate of the crosslinking agents by changing the type of the epoxy compound or the aldehyde compound. From the comparison of Examples 1 to 8 using these crosslinking agents with Comparative Examples 1 and 2 using the conventional crosslinking agents, changing the type of the crosslinking agent permits variation of the etching rate of the materials having the same compositional ratio. A similar tendency is seen in Comparative Example 3 vs. Examples 9 and 10, in Comparative Example 4 vs. Examples 11 and 12, and in Comparative Example 5 vs. Examples 13 and 14, showing that workability can be enhanced by selecting an appropriate crosslinking agent.

[Evaluation of Gap-Filling Property]

Gap-filling property was evaluated using a 200 nm thick $SiO_2$ substrate. The resist underlayer film-forming compositions prepared in Comparative Examples 1 to 5 and Examples 1 to 14 were each applied to a dense pattern area of the substrate consisting of 50 nm wide trenches at 100 nm pitches, and the coatings were calcined at 300° C. for 60 seconds or at 260° C. for 60 seconds to form resist underlayer films having a thickness of about 200 nm. The flatness of the substrates was evaluated using a scanning electron microscope (S-4800) manufactured by Hitachi High-Tech Corporation by confirming whether the resist underlayer film-forming composition filled the inside of the pattern. Table 4 shows the results. The gap-filling property was evaluated as good (AA) when the resist underlayer film had been formed in the inside of the pattern without any clearances, and were rated as poor (CC) when the resist underlayer film was absent in the inside of the pattern or the inside of the pattern contained holes or clearances.

TABLE 4

Evaluation of gap-filling property

|  |  | Gap-filling property |
|---|---|---|
| Comparative Example 1 | 300° C. Calcined film | AA |
| Comparative Example 2 | 300° C. Calcined film | AA |
| Comparative Example 3 | 300° C. Calcined film | AA |
| Comparative Example 4 | 300° C. Calcined film | AA |
| Comparative Example 5 | 300° C. Calcined film | AA |
| Example 1 | 300° C. Calcined film | AA |
| Example 2 | 300° C. Calcined film | AA |
| Example 3 | 300° C. Calcined film | AA |
| Example 4 | 300° C. Calcined film | AA |
| Example 5 | 300° C. Calcined film | AA |
| Example 6 | 300° C. Calcined film | AA |
| Example 7 | 300° C. Calcined film | AA |
| Example 8 | 300° C. Calcined film | AA |
| Example 9 | 300° C. Calcined film | AA |
| Example 10 | 300° C. Calcined film | AA |
| Example 11 | 300° C. Calcined film | AA |
| Example 12 | 300° C. Calcined film | AA |
| Example 13 | 300° C. Calcined film | AA |
| Example 14 | 300° C. Calcined film | AA |

The compositions of Examples 1 to 14 exhibited similar levels of gap-filling property to the compositions of Comparative Examples 1 to 5 using the conventional crosslinking agents.

[Test of Covering Performance on Stepped Substrate]

To test the covering performance on a stepped substrate, the resist underlayer film-forming compositions prepared in Comparative Examples 1 to 5 and Examples 1 to 14 were each applied to a 200 nm thick $SiO_2$ substrate, and the coatings were calcined at 300° C. for 60 seconds to form resist underlayer films having a thickness of about 200 nm. The coating film thickness was compared between at an 800 nm trenched area (TRENCH) and at an open area (OPEN) free from patterns. The flatness of the substrates was evaluated using a scanning electron microscope (S-4800) manufactured by Hitachi High-Tech Corporation by determining the difference in film thickness between on the trenched area (the patterned area) and on the open area (the pattern-free area) of the stepped substrate (the step height created on the coating film between the trenched area and the open area, called the bias). Table 5 shows the results. Here, the flatness means how small the difference is in the thickness (the iso-trench bias) of the coating film between on the region with the pattern (TRENCH (the patterned area)) and on the region without patterns (the open area (the pattern-free area)). When an Example attained an improvement by 10 nm or more compared to Comparative Examples, the result was rated as BB. When an Example attained an improvement by 30 nm or more compared to Comparative Examples, the result was rated as AA.

TABLE 5

Evaluation of flatness

| | | Flatness |
|---|---|---|
| Comparative Example 2 | 300° C. Calcined film | CC (Control) |
| Comparative Example 3 | 300° C. Calcined film | CC (Control) |
| Comparative Example 4 | 300° C. Calcined film | CC (Control) |
| Comparative Example 5 | 300° C. Calcined film | CC (Control) |
| Example 1 | 300° C. Calcined film | AA |
| Example 2 | 300° C. Calcined film | AA |
| Example 3 | 300° C. Calcined film | AA |
| Example 4 | 300° C. Calcined film | AA |
| Example 5 | 300° C. Calcined film | AA |
| Example 6 | 300° C. Calcined film | AA |
| Example 7 | 300° C. Calcined film | AA |
| Example 8 | 300° C. Calcined film | AA |
| Example 9 | 300° C. Calcined film | BB |
| Example 10 | 300° C. Calcined film | BB |
| Example 11 | 300° C. Calcined film | AA |
| Example 12 | 300° C. Calcined film | AA |
| Example 13 | 300° C. Calcined film | BB |
| Example 14 | 300° C. Calcined film | BB |

Examples attained a marked improvement in flatness from the comparison of Comparative Example 2 with Examples 1 to 8, Comparative Example 3 with Examples 9 and 10, Comparative Example 4 with Examples 11 and 12, and Comparative Example 5 with Examples 13 and 14. These results are probably ascribed to the fact that the crosslinking agents used in Examples had a curing finish temperature higher than that obtained by using the conventional crosslinking agents, and consequently the resins remained fluid for a longer time.

Further, the crosslinking agents according to the present invention may be used as polymers having a self-crosslinking group.

Synthesis Example 12

A 100 mL two-necked flask was charged with 7.91 g of 2-hydroxy-1-naphthaldehyde (manufactured by Tokyo Chemical Industry Co., Ltd.), 9.50 g of NC-7300L (manufactured by Nippon Kayaku Co., Ltd.), 0.39 g of ethyltriphenylphosphonium bromide (manufactured by HOKKO CHEMICAL INDUSTRY CO., LTD.) and 41.5 g of PGME. The solution was heated to 140° C. and was stirred under reflux for about 14 hours. After the completion of the reaction, 17.8 g of an anion exchange resin (produce name: DOWEX [registered trademark] 550A, Muromachi Technos Co., Ltd.) and 17.8 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-12). The weight average molecular weight Mw in terms of polystyrene measured by GPC was 750.

[Chem. 132]

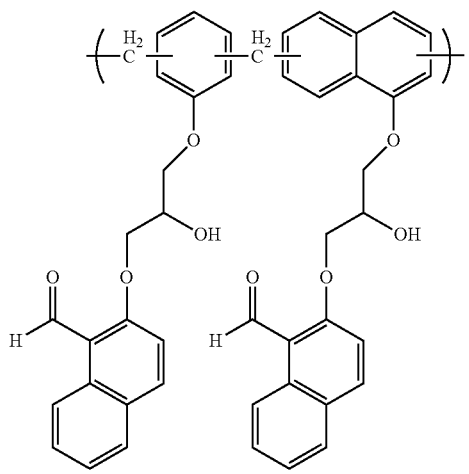

Formula (1-12)

Synthesis Example 13

A 100 mL two-necked flask was charged with 6.86 g of 4-hydroxy-3-methoxybenzaldehyde (manufactured by Tokyo Chemical Industry Co., Ltd.), 9.50 g of HP-4700 (manufactured by DIC Corporation), 0.38 g of ethyltriphenylphosphonium bromide (manufactured by HOKKO CHEMICAL INDUSTRY CO., LTD.) and 39.1 g of PGME. The solution was heated to 140° C. and was stirred under reflux for about 14 hours. After the completion of the reaction, 16.7 g of an anion exchange resin (produce name: DOWEX [registered trademark] 550A, Muromachi Technos Co., Ltd.) and 16.7 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-13). The weight average molecular weight Mw in terms of polystyrene measured by GPC was 750.

[Chem. 133]

Formula (1-13)

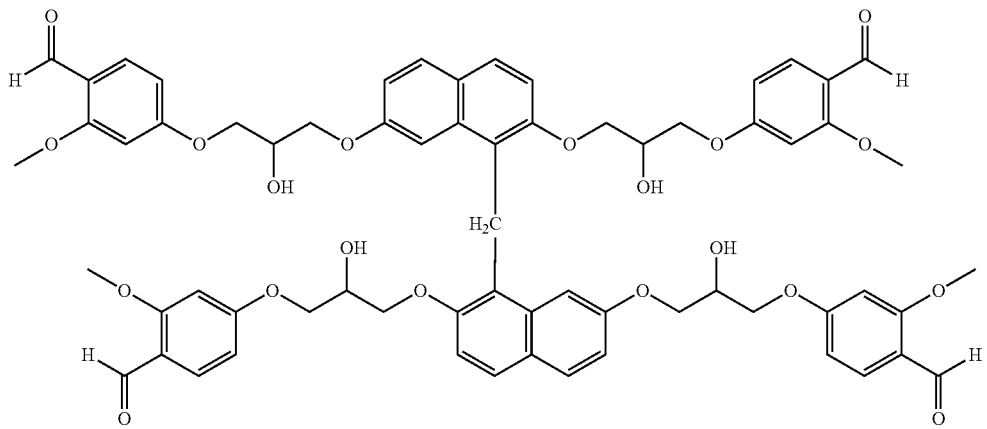

Synthesis Example 14

A 100 mL two-necked flask was charged with 7.16 g of 4-hydroxy-3-methoxybenzaldehyde (manufactured by Tokyo Chemical Industry Co., Ltd.), 9.00 g of JER-1031S (manufactured by Mitsubishi Chemical Corporation), 0.40 g of ethyltriphenylphosphonium bromide (manufactured by HOKKO CHEMICAL INDUSTRY CO., LTD.) and 38.6 g of PGME. The solution was heated to 140° C. and was stirred under reflux for about 14 hours. After the completion of the reaction, 16.6 g of an anion exchange resin (produce name: DOWEX [registered trademark] 550A, Muromachi Technos Co., Ltd.) and 16.6 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-14). The weight average molecular weight Mw in terms of polystyrene measured by GPC was 1,000.

[Chem. 134]

Formula (1-14)

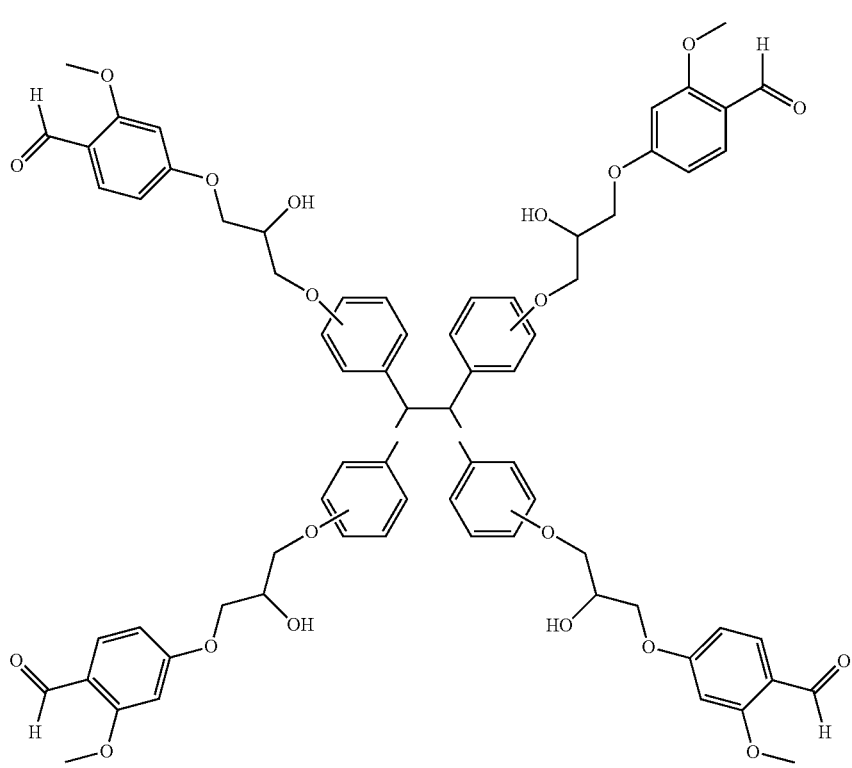

Synthesis Example 15

A 100 mL two-necked flask was charged with 7.21 g of 2-hydroxy-1-naphthaldehyde (manufactured by Tokyo Chemical Industry Co., Ltd.), 8.00 g of JER-1031S (manufactured by Mitsubishi Chemical Corporation), 0.35 g of ethyltriphenylphosphonium bromide (manufactured by HOKKO CHEMICAL INDUSTRY CO., LTD.) and 36.3 g of PGME. The solution was heated to 140° C. and was stirred under reflux for about 14 hours. After the completion of the reaction, 15.6 g of an anion exchange resin (produce name: DOWEX [registered trademark] 550A, Muromachi Technos Co., Ltd.) and 15.6 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-15). The weight average molecular weight Mw in terms of polystyrene measured by GPC was 1,000.

Synthesis Example 16

A 100 mL two-necked flask was charged with 3.19 g of 2-hydroxy-1-naphthaldehyde (manufactured by Tokyo Chemical Industry Co., Ltd.), 3.08 g of 9-anthracenecarboxylic acid, 10.00 g of HP-4700 (manufactured by DIC Corporation), 0.52 g of ethyltriphenylphosphonium bromide (manufactured by HOKKO CHEMICAL INDUSTRY CO., LTD.) and 39.2 g of PGME. The solution was heated to 140° C. and was stirred under reflux for about 14 hours. After the completion of the reaction, 16.8 g of an anion exchange resin (produce name: DOWEX [registered trademark] 550A, Muromachi Technos Co., Ltd.) and 16.8 g of a cation exchange resin (produce name: Amberlite [registered trademark] 15JWET, ORGANO CORPORATION) were added to the solution, and ion exchange treatment was performed at room temperature for 4 hours. Separation of the ion exchange resins gave a solution of a compound having a structure of formula (1-16). The weight average molecular weight Mw in terms of polystyrene measured by GPC was 1,700.

[Chem. 135]

Formula (1-15)

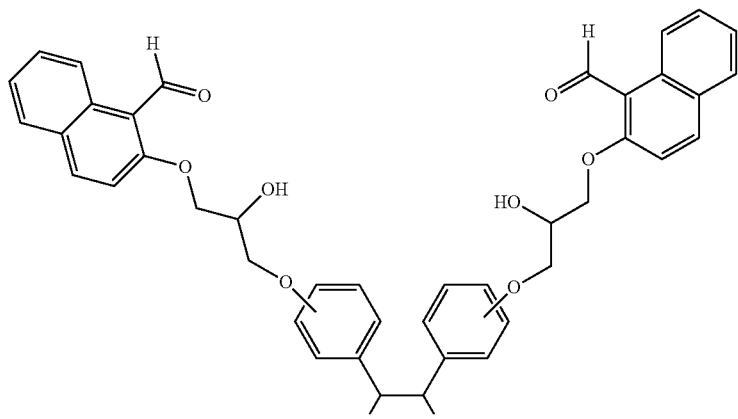

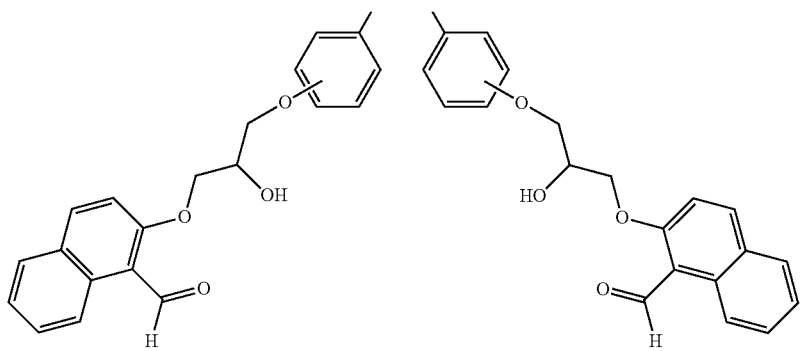

[Chem. 136]

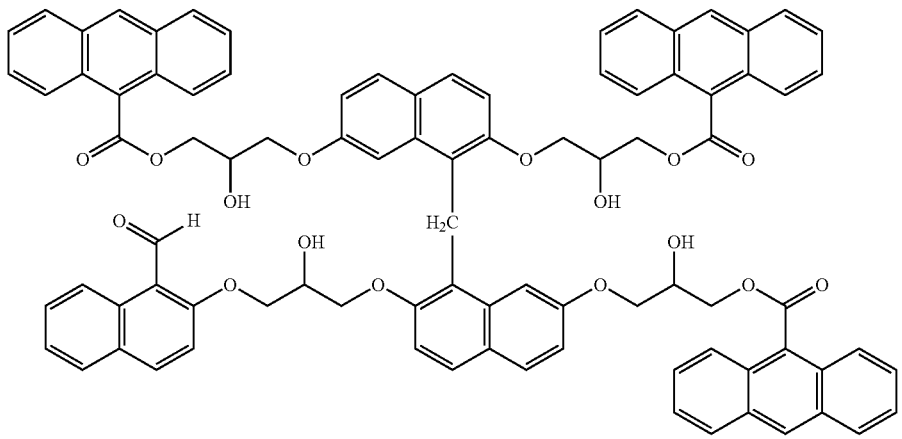

Formula (1-16)

Example 15

A solution was obtained by adding 0.05 g of PGMEA containing 1% by mass of a surfactant (MEGAFACE R-40 manufactured by DIC CORPORATION), 0.22 g of PGME containing 5% by mass of pyridinium p-hydroxybenzenesulfonate, 1.88 g of PGMEA and 2.34 g of PGME to 2.50 g of the solution from Synthesis Example 12 of the compound having the structure of formula (1-12) (solid content: 21.9% by mass). The solution was filtered through a polytetrafluoroethylene microfilter having a pore size of 0.1 μm. A solution of a resist underlayer film-forming composition was thus prepared.

Example 16

A solution was obtained by adding 0.08 g of PGMEA containing 1% by mass of a surfactant (MEGAFACE R-40 manufactured by DIC CORPORATION), 0.31 g of PGME containing 5% by mass of pyridinium p-hydroxybenzenesulfonate, 2.68 g of PGMEA and 4.03 g of PGME to 2.90 g of the solution from Synthesis Example 13 of the compound having the structure of formula (1-13) (solid content: 27.0% by mass). The solution was filtered through a polytetrafluoroethylene microfilter having a pore size of 0.1 μm. A solution of a resist underlayer film-forming composition was thus prepared.

Example 17

A solution was obtained by adding 0.05 g of PGMEA containing 1% by mass of a surfactant (MEGAFACE R-40 manufactured by DIC CORPORATION), 0.47 g of PGME containing 5% by mass of pyridinium p-hydroxybenzenesulfonate, 1.91 g of PGMEA and 2.92 g of PGME to 1.66 g of the solution from Synthesis Example 15 of the compound having the structure of formula (1-15) (solid content: 28.1% by mass). The solution was filtered through a polytetrafluoroethylene microfilter having a pore size of 0.1 μm. A solution of a resist underlayer film-forming composition was thus prepared.

Example 18

A solution was obtained by adding 0.06 g of PGMEA containing 1% by mass of a surfactant (MEGAFACE R-40 manufactured by DIC CORPORATION), 0.22 g of PGME containing 5% by mass of pyridinium p-hydroxybenzenesulfonate, 2.53 g of PGMEA and 1.88 g of PGME to 2.31 g of the solution from Synthesis Example 16 of the compound having the structure of formula (1-16) (solid content: 23.7% by mass). The solution was filtered through a polytetrafluoroethylene microfilter having a pore size of 0.1 μm. A solution of a resist underlayer film-forming composition was thus prepared.

Example 19

A solution was obtained by adding 0.05 g of PGMEA containing 1% by mass of a surfactant (MEGAFACE R-40 manufactured by DIC CORPORATION), 0.47 g of propylene glycol monomethyl ether containing 5% of TPS-Tf (manufactured by Toyo Gosei Co., Ltd., photoacid generator), 1.91 g of PGMEA and 2.72 g of PGME to 1.86 g of the solution from Synthesis Example 14 of the compound having the structure of formula (1-14) (solid content: 25.0% by mass). The solution was filtered through a polytetrafluoroethylene microfilter having a pore size of 0.1 μm. A solution of a resist underlayer film-forming composition was thus prepared.

Example 20

A solution was obtained by adding 0.05 g of PGMEA containing 1% by mass of a surfactant (MEGAFACE R-40 manufactured by DIC CORPORATION), 0.47 g of propylene glycol monomethyl ether containing 5% of TPS-Tf (manufactured by Toyo Gosei Co., Ltd., photoacid generator), 1.79 g of PGMEA and 1.34 g of PGME to 1.66 g of the solution from Synthesis Example 15 of the compound having the structure of formula (1-15) (solid content: 28.1% by mass). The solution was filtered through a polytetrafluoroethylene microfilter having a pore size of 0.1 μm. A solution of a resist underlayer film-forming composition was thus prepared.

Comparative Example 6

A solution was obtained by adding 0.04 g of PGMEA containing 1% by mass of a surfactant (MEGAFACE R-40 manufactured by DIC CORPORATION), 1.79 g of PGMEA and 1.34 g of PGME to 1.82 g of the solution from Synthesis Example 12 of the compound having the structure of formula (1-12) (solid content: 21.9% by mass). The solution was filtered through a polytetrafluoroethylene microfilter having a pore size of 0.1 μm. A solution of a resist underlayer film-forming composition was thus prepared.

Comparative Example 7

A solution was obtained by adding 0.07 g of PGMEA containing 1% by mass of a surfactant (MEGAFACE R-40 manufactured by DIC CORPORATION), 4.72 g of PGMEA and 2.72 g of PGME to 2.49 g of the solution from Synthesis Example 15 of the compound having the structure of formula (1-15) (solid content: 28.1% by mass). The solution was filtered through a polytetrafluoroethylene microfilter having a pore size of 0.1 μm. A solution of a resist underlayer film-forming composition was thus prepared.

(Test of Thermosetting Properties)

The resist underlayer film compositions prepared in Examples 15 to 18 and Comparative Examples 6 and 7 were each applied onto a silicon wafer using a spin coater. The coatings were heated on a hot plate at 280° C. for 60 seconds to form resist underlayer films having a film thickness of 200 nm. These resist underlayer films were immersed in a 7:3 mixed solvent of propylene glycol monomethyl ether and propylene glycol monomethyl ether acetate for 1 minute, and were spin-dried and calcined at 100° C. for 60 seconds. The film thickness was measured, and the residual film ratio was calculated to evaluate the resistance to release into the solvent. Table 6 shows the results.

The films obtained in Examples 15 to 18 were resistant to the solvent as a result of having been crosslinked by the acid generated by heating, and attained a residual film ratio of 100%. In contrast, Comparative Examples 6 and 7 resulted in a residual film ratio of 0%, because no acid was generated by heating, and the material was not crosslinked and failed to attain solvent resistance.

TABLE 6

| Resist underlayer film-forming composition | Residual film ratio |
| --- | --- |
| Example 15 | 100% |
| Example 16 | 100% |
| Example 17 | 100% |
| Example 18 | 100% |
| Comparative Example 6 | 0% |
| Comparative Example 7 | 0% |

(Test of Photocuring Properties)

The resist underlayer film compositions prepared in Examples 19 and 20 and Comparative Example 7 were each applied onto a silicon wafer using a spin coater. The coatings were heated on a hot plate at 170° C. for 60 seconds to form resist underlayer films having a film thickness of 150 nm. These resist underlayer films were irradiated with ultraviolet light at 500 mJ/cm$^2$ from an ultraviolet irradiation device equipped with a UV irradiation unit (wavelength: 172 nm) manufactured by Ushio Inc., and were thereafter heated on a hot plate at 160° C. for 60 seconds. The films thus obtained were immersed in a 7:3 mixed solvent of propylene glycol monomethyl ether and propylene glycol monomethyl ether acetate for 1 minute, and were spin-dried and calcined at 100° C. for 60 seconds. The film thickness was measured, and the residual film ratio was calculated to evaluate the resistance to release into the solvent after photoexposure (UV exposure). Table 7 shows the results.

The films obtained in Examples 19 to 20 were resistant to the solvent as a result of having been cured by the influence of the acid generated by light, and attained a residual film ratio of 100%. In contrast, Comparative Example 7 resulted in a residual film ratio of 0%, because no acid was generated by light, and the material was not cured and failed to attain solvent resistance.

TABLE 7

| Resist underlayer film-forming composition | Residual film ratio |
| --- | --- |
| Example 19 | 100% |
| Example 20 | 100% |
| Comparative Example 7 | 0% |

[Test of Covering Performance on Stepped Substrate]

To test the covering performance on a stepped substrate, the resist underlayer film-forming compositions prepared in Examples 15 to 18 were each applied to a 200 nm thick SiO$_2$ substrate, and the coatings were calcined at 240° C. for 60 seconds to form resist underlayer films having a thickness of about 200 nm. The coating film thickness was compared between at an 800 nm trenched area (TRENCH) and at an open area (OPEN) free from patterns. Separately, the resist underlayer film compositions prepared in Examples 19 and 20 were each applied onto the substrate using a spin coater, and the coatings were heated on a hot plate at 170° C. for 60 seconds to form resist underlayer films having a film thickness of 150 nm. The flatness of the substrates was evaluated using a scanning electron microscope (S-4800) manufactured by Hitachi High-Tech Corporation by determining the difference in film thickness between on the trenched area (the patterned area) and on the open area (the pattern-free area) of the stepped substrate (the step height created on the coating film between the trenched area and the open area, called the bias). Here, the flatness means how small the difference is in the thickness (the iso-trench bias) of the coating film between on the region with the pattern (TRENCH (the patterned area)) and on the region without patterns (the open area (the pattern-free area)). Table 8 shows the results. When the difference in thickness of the coating film (the iso-trench bias) was 100 nm or more, that Example was evaluated as DD. The result was rated as CC when the bias was 100 nm or less, as BB when the bias was 50 nm or less, and as AA when the bias was 20 nm or less.

TABLE 8

| Resist underlayer film-forming composition | Treatment conditions | Flatness |
| --- | --- | --- |
| Example 15 | 240° C./60 sec | BB |
| Example 16 | 240° C./60 sec | BB |
| Example 17 | 240° C./60 sec | BB |
| Example 18 | 260° C./60 sec | BB |
| Example 19 | 170° C./60 sec-500 mJ@ 172 nm-160° C./30 sec | AA |
| Example 20 | 170° C./60 sec-500 mJ@ 172 nm-160° C./30 sec | AA |

In Examples 15 to 18, the films attained good flatness, because the crosslinking groups present in the polymer had a high crosslinking start temperature, and the crosslinking reaction started after the material had been sufficiently reflowed at a high temperature. In Examples 19 and 20, the crosslinking reaction did not occur at 170° C., and the material at this stage exhibited sufficient reflowability and attained sufficient flatness on the stepped substrate. Quality flat films can be obtained by further curing the films with light.

Synthesis Example 17

In a two-necked flask, 40.0 g of EHPE3150 (trade name, manufactured by Daicel Corporation), 20.3 g of 9-anthracenecarboxylic acid and 13.7 g of benzoic acid were dissolved into 302.0 g of propylene glycol monomethyl ether. Thereafter, 1.5 g of benzyltriethylammonium was added. The solution was allowed to react under reflux for 24 hours. To the resultant solution, 11 g of a cation exchange resin (produce name: DOWEX [registered trademark] 550A, Muromachi Technos Co., Ltd.) and 11 g of an anion exchange resin (produce name: Amberlite [registered trademark] 15JWET, ORGANO CORPORATION) were added. After ion exchange treatment was performed at room temperature for 4 hours, separation of the ion exchange resins gave a compound 2 solution was thus obtained. The weight average molecular weight Mw in terms of polystyrene of the compound measured by GPC was 4,100.

[Chem. 137]

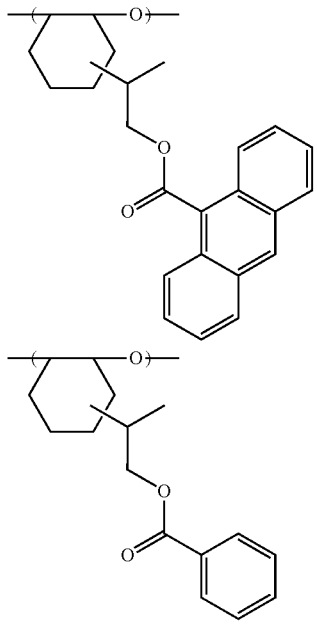

Compound 2

Example 21

A solution was obtained by adding 0.05 g of PGMEA containing 1% by mass of a surfactant (MEGAFACE R-40 manufactured by DIC CORPORATION), 0.20 g of PGME containing 5% by mass of pyridinium p-hydroxybenzenesulfonate, 0.05 g of TMOM-BP (manufactured by Honshu Chemical Industry Co., Ltd.), 1.88 g of PGMEA and 2.53 g of PGME to 2.19 g of the resin solution obtained in Synthesis Example 12 (solid content: 21.9% by mass). The solution was filtered through a polytetrafluoroethylene microfilter having a pore size of 0.1 µm. A solution of a resist underlayer film-forming composition was thus prepared.

Example 22

A solution was obtained by adding 0.07 g of PGMEA containing 1% by mass of a surfactant (MEGAFACE R-40 manufactured by DIC CORPORATION), 0.29 g of PGME containing 5% by mass of pyridinium p-hydroxybenzenesulfonate, 0.07 g of TMOM-BP (manufactured by Honshu Chemical Industry Co., Ltd.), 2.68 g of PGMEA and 4.24 g of PGME to 2.64 g of the resin solution obtained in Synthesis Example 13 (solid content: 27.0% by mass). The solution was filtered through a polytetrafluoroethylene microfilter having a pore size of 0.1 µm. A solution of a resist underlayer film-forming composition was thus prepared.

Example 23

A solution was obtained by adding 0.05 g of PGMEA containing 1% by mass of a surfactant (MEGAFACE R-40 manufactured by DIC CORPORATION), 0.20 g of PGME containing 5% by mass of pyridinium p-hydroxybenzenesulfonate, 0.05 g of TMOM-BP (manufactured by Honshu Chemical Industry Co., Ltd.), 1.88 g of PGMEA and 2.89 g of PGME to 1.93 g of the resin solution obtained in Synthesis Example 3 (solid content: 25.9% by mass). The solution was filtered through a polytetrafluoroethylene microfilter having a pore size of 0.1 µm. A solution of a resist underlayer film-forming composition was thus prepared.

Example 24

A solution was obtained by adding 0.05 g of PGMEA containing 1% by mass of a surfactant (MEGAFACE R-40 manufactured by DIC CORPORATION), 0.21 g of PGME containing 5% by mass of pyridinium p-hydroxybenzenesulfonate, 0.03 g of TMOM-BP (manufactured by Honshu Chemical Industry Co., Ltd.), 1.88 g of PGMEA and 2.81 g of PGME to 2.02 g of the resin solution obtained in Synthesis Example 3 (solid content: 25.9% by mass). The solution was filtered through a polytetrafluoroethylene microfilter having a pore size of 0.1 µm. A solution of a resist underlayer film-forming composition was thus prepared.

Example 25

A solution was obtained by adding 0.05 g of PGMEA containing 1% by mass of a surfactant (MEGAFACE R-40 manufactured by DIC CORPORATION), 0.21 g of PGME containing 5% by mass of pyridinium p-hydroxybenzenesulfonate, 0.03 g of tetramethoxymethylglycoluril, 1.88 g of PGMEA and 2.81 g of PGME to 2.02 g of the resin solution obtained in Synthesis Example 3 (solid content: 25.9% by mass). The solution was filtered through a polytetrafluoroethylene microfilter having a pore size of 0.1 µm. A solution of a resist underlayer film-forming composition was thus prepared.

Comparative Example 8

4.9 g of the resin solution obtained in Synthesis Example 17 (solid content: 16.0%) was mixed together with 0.2 g of tetramethoxymethylglycoluril, 0.2 g of propylene glycol monomethyl ether containing 5% of pyridinium p-toluenesulfonate, 0.08 g of propylene glycol monomethyl ether acetate containing 1% of a surfactant (produce name: MEGAFACE [trade name] R-40 manufactured by DIC CORPORATION, fluorosurfactant), 2.1 g of propylene glycol monomethyl ether and 2.6 g of propylene glycol monomethyl ether acetate. Filtration of the solution through a polytetrafluoroethylene microfilter having a pore size of 0.1 µm gave a solution of a resist underlayer film-forming composition.

(Test of Thermosetting Properties)

The resist underlayer film compositions prepared in Examples 21 to 25 and Comparative Example 8 were each applied onto a silicon wafer using a spin coater. The coatings were heated on a hot plate at 240° C. for 60 seconds to form resist underlayer films having a film thickness of 200 nm. The calcined coating films were immersed in a 7:3 mixed solvent of propylene glycol monomethyl ether and propylene glycol monomethyl ether acetate for 1 minute, and were spin-dried and calcined at 100° C. for 60 seconds. The film thickness was measured, and the residual film ratio was calculated to evaluate the resistance to release into the solvent (Table 9).

The films obtained in Examples 21 to 25 and Comparative Example 8 were resistant to the solvent as a result of having been crosslinked by the acid generated by heating, and attained a residual film ratio of 100%.

TABLE 9

| Resist underlayer film-forming composition | Residual film ratio |
|---|---|
| Example 21 | 100% |
| Example 22 | 100% |
| Example 23 | 100% |
| Example 24 | 100% |
| Example 25 | 100% |
| Comparative Example 8 | 100% |

[Measurement of Dry Etching Speed]

The dry etching speed was measured using the following etcher and etching gas:

RIE-10NR (manufactured by Samco) and $CF_4$

The solutions of the resist underlayer film-forming compositions prepared in Examples 21 to 25 and Comparative Example 8 were each applied onto a silicon wafer using a spin coater, and the coatings were calcined on a hot plate at 240° C. for 60 seconds or at 215° C. for 60 seconds to form resist underlayer films (film thickness: 0.20 μm). The dry etching speed was measured using CF4 gas as the etching gas. The dry etching speeds of Examples 21 to 25 and Comparative Example 8 were expressed as a relative ratio of dry etching speed. The dry etching speed rates were those of (resist underlayer film)/(Comparative Example 8) (Table 10).

As can be seen from Examples 21 to 37, the addition of a crosslinking agent to a compound having a crosslinking group results in a lower etching rate and makes it possible to enhance workability as compared to when a crosslinking agent is added to a compound having no crosslinking groups as demonstrated in Comparative Example 8.

TABLE 10

| Resist underlayer film-forming composition | Treatment conditions | Etching rate |
|---|---|---|
| Example 21 | 240° C./60 s | 0.81 |
| Example 22 | 240° C./60 s | 0.96 |
| Example 23 | 240° C./60 s | 0.81 |
| Example 24 | 240° C./60 s | 0.83 |
| Example 25 | 240° C./60 s | 0.85 |
| Comparative Example 8 | 215° C./60 s | 1.00 |

INDUSTRIAL APPLICABILITY

The resist underlayer film-forming composition according to the present invention can excellently fill gaps on a stepped substrate while forming a highly flat film. The resist underlayer film of the present invention is formed by application of the composition followed by calcination, and is insoluble in resist solvents, has good optical constants and allows for appropriate control of etching rate. The present invention also provides a method for producing a patterned substrate and a method for manufacturing a semiconductor device using the composition and the resist underlayer film.

The invention claimed is:

1. A resist underlayer film-forming composition comprising:
   a crosslinking compound (A) represented by formula (I) below;
   an acid catalyst (C); and
   a solvent (D),

wherein n is an integer of 2 to 6,
   n quantity of Z are each independently a monovalent organic group comprising a mono-, di-, tri-, tetra-, penta- or hexaformylaryl group,
   n quantity of A each independently denote —$OCH_2CH(OH)CH_2O$— or

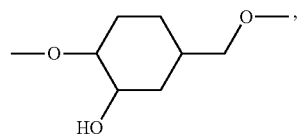

and
   T is an n valent hydrocarbon group and/or repeating unit of a polymer, which optionally contains at least one group selected from the group consisting of a hydroxy group, an epoxy group, an acyl group, an acetyl group, a benzoyl group, a carboxy group, a carbonyl group, an amino group, an imino group, a cyano group, an azo group, an azide group, a thiol group, a sulfo group and an allyl group, and which is optionally interrupted by a carbonyl group and/or an oxygen atom.

2. The resist underlayer film-forming composition according to claim 1, wherein the crosslinking compound (A) further contains a self-crosslinking group.

3. The resist underlayer film-forming composition according to claim 1, further comprising a crosslinkable film material (B) capable of causing a crosslinking reaction with the crosslinking compound (A).

4. The resist underlayer film-forming composition according to claim 3, wherein the crosslinkable film material (B) comprises at least one member selected from the group consisting of aliphatic ring-containing resins, novolak resins, polyether resins, polyester resins, acrylic resins, methacrylic resins and compounds differing from the crosslinking compounds (A).

5. The resist underlayer film-forming composition according to claim 4, wherein the novolak resins are represented by one, or two or more repeating structural units represented by the following formulas (1a), (1b) and (1c):

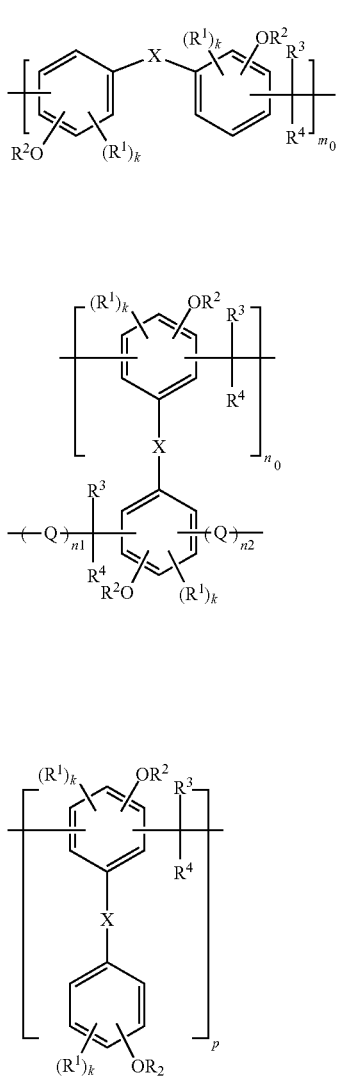

(1a)

(2b)

(1c)

wherein $R^1$ at two occurrences each independently denotes a $C_1$-$C_{10}$ alkyl group, a $C_2$-$C_6$ alkenyl group, an aromatic hydrocarbon group, a halogen atom, a nitro group or an amino group; $R_2$ at two occurrences each independently denotes a hydrogen atom, a $C_1$-$C_{10}$ alkyl group, a $C_2$-$C_6$ alkenyl group, an acetal group, an acyl group or a glycidyl group; $R_3$ denotes an optionally substituted aromatic hydrocarbon group; $R_4$ denotes a hydrogen atom, a phenyl group or a naphthyl group; when $R_3$ and $R_4$ bonded to the same single carbon atom each denote a phenyl group, the phenyl groups are optionally bonded to each other to form a fluorene ring; in formula (1b), the two groups indicated by $R_3$ are optionally different from one another, and the two atoms or groups indicated by $R^3$ are optionally different from one another; k at two occurrences each independently indicates 0 or 1; $m_0$ indicates an integer of 3 to 500; $n_0$, $n_1$ and $n_2$ each indicate an integer of 2 to 500; p indicates an integer of 3 to 500;

X denotes a single bond or a heteroatom; and Q at two occurrences each independently denotes a structural unit represented by the following formula (2):

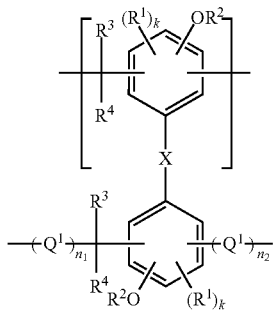

(2)

wherein $R_1$ at two occurrences, $R_2$ at two occurrences, $R_5$ at two occurrences, $R_4$ at two occurrences, k at two occurrences, $n_1$, $n_2$ and X are the same as defined in formula (1b); and $Q^1$ at two occurrences each independently denotes a structural unit represented by formula (2).

6. The resist underlayer film-forming composition according to claim 4, wherein the compounds differing from the crosslinking compounds (A) are represented by:

Ar-Q-Ar (2)

wherein Ar at two occurrences each denotes an aryl group, the aryl group having at least one hydroxy group as a substituent; and Q denotes a divalent linking group having at least one benzene ring or naphthalene ring, a methylene group or a single bond.

7. The resist underlayer film-forming composition according to claim 1, further comprising a crosslinking agent other than the crosslinking compound represented by formula (I).

8. A resist underlayer film comprising a cured product of a coating film comprising the resist underlayer film-forming composition according to claim 1.

9. A method for producing a patterned substrate, comprising the steps of:
applying the resist underlayer film-forming composition according to claim 1 onto a semiconductor substrate and curing the resist underlayer film-forming composition to form a resist underlayer film,
applying a resist onto the resist underlayer film and baking the resist to form a resist film,
exposing the semiconductor substrate coated with the resist underlayer film and the resist, and
developing the exposed resist film to perform patterning.

10. The method for producing a patterned substrate according to claim 9, wherein the resist underlayer film-forming composition is cured by baking.

11. The method for producing a patterned substrate according to claim 9, wherein the resist underlayer film-forming composition is cured by baking followed by UV irradiation.

12. The method for producing a patterned substrate according to claim 11, wherein the UV irradiation is further followed by baking.

13. A method for manufacturing a semiconductor device, comprising the steps of:
forming, on a semiconductor substrate, a resist underlayer film using the resist underlayer film-forming composition according to claim 1,
forming a resist film on the resist underlayer film,
forming a resist pattern by applying light or electron beam followed by development, etching the underlayer film through the resist pattern, and processing the semiconductor substrate through the patterned underlayer film.

\* \* \* \* \*